(12) United States Patent
Nagata

(10) Patent No.: US 12,125,882 B2
(45) Date of Patent: Oct. 22, 2024

(54) SiC SEMICONDUCTOR DEVICE

(71) Applicant: ROHM CO., LTD., Kyoto (JP)

(72) Inventor: Toshio Nagata, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 490 days.

(21) Appl. No.: 17/598,028

(22) PCT Filed: Apr. 14, 2020

(86) PCT No.: PCT/JP2020/016433
§ 371 (c)(1),
(2) Date: Sep. 24, 2021

(87) PCT Pub. No.: WO2020/213603
PCT Pub. Date: Oct. 22, 2020

(65) Prior Publication Data
US 2022/0181447 A1 Jun. 9, 2022

(30) Foreign Application Priority Data
Apr. 19, 2019 (JP) .................................. 2019-080227

(51) Int. Cl.
*H01L 29/16* (2006.01)
*H01L 21/04* (2006.01)
(Continued)

(52) U.S. Cl.
CPC ...... *H01L 29/1608* (2013.01); *H01L 21/0485* (2013.01); *H01L 23/49* (2013.01);
(Continued)

(58) Field of Classification Search
CPC ....... H01L 29/1608; H01L 2924/10272; H01L 29/1604; H01L 2224/05124;
(Continued)

(56) References Cited

U.S. PATENT DOCUMENTS

2010/0252838 A1 10/2010 Okamura et al.
2011/0018005 A1* 1/2011 Nakano ................. H01L 21/046
257/329
(Continued)

FOREIGN PATENT DOCUMENTS

JP 4966348 7/2012
JP 2013045973 3/2013
(Continued)

OTHER PUBLICATIONS

International Search Report and Written Opinion issued for International Patent Application No. PCT/JP2020/016433, Date of mailing: Jul. 21, 2020, 9 pages including English translation of Search Report.
(Continued)

*Primary Examiner* — Amar Movva
(74) *Attorney, Agent, or Firm* — XSENSUS LLP

(57) ABSTRACT

An SiC semiconductor device includes an SiC chip having a first main surface at one side and a second main surface at another side, a first main surface electrode including a first Al layer and formed on the first main surface, a pad electrode formed on the first main surface electrode and to be connected to a lead wire, and a second main surface electrode including a second Al layer and formed on the second main surface.

18 Claims, 20 Drawing Sheets

(51) Int. Cl.
  *H01L 23/00* (2006.01)
  *H01L 23/49* (2006.01)
  *H01L 29/66* (2006.01)
(52) U.S. Cl.
  CPC ........ *H01L 24/05* (2013.01); *H01L 29/66068* (2013.01); *H01L 2224/05124* (2013.01); *H01L 2224/85801* (2013.01); *H01L 2924/10272* (2013.01)
(58) Field of Classification Search
  CPC . H01L 2224/37124; H01L 2224/45124; H01L 2224/83424; H01L 2224/84424; H01L 2224/85424; H01L 2224/05624; H01L 2224/13124; H01L 2224/13624; H01L 2224/29124; H01L 2224/29624; H01L 2224/37624
  See application file for complete search history.

(56) References Cited

U.S. PATENT DOCUMENTS

| | | | |
|---|---|---|---|
| 2011/0053374 A1 | 3/2011 | Kobayashi | |
| 2012/0132926 A1 | 5/2012 | Nakano et al. | |
| 2015/0295096 A1 | 10/2015 | Oka et al. | |
| 2017/0186847 A1* | 6/2017 | Hikasa | H01L 29/7397 |
| 2018/0211930 A1 | 7/2018 | Take | |

FOREIGN PATENT DOCUMENTS

| | | |
|---|---|---|
| JP | 2013219150 A | 10/2013 |
| JP | 2015046500 A | 3/2015 |
| JP | 2015207780 | 11/2015 |
| JP | 2017059636 A | 3/2017 |
| JP | 2017118060 | 6/2017 |
| JP | 2017168663 A | 9/2017 |
| JP | 2018120929 | 8/2018 |

OTHER PUBLICATIONS

Notice of Reasons for Refusal issued for Japanese Patent Application No. 2021-514171, Dispatch Date: Sep. 29, 2022, 6 pages including English translation.
International Preliminary Report on Patentability issued for International Patent Application No. PCT/JP2020/016433, Date of mailing: Oct. 28, 2021, 12 pages including English translation.
Office Action issued for German Patent Application No. 11 2020 001 334.0, dated Nov. 4, 2022, 14 pages including informal English translation.
Decision of Refusal issued Aug. 17, 2023, in corresponding Japanese patent application No. 2021-514171, 3pp.
Notice of Reasons for Refusal issued for Japanese Patent Application No. 2021-514171, Dispatch Date: Mar. 9, 2023, 8 pages including English machine translation.

* cited by examiner

SiC SEMICONDUCTOR DEVICE

TECHNICAL FIELD

The present invention relates to an SiC semiconductor device.

BACKGROUND ART

Patent Literature 1 discloses an SiC semiconductor device including an SiC substrate (SiC chip), a pad electrode including Al and formed on a front surface of the SiC substrate, and an ohmic electrode formed on a rear surface of the SiC substrate. A bonding wire (lead wire) is bonded to the pad electrode.

CITATION LIST

Patent Literature

Patent Literature 1: Japanese Patent Application Publication No. 2015-207780

SUMMARY OF INVENTION

Technical Problem

In a post-process (assembly process), various external forces are applied to an SiC semiconductor device. For example, in mounting of the SiC semiconductor device, a mounter that includes a suction nozzle is used. After being transferred to a connection object in a state of being suction-held by the suction nozzle, the SiC semiconductor device is press mounted onto a connection object portion. In this process, an external force directed from the suction nozzle toward the connection object and an external force directed from the connection object toward the suction nozzle are applied to the SiC semiconductor device.

Also, after mounting of the SiC semiconductor device, a lead wire is press bonded onto the pad electrode by a capillary. In this process, an external force directed from the capillary toward the connection object and an external force directed from the connection object toward the capillary are applied to the SiC semiconductor device. When an external force exceeding a strength of the SiC chip is applied to the SiC semiconductor device, cracks are generated in the SiC chip.

A preferred embodiment of the present invention provides an SiC semiconductor device with which an external force can be relaxed.

Solution to Problem

A preferred embodiment of the present invention provides an SiC semiconductor device including an SiC chip having a first main surface at one side and a second main surface at another side, a first main surface electrode including a first Al layer and formed on the first main surface, a pad electrode formed on the first main surface electrode and to be connected to a lead wire, and a second main surface electrode including a second Al layer and formed on the second main surface.

According to this SiC semiconductor device, the first Al layer is formed as a first buffer layer that relaxes an external force at the first main surface side and the second Al layer is formed as a second buffer layer that relaxes an external force at the second main surface side. An external force in a direction directed from the first main surface toward the second main surface and an external force in a direction directed from the second main surface toward the first main surface can thereby be relaxed.

The aforementioned as well as yet other objects, features, and effects of the present invention will be made clear by the following description of the preferred embodiments, with reference to the accompanying drawings.

DESCRIPTION OF EMBODIMENTS

Figure 1:
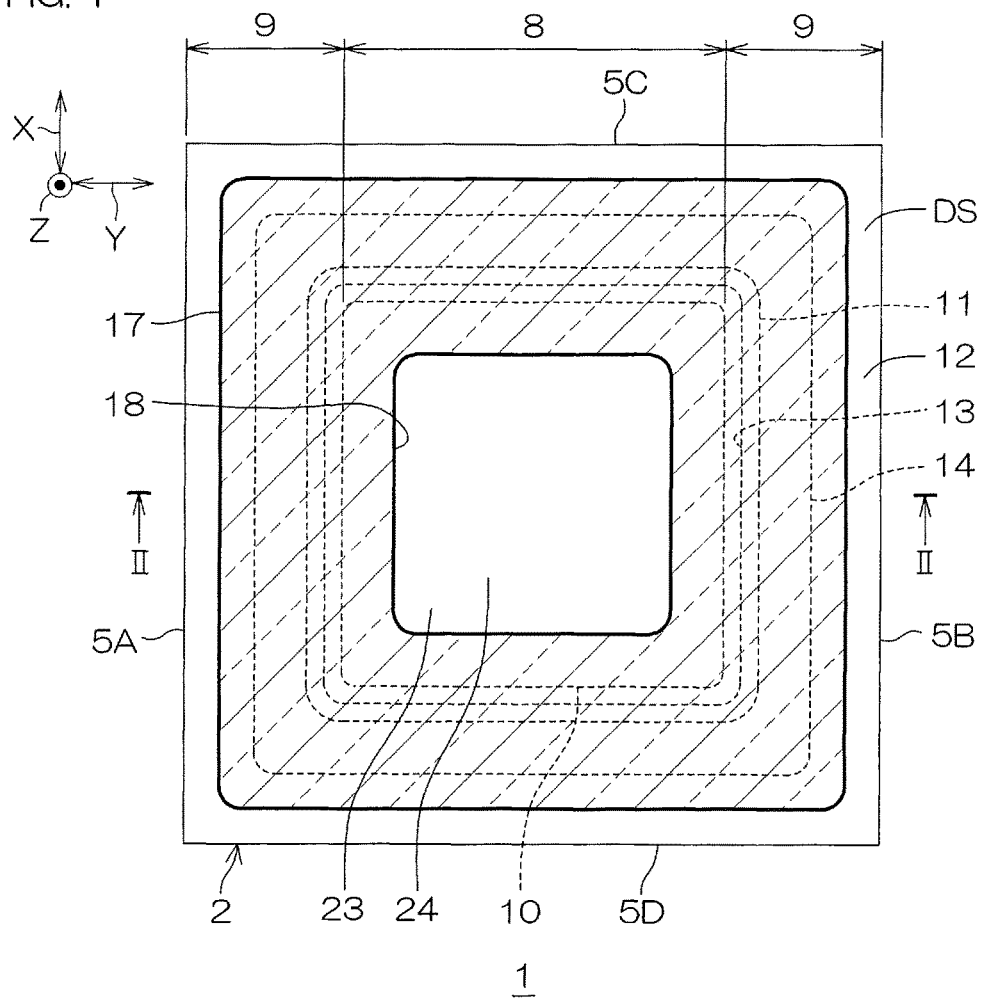
FIG. 1 is a plan view of an SiC semiconductor device according to a first preferred embodiment of the present invention.
Figure 2:
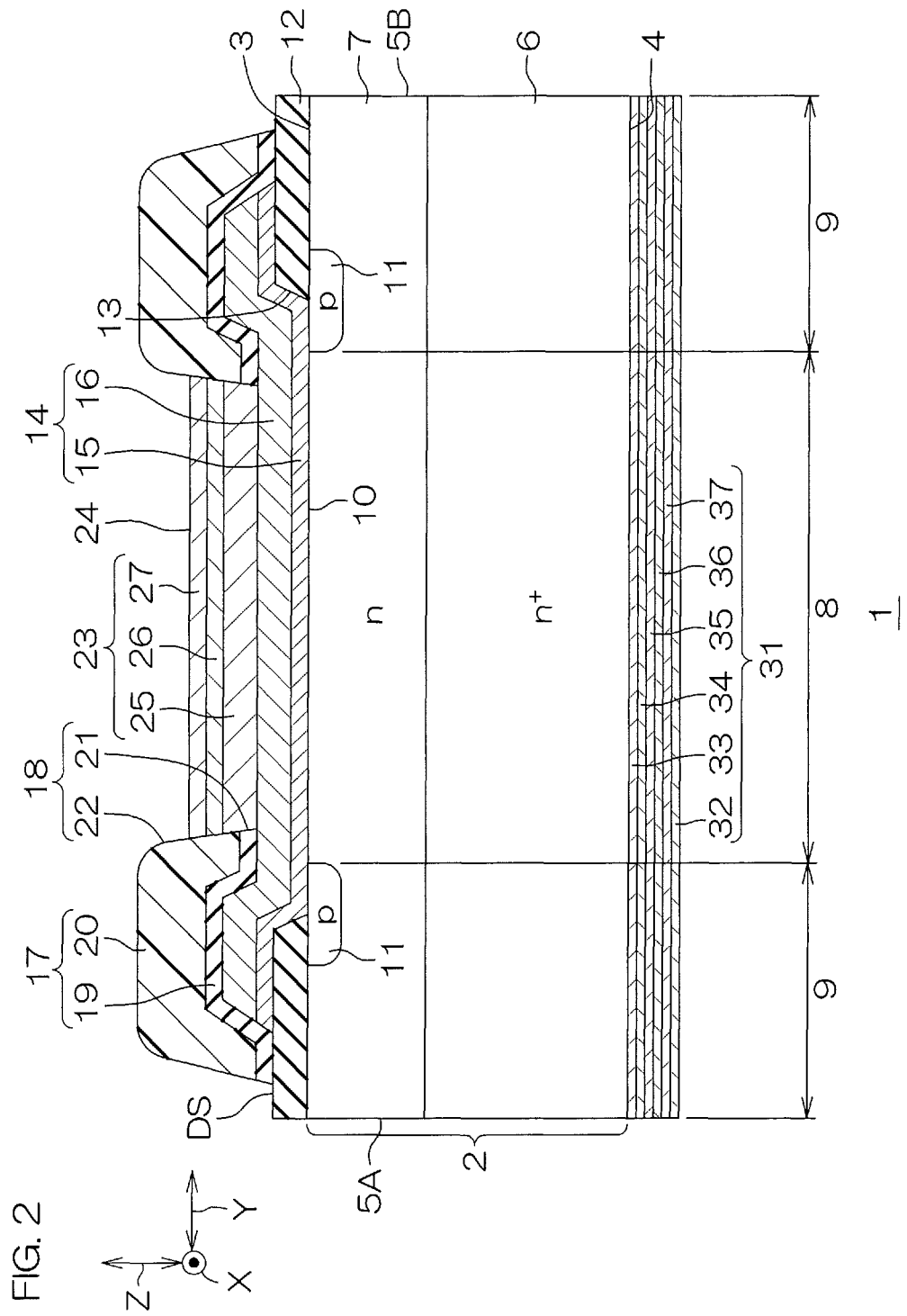
FIG. 2 is a sectional view taken along line II-II shown in FIG. 1 and shows an embodiment where a second main surface electrode according to a first configuration example is incorporated.
Figure 3:
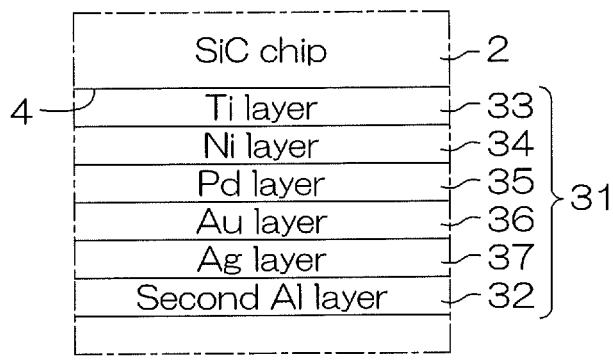
FIG. 3 is an illustrative sectional view of the second main surface electrode shown in FIG. 2.

FIG. 1 is a plan view of an SiC semiconductor device 1 according to a first preferred embodiment of the present invention. FIG. 2 is a sectional view taken along line II-II shown in FIG. 1 and shows an embodiment where a second main surface electrode 31 according to a first configuration example is incorporated. FIG. 3 is an illustrative sectional view of the second main surface electrode 31 shown in FIG. 2.

Referring to FIG. 1 and FIG. 2, the SiC semiconductor device 1 includes an SiC chip 2. The SiC chip 2 includes an SiC monocrystal constituted of a hexagonal crystal. The SiC monocrystal constituted of the hexagonal crystal has a plurality of polytypes including a 2H (hexagonal)-SiC monocrystal, a 4H-SiC monocrystal, a 6H-SiC monocrystal, etc., in accordance with cycle of atomic arrangement. Although, with this embodiment, the SiC chip 2 is constituted of a 4H-SiC monocrystal, this does not exclude other polytypes.

The SiC chip 2 is formed to a chip of rectangular parallelepiped shape. The SiC chip 2 has a first main surface 3 at one side, a second main surface 4 at another side, and side surfaces 5A, 5B, 5C, and 5D connecting the first main surface 3 and the second main surface 4. The first main surface 3 and the second main surface 4 are formed to quadrilateral shapes (square shapes in this embodiment) in a plan view as viewed in a normal direction Z thereto (hereinafter referred to simply as "plan view").

A thickness of the SiC chip 2 may be not less than 40 μm and not more than 300 μm. The thickness of the SiC chip 2 may be not less than 40 μm and not more than 100 μm, not less than 100 μm and not more than 150 μm, not less than 150 μm and not more than 200 μm, not less than 200 μm and not more than 250 μm, or not less than 250 μm and not more than 300 μm. The thickness of the SiC chip 2 is preferably not less than 60 μm and not more than 150 μm.

The first main surface 3 and the second main surface 4 are arranged along c-planes of the SiC monocrystal. The first main surface 3 is arranged along a silicon plane ((0001) plane) of the SiC monocrystal. The first main surface 3 is a non-mounting surface. The second main surface 4 is arranged along a carbon plane ((000-1) plane) of the SiC monocrystal. The second main surface 4 is a mounting surface. The second main surface 4 may be a rough surface having either or both of grinding marks and annealing marks. An annealing mark is a laser irradiation mark. The second main surface 4 may be an ohmic surface having annealing marks.

The first main surface 3 and the second main surface 4 have an off angle inclined at an angle of not less than 0° and not more than 10° in an a-axis direction ([11-20] direction) with respect to the c-planes of the SiC monocrystal. The normal direction Z is inclined by just the off angle with respect to the c-axis ([0001] direction) of the SiC monocrystal.

The off angle may be not less than 0° and not more than 6°. The off angle may be not less than 0° and not more than 2°, not less than 2° and not more than 4°, or not less than 4° and not more than 6°. Preferably, the off angle exceeds 0° and is not more than 4.5°. The off angle may be not less than 3° and not more than 4.5°. In this case, the off angle is preferably not less than 3° and not more than 3.5° or not less than 3.5° and not more than 4°. The off angle may be not less than 1.5° and not more than 3°. In this case, the off angle is preferably not less than 1.5° and not more than 2° or not less than 2° and not more than 2.5°.

The side surfaces 5A to 5D include the first side surface 5A, the second side surface 5B, the third side surface 5C, and the fourth side surface 5D. The first side surface 5A and the second side surface 5B extend along a first direction X and oppose each other in a second direction Y intersecting the first direction X. The third side surface 5C and the fourth side surface 5D extend along the second direction Y and oppose each other in the first direction X. More specifically, the second direction Y is orthogonal to the first direction X.

The first side surface 5A and the second side surface 5B are formed by a-planes of the SiC monocrystal. The first side surface 5A and the second side surface 5B may instead form inclined surfaces that, when the normal direction Z is taken as a basis, are inclined toward a c-axis direction ([0001] direction) of the SiC monocrystal with respect to the normal direction Z. The first side surface 5A and the second side surface 5B may be inclined at an angle in accordance with the off angle with respect to the normal direction Z when the normal direction Z is set to 0°. The angle in accordance with the off angle may be equal to the off angle or may be an angle that exceeds 0° and is less than the off angle.

The third side surface 5C and the fourth side surface 5D may be formed by m-planes of the SiC monocrystal. The third side surface 5C and the fourth side surface 5D extend as planes along the normal direction Z. More specifically, the third side surface 5C and the fourth side surface 5D are formed substantially perpendicular to the first main surface 3 and the second main surface 4.

The side surfaces 5A to 5D may be constituted of cleavage surfaces or ground surfaces. A length of the side surfaces 5A to 5D may be not less than 0.1 mm and not more than 10 mm. Preferably, the length of the side surfaces 5A to 5D is not less than 0.5 mm and not more than 2.5 mm.

In this embodiment, the SiC chip 2 has a laminated structure that includes an n⁺-type SiC semiconductor substrate 6 and an n-type SiC epitaxial layer 7. The second main surface 4 of the SiC chip 2 is formed by the SiC semiconductor substrate 6. The first main surface 3 of the SiC chip 2 is formed by the SiC epitaxial layer 7. The side surfaces 5A to 5D of the SiC chip 2 are formed by the SiC semiconductor substrate 6 and the SiC epitaxial layer 7.

An n-type impurity concentration of the SiC epitaxial layer 7 is less than an n-type impurity concentration of the SiC semiconductor substrate 6. The n-type impurity concentration of the SiC semiconductor substrate 6 may be not less than $1.0 \times 10^{18}$ cm$^{-3}$ and not more than $1.0 \times 10^{21}$ cm$^{-3}$. The n-type impurity concentration of the SiC epitaxial layer 7 may be not less than $1.0 \times 10^{15}$ cm$^{-3}$ and not more than $1.0 \times 10^{18}$ cm$^{-3}$.

A thickness of the SiC semiconductor substrate 6 may be not less than 40 μm and not more than 250 μm. The thickness of the SiC semiconductor substrate 6 may be not less than 40 μm and not more than 100 μm, not less than 100 μm and not more than 150 μm, not less than 150 μm and not more than 200 μm, or not less than 200 μm and not more than 250 μm. The thickness of the SiC semiconductor substrate 6 is preferably not less than 40 μm and not more than 150 μm. By thinning the SiC semiconductor substrate 6, a resistance value of the SiC semiconductor substrate 6 can be reduced.

A thickness of the SiC epitaxial layer 7 may be not less than 1 μm and not more than 50 μm. The thickness of the SiC epitaxial layer 7 may be not less than 1 μm and not more than 5 μm, not less than 5 μm and not more than 10 μm, not less than 10 μm and not more than 15 μm, not less than 15 μm and not more than 20 μm, not less than 20 μm and not more than 30 μm, not less than 30 μm and not more than 40 μm, or not less than 40 μm and not more than 50 μm. The thickness of the SiC epitaxial layer 7 is preferably not less than 5 μm and not more than 15 μm.

The SiC chip 2 includes an active region 8 and an outer region 9. The active region 8 is a region that includes an SBD (Schottky barrier diode) as an example of a functional device (diode). In plan view, the active region 8 is formed in a central portion of the SiC chip 2 at intervals inward from the side surfaces 5A to 5D. In plan view, the active region 8 is formed to a quadrilateral shape having four sides parallel to the side surfaces 5A to 5D.

The outer region 9 is a region at an outer side of the active region 8. The outer region 9 is formed in a region between the side surfaces 5A to 5D and the active region 8. The outer region 9 is formed to an annular shape (more specifically, an endless shape) surrounding the active region 8 in plan view.

The SiC semiconductor device 1 includes an n-type diode region 10 formed in a surface layer portion of the first main surface 3 in the active region 8. The diode region 10 is formed in a central portion of the first main surface 3. A planar shape of the diode region 10 is arbitrary. The diode region 10 may be formed to a quadrilateral shape having four sides parallel to the side surfaces 5A to 5D in plan view.

In this embodiment, the diode region 10 is formed using a portion of the SiC epitaxial layer 7. An n-type impurity concentration of the diode region 10 is equal to the n-type impurity concentration of the SiC epitaxial layer 7. The n-type impurity concentration of the diode region 10 may exceed the n-type impurity concentration of the SiC epitaxial layer 7. In this case, the diode region 10 is formed by introduction of an n-type impurity into a surface layer portion of the SiC epitaxial layer 7.

A guard region 11 including a p-type impurity is formed in a surface layer portion of the first main surface 3 in the outer region 9. The p-type impurity of the guard region 11 may be non-activated or activated.

The guard region 11 is formed as a band extending along the diode region 10 in plan view. More specifically, the guard region 11 is formed to an annular shape (more specifically, an endless shape) surrounding the diode region 10 in plan view. The guard region 11 is thereby formed as a guard ring region.

The active region 8 (diode region 10) is defined by the guard region 11. A planar shape of the active region 8 (diode region 10) is adjusted by a planar shape of the guard region 11. The guard region 11 may be formed to a polygonal annular shape or a circular annular shape in plan view.

The SiC semiconductor device 1 includes a main surface insulating layer 12 formed on the first main surface 3. The main surface insulating layer 12 may have a laminated structure that includes a silicon oxide layer and a silicon nitride layer. The main surface insulating layer 12 may instead have a single layer structure constituted of a silicon oxide layer or a silicon nitride layer. In this embodiment, the main surface insulating layer 12 has a single layer structure constituted of a silicon oxide layer.

The main surface insulating layer 12 includes a contact opening 13 that exposes the diode region 10. The contact opening 13 also exposes inner peripheral edges of the guard region 11. A planar shape of the contact opening 13 is arbitrary. The contact opening 13 may be formed to a quadrilateral shape having four sides parallel to the side surfaces 5A to 5D in plan view.

Peripheral edges of the main surface insulating layer 12 are exposed from the side surfaces 5A to 5D. In this embodiment, the peripheral edges of the main surface insulating layer 12 are continuous to the side surfaces 5A to 5D. The peripheral edges of the main surface insulating layer 12 may be formed at intervals inward from the side surfaces 5A to 5D. In this case, the main surface insulating layer 12 exposes a portion of the first main surface 3 positioned in the outer region 9.

A thickness of the main surface insulating layer 12 may be not less than 0.1 μm and not more than 10 μm. The thickness of the main surface insulating layer 12 may be not less than 0.1 μm and not more than 1 μm, not less than 1 μm and not more than 2 μm, not less than 2 μm and not more than 4 μm, not less than 4 μm and not more than 6 μm, not less than 6 μm and not more than 8 μm, or not less than 8 μm and not more than 10 μm. The thickness of the main surface insulating layer 12 is preferably not less than 0.5 μm and not more than 5 μm.

The SiC semiconductor device 1 includes a first main surface electrode 14 formed on the first main surface 3. The first main surface electrode 14 is connected to the diode region 10 and the guard region 11 inside the contact opening 13. The first main surface electrode 14 is led out onto the main surface insulating layer 12 from the contact opening 13. Peripheral edges of the first main surface electrode 14 are formed on the main surface insulating layer 12 at intervals inward from the side surfaces 5A to 5D.

More specifically, the first main surface electrode 14 has a laminated structure that includes a Schottky barrier layer 15 (barrier layer) and a first Al layer 16 laminated in that order from the first main surface 3 side. The first Al layer 16 is formed as a first buffer layer that uses a cushioning property of Al, which has a comparative small Young's modulus (rigidity modulus), to relax an external force applied to the SiC chip 2 from the first main surface 3 side.

The Schottky barrier layer 15 is formed as a film along the first main surface 3 and the main surface insulating layer 12. The Schottky barrier layer 15 forms a Schottky junction with the diode region 10. The SBD having the first main surface electrode 14 as an anode and the diode region 10 as a cathode is thereby formed. That is, the first main surface electrode 14 is an anode electrode of the SBD.

The Schottky barrier layer 15 may include at least one among a Ti layer, a Pd layer, a Cr layer, a V layer, an Mo layer, a W layer, a Pt layer, and an Ni layer. A thickness of the Schottky barrier layer 15 may be not less than 0.01 μm and not more than 5 μm. The thickness of the Schottky barrier layer 15 may be not less than 0.01 μm and not more than 0.1 μm, not less than 0.1 μm and not more than 1 μm, not less than 1 μm and not more than 2 μm, not less than 2 μm and not more than 3 μm, not less than 3 μm and not more than 4 μm, or not less than 4 μm and not more than 5 μm.

The first Al layer 16 is formed on the Schottky barrier layer 15. The first Al layer 16 is formed as a film along the Schottky barrier layer 15. The first Al layer 16 covers an entire area of a main surface of the Schottky barrier layer 15. The peripheral edges of the first main surface electrode 14 are formed by the Schottky barrier layer 15 and the first Al layer 16.

The first Al layer 16 includes at least one among a pure Al layer (refers to an Al layer constituted of Al of a purity of not less than 99%; the same applies hereinafter), an AlSi alloy layer, an AlCu alloy layer, and an AlSiCu alloy layer. The first Al layer 16 may have a laminated structure in which two or more among a pure Al layer, an AlSi alloy layer, an AlCu alloy layer, and an AlSiCu alloy layer are laminated in any order.

The first Al layer 16 may have a single layer structure constituted of a pure Al layer, an AlSi alloy layer, an AlCu alloy layer, or an AlSiCu alloy layer. The first Al layer 16 preferably has a single layer structure constituted of an AlSi alloy layer, an AlCu alloy layer, or an AlSiCu alloy layer.

A thickness of the first Al layer 16 exceeds the thickness of the Schottky barrier layer 15. The thickness of the first Al layer 16 may be not less than 0.05 μm and not more than 10 μm. The thickness of the first Al layer 16 may be not less than 0.05 μm and not more than 0.1 μm, not less than 0.1 μm and not more than 1 μm, not less than 1 μm and not more than 2 μm, not less than 2 μm and not more than 4 μm, not less than 4 μm and not more than 6 μm, not less than 6 μm and not more than 8 μm, or not less than 8 μm and not more than 10 μm. The thickness of the first Al layer 16 is preferably not less than 1 μm and not more than 8 μm.

The SiC semiconductor device 1 includes an insulating layer 17 that covers the first main surface electrode 14 above the first main surface 3. In FIG. 1, the insulating layer 17 is shown with hatching. More specifically, the insulating layer 17 is formed on the main surface insulating layer 12. Peripheral edges of the insulating layer 17 are formed at intervals inward from the side surfaces 5A to 5D. The insulating layer 17 thereby exposes a portion of the main surface insulating layer 12 that covers the outer region 9.

The peripheral edges of the insulating layer 17 demarcate a dicing street DS with the side surfaces 5A to 5D. By the dicing street DS, it is made unnecessary to physically cut the insulating layer 17 when cutting out the SiC semiconductor device 1 from an SiC wafer. The SiC semiconductor device 1 can thereby be cut out smoothly from the SiC wafer and at the same time, peeling and degradation of the insulating layer 17 can be suppressed. Consequently, protection objects, such as the SiC chip 2, the first main surface electrode 14, etc., can be protected appropriately by the insulating layer 17.

A width of the dicing street DS may be not less than 1 μm and not more than 25 μm. The width of the dicing street DS is a width in a direction orthogonal to a direction in which the dicing street DS extends. The width of the dicing street DS may be not less than 1 μm and not more than 5 μm, not less than 5 μm and not more than 10 μm, not less than 10 μm and not more than 15 μm, not less than 15 μm and not more than 20 μm, or not less than 20 μm and not more than 25 μm.

The insulating layer 17 has a pad opening 18 that exposes the first main surface electrode 14. In this embodiment, the pad opening 18 exposes the first main surface electrode 14 inside a region surrounded by the contact opening 13 in plan view. The pad opening 18 may surround the contact opening 13 in a region outside the contact opening 13 in plan view. A planar shape of the pad opening 18 is arbitrary. The pad opening 18 may be formed to a quadrilateral shape having four sides parallel to the side surfaces 5A to 5D in plan view.

In this embodiment, the insulating layer 17 has a laminated structure that includes a passivation layer 19 and a resin layer 20 that are laminated in that order from the SiC chip 2 side.

The passivation layer 19 may include at least one among a silicon oxide layer and a silicon nitride layer. The passivation layer 19 may have a laminated structure that includes a silicon oxide layer and a silicon nitride layer. The passivation layer 19 may instead have a single layer structure constituted of a silicon oxide layer or a silicon nitride layer. The passivation layer 19 preferably includes an insulating material differing from the main surface insulating layer 12. In this embodiment, the passivation layer 19 has a single layer structure constituted of a silicon nitride layer.

The passivation layer 19 is formed as a film along the main surface insulating layer 12 and the first main surface electrode 14. The passivation layer 19 has a first opening 21 that exposes a portion of the first main surface electrode 14. A planar shape of the first opening 21 is arbitrary. The first opening 21 may be formed to a quadrilateral shape having four sides parallel to the side surfaces 5A to 5D in plan view.

A thickness of the passivation layer 19 may be not less than 0.1 μm and not more than 20 μm. The thickness of the passivation layer 19 may be not less than 0.1 μm and not more than 1 μm, not less than 1 μm and not more than 5 μm, not less than 5 μm and not more than 10 μm, not less than 10 μm and not more than 15 μm, or not less than 15 μm and not more than 20 μm.

The resin layer 20 is formed as a film along a main surface of the passivation layer 19. The resin layer 20 may include a photosensitive resin. The photosensitive resin may be of a negative type or a positive type. The resin layer 20 may include at least one among a polyimide, a polyamide, and a polybenzoxazole. In this embodiment, the resin layer 20 includes polybenzoxazole.

In this embodiment, peripheral edges of the resin layer 20 expose the peripheral edges of the passivation layer 19. The peripheral edges of the insulating layer 17 are formed by the peripheral edges of the resin layer 20 and the peripheral edges of the passivation layer 19. The resin layer 20 may cover the peripheral edges of the passivation layer 19.

The resin layer 20 has a second opening 22 that exposes a portion of the first main surface electrode 14. A planar shape of the second opening 22 is arbitrary. The second opening 22 may be formed to a quadrilateral shape having four sides parallel to the side surfaces 5A to 5D in plan view. The second opening 22 is in communication with the first opening 21 of the passivation layer 19 and forms the single pad opening 18 with the first opening 21.

Inner walls of the second opening 22 may be formed flush with inner walls of the first opening 21. The inner walls of the second opening 22 may be positioned at side surface 5A to 5D sides with respect to the inner walls of the first opening 21. The inner walls of the second opening 22 may be positioned toward inner sides of the SiC chip 2 with respect to the inner walls of the first opening 21. That is, the resin layer 20 may cover the inner walls of the first opening 21.

A thickness of the resin layer 20 may be not less than 1 μm and not more than 50 μm. The thickness of the resin layer 20 may be not less than 1 μm and not more than 10 μm, not less than 10 μm and not more than 20 μm, not less than 20 μm and not more than 30 μm, not less than 30 μm and not more than 40 μm, or not less than 40 μm and not more than 50 μm.

The SiC semiconductor device 1 includes a pad electrode 23 formed on the first main surface electrode 14. The pad electrode 23 is electrically connected to the first main surface electrode 14. The pad electrode 23 is formed on the first main surface electrode 14 inside the pad opening 18. The pad electrode 23 has a terminal surface 24 to be externally connected to a lead wire.

The terminal surface 24 is positioned at the first main surface electrode 14 side with respect to a main surface of the insulating layer 17 (resin layer 20). The terminal surface 24 may project further upward than the main surface of the insulating layer 17 (resin layer 20). The terminal surface 24 may have an overlap portion covering the main surface of the insulating layer 17 (resin layer 20).

The pad electrode 23 includes a metal material differing from the first main surface electrode 14. In this embodiment, the pad electrode 23 has a laminated structure that includes an Ni layer 25, a Pd layer 26, and an Au layer 27 laminated in that order from the first main surface electrode 14 side. Ni, Pd, and Au respectively have Young's moduli (rigidity moduli) that exceed the Young's modulus (rigidity modulus) of Al. The Ni layer 25, the Pd layer 26, and the Au layer 27 may be plating layers formed by a plating method.

The pad electrode 23 suffices to include at least one among the Ni layer 25, the Pd layer 26, and the Au layer 27. The pad electrode 23 may have a laminated structure in which at least two among the Ni layer 25, the Pd layer 26, and the Au layer 27 are laminated in any order. The pad electrode 23 may have a single layer structure constituted of the Ni layer 25, the Pd layer 26, or the Au layer 27.

The pad electrode 23 preferably has the terminal surface 24 that is formed by the Au layer 27. The pad electrode 23 preferably has a laminated structure that includes at least the Ni layer 25 and the Au layer 27 that are laminated in that order from the first main surface electrode 14 side.

A thickness of the Ni layer 25 may be not less than 0.1 μm and not more than 10 μm. The thickness of the Ni layer 25 may be not less than 0.1 μm and not more than 0.5 μm, not less than 0.5 μm and not more than 1 μm, not less than 1 μm and not more than 2 μm, not less than 2 μm and not more than 4 μm, not less than 4 μm and not more than 6 μm, not less than 6 μm and not more than 8 μm, or not less than 8 μm and not more than 10 μm.

A thickness of the Pd layer 26 may be not less than 0.1 μm and not more than 10 μm. The thickness of the Pd layer 26 may be not less than 0.1 μm and not more than 0.5 μm, not less than 0.5 μm and not more than 1 μm, not less than 1 μm and not more than 2 μm, not less than 2 μm and not more than 4 μm, not less than 4 μm and not more than 6 μm, not less than 6 μm and not more than 8 μm, or not less than 8 μm and not more than 10 μm.

A thickness of the Au layer 27 may be not less than 0.01 μm and not more than 3 μm. The thickness of the Au layer 27 may be not less than 0.01 μm and not more than 0.05 μm, not less than 0.05 μm and not more than 0.1 μm, not less than 0.1 μm and not more than 0.5 μm, not less than 0.5 μm and not more than 1 μm, not less than 1 μm and not more than 2 μm, or not less than 2 μm and not more than 3 μm. The thickness of the Au layer 27 is preferably less than the thickness of the Ni layer 25. The thickness of the Au layer 27 is preferably less than the thickness of the Pd layer 26.

Referring to FIG. 2 and FIG. 3, the SiC semiconductor device 1 includes the second main surface electrode 31 formed on the second main surface 4. The second main surface electrode 31 is formed as a cathode electrode of the SBD. In this embodiment, the second main surface electrode 31 covers an entire area of the second main surface 4.

The second main surface electrode 31 may be formed at intervals inward from the side surfaces 5A to 5D and expose a peripheral edge portion of the second main surface 4. In this case, it is made unnecessary to physically cut the second main surface electrode 31 when cutting out the SiC semiconductor device 1 from the SiC wafer. The SiC semiconductor device 1 can thereby be cut out smoothly from the SiC wafer and at the same time, peeling and degradation of the second main surface electrode 31 can be suppressed. Consequently, the second main surface electrode 31 can be connected appropriately to the second main surface 4.

Such a second main surface electrode 31 can be obtained, as an example, by removing unnecessary portions of the second main surface electrode 31 by an etching method via a resist mask in a manufacturing process. Also, the second main surface electrode 31 can be obtained, as another example, by forming the second main surface electrode 31, which partially covers the second main surface 4, by a lift-off method using a resist mask in the manufacturing process.

The second main surface electrode 31 includes a second Al layer 32 that covers the second main surface 4. The second Al layer 32 opposes the first Al layer 16 of the first main surface electrode 14 across the SiC chip 2. The second Al layer 32 is formed as a second buffer layer that uses the cushioning property of Al, which has the comparative small Young's modulus (rigidity modulus), to relax an external force applied to the SiC chip 2 from the second main surface 4 side.

The second Al layer 32 includes at least one among a pure Al layer, an AlSi alloy layer, an AlCu alloy layer, and an AlSiCu alloy layer. The second Al layer 32 may have a laminated structure in which two or more among a pure Al layer, an AlSi alloy layer, an AlCu alloy layer, and an AlSiCu alloy layer are laminated in any order. The second Al layer 32 may be formed by a sputter method and/or a vapor deposition method.

The second Al layer 32 may have a single layer structure constituted of a pure Al layer, an AlSi alloy layer, an AlCu alloy layer, or an AlSiCu alloy layer. An Al based metal material of the second Al layer 32 may differ from an Al based metal material of the first Al layer 16. The second Al layer 32 preferably has a single layer structure constituted of a pure Al layer.

The second Al layer 32 may have a thickness less than the first Al layer 16. The thickness of the second Al layer 32 may be not less than 0.01 μm and not more than 5 μm. The thickness of the second Al layer 32 may be not less than 0.01 μm and not more than 0.1 μm, not less than 0.1 μm and not more than 1 µm, not less than 1 µm and not more than 2 µm, not less than 2 µm and not more than 3 µm, not less than 3 µm and not more than 4 µm, or not less than 4 µm and not more than 5 µm.

In addition to the second Al layer 32, the second main surface electrode 31 further includes one or a plurality of electrode layers constituted of a metal material differing from the second Al layer 32. In this embodiment, the second main surface electrode 31 includes, as an example of a plurality of electrode layers, a Ti layer 33, an Ni layer 34, a Pd layer 35, an Au layer 36, and an Ag layer 37 that are laminated in that order from the second main surface 4 side.

The Ti layer 33 is an ohmic electrode that forms an ohmic contact with the second main surface 4. The second Al layer 32 covers the second main surface 4 across the Ti layer 33, the Ni layer 34, the Pd layer 35, the Au layer 36, and the Ag layer 37.

Ti, Ni, Pd, Au, and Ag respectively have Young's moduli (rigidity moduli) that exceed the Young's modulus (rigidity modulus) of Al. The Ti layer 33, the Ni layer 34, the Pd layer 35, the Au layer 36, and the Ag layer 37 may be formed by a sputter method, a vapor deposition method, and/or a plating method.

The second main surface electrode 31 suffices to include at least one among the Ti layer 33, the Ni layer 34, the Pd layer 35, the Au layer 36, and the Ag layer 37 as the one or plurality of electrode layers. The second Al layer 32 preferably covers the second main surface 4 at least across the Ti layer 33.

If the second main surface electrode 31 includes at least one among the Ni layer 34, the Pd layer 35, and the Au layer 36, at least one among the Ni layer 34, the Pd layer 35, and the Au layer 36 may be a plating layer formed at the same time as the Ni layer 25, the Pd layer 26, and the Au layer 27 of the pad electrode 23.

A thickness of the Ti layer 33 may be not less than 0.01 µm and not more than 3 µm. The thickness of the Ti layer 33 may be not less than 0.01 µm and not more than 0.05 µm, not less than 0.05 µm and not more than 0.1 µm, not less than 0.1 µm and not more than 0.5 µm, not less than 0.5 µm and not more than 1 µm, not less than 1 µm and not more than 2 µm, or not less than 2 µm and not more than 3 µm.

A thickness of the Ni layer 34 may be not less than 0.1 µm and not more than 10 µm. The thickness of the Ni layer 34 may be not less than 0.1 µm and not more than 0.5 µm, not less than 0.5 µm and not more than 1 µm, not less than 1 µm and not more than 2 µm, not less than 2 µm and not more than 4 µm, not less than 4 µm and not more than 6 µm, not less than 6 µm and not more than 8 µm, or not less than 8 µm and not more than 10 µm. The thickness of the Ni layer 34 preferably exceeds the thickness of the Ti layer 33.

A thickness of the Pd layer 35 may be not less than 0.1 µm and not more than 10 µm. The thickness of the Pd layer 35 may be not less than 0.1 µm and not more than 0.5 µm, not less than 0.5 µm and not more than 1 µm, not less than 1 µm and not more than 2 µm, not less than 2 µm and not more than 4 µm, not less than 4 µm and not more than 6 µm, not less than 6 µm and not more than 8 µm, or not less than 8 µm and not more than 10 µm. The thickness of the Pd layer 35 preferably exceeds the thickness of the Ti layer 33.

A thickness of the Au layer 36 may be not less than 0.01 µm and not more than 3 µm. The thickness of the Au layer 36 may be not less than 0.01 µm and not more than 0.05 µm, not less than 0.05 µm and not more than 0.1 µm, not less than 0.1 µm and not more than 0.5 µm, not less than 0.5 µm and not more than 1 µm, not less than 1 µm and not more than 2 µm, or not less than 2 µm and not more than 3 µm. The thickness of the Au layer 36 is preferably less than the thickness of the Ni layer 34. The thickness of the Au layer 36 is preferably less than the thickness of the Pd layer 35.

A thickness of the Ag layer 37 may be not less than 0.01 µm and not more than 3 µm. The thickness of the Ag layer 37 may be not less than 0.01 µm and not more than 0.05 µm, not less than 0.05 µm and not more than 0.1 µm, not less than 0.1 µm and not more than 0.5 µm, not less than 0.5 µm and not more than 1 µm, not less than 1 µm and not more than 2 µm, or not less than 2 µm and not more than 3 µm. The thickness of the Ag layer 37 is preferably less than the thickness of the Ni layer 34. The thickness of the Ag layer 37 is preferably less than the thickness of the Pd layer 35.

The second main surface electrode 31 may have a structure shown in FIG. 4A to FIG. 4I.

Figure 4A:
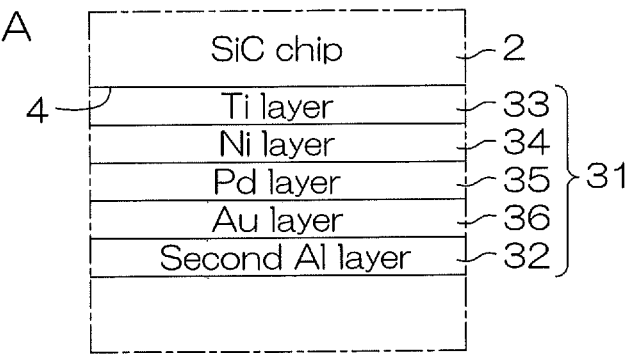
FIG. 4A is an illustrative sectional view of the second main surface electrode according to a second configuration example.

FIG. 4A is an illustrative sectional view of the second main surface electrode 31 according to a second configuration example. In the following, structures corresponding to the structures described with FIG. 1 to FIG. shall be provided with the same reference signs and description thereof shall be omitted.

Referring to FIG. 4A, in this embodiment, the second main surface electrode 31 has a laminated structure that includes the second Al layer 32, the Ti layer 33, the Ni layer 34, the Pd layer 35, and the Au layer 36. The Ti layer 33, the Ni layer 34, the Pd layer 35, and the Au layer 36 are laminated in that order from the second main surface 4 side. The second Al layer 32 covers the second main surface 4 across the Ti layer 33, the Ni layer 34, the Pd layer 35, and the Au layer 36.

Figure 4B:
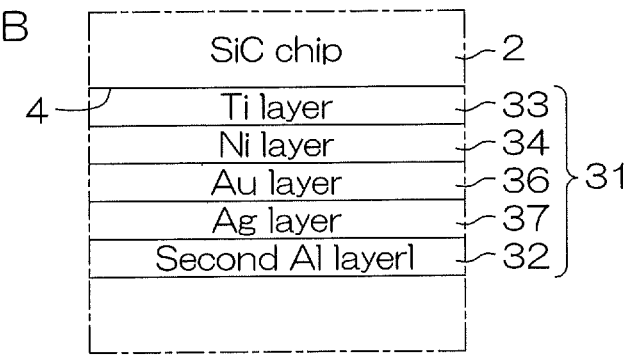
FIG. 4B is an illustrative sectional view of the second main surface electrode according to a third configuration example.

FIG. 4B is an illustrative sectional view of the second main surface electrode 31 according to a third configuration example. In the following, structures corresponding to the structures described with FIG. 1 to FIG. shall be provided with the same reference signs and description thereof shall be omitted.

Referring to FIG. 4B, in this embodiment, the second main surface electrode 31 has a laminated structure that includes the second Al layer 32, the Ti layer 33, the Ni layer 34, the Au layer 36, and the Ag layer 37. The Ti layer 33, the Ni layer 34, the Au layer 36, and the Ag layer 37 are laminated in that order from the second main surface 4 side. The second Al layer 32 covers the second main surface 4 across the Ti layer 33, the Ni layer 34, the Au layer 36, and the Ag layer 37.

Figure 4C:
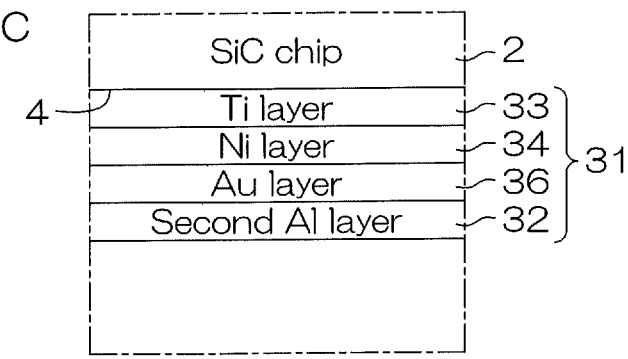
FIG. 4C is an illustrative sectional view of the second main surface electrode according to a fourth configuration example.

FIG. 4C is an illustrative sectional view of the second main surface electrode 31 according to a fourth configuration example. In the following, structures corresponding to the structures described with FIG. 1 to FIG. shall be provided with the same reference signs and description thereof shall be omitted.

Referring to FIG. 4C, in this embodiment, the second main surface electrode 31 has a laminated structure that includes the second Al layer 32, the Ti layer 33, the Ni layer 34, and the Au layer 36. The Ti layer 33, the Ni layer 34, and the Au layer 36 are laminated in that order from the second main surface 4 side. The second Al layer 32 covers the second main surface 4 across the Ti layer 33, the Ni layer 34, and the Au layer 36.

Figure 4D:
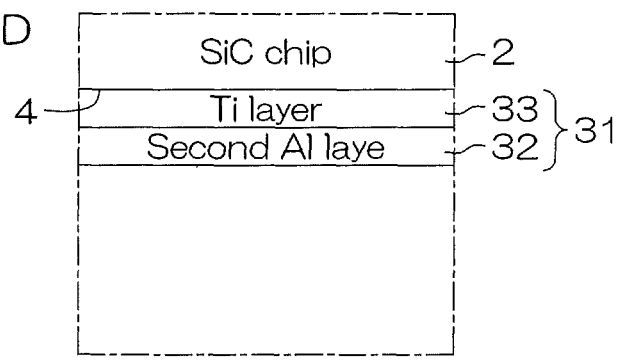
FIG. 4D is an illustrative sectional view of the second main surface electrode according to a fifth configuration example.

FIG. 4D is an illustrative sectional view of the second main surface electrode 31 according to a fifth configuration example. In the following, structures corresponding to the structures described with FIG. 1 to FIG. 3 shall be provided with the same reference signs and description thereof shall be omitted.

Referring to FIG. 4D, in this embodiment, the second main surface electrode 31 has a laminated structure that includes the second Al layer 32 and the Ti layer 33. The Ti layer 33 is connected to the second main surface 4. The second Al layer 32 covers the second main surface 4 across the Ti layer 33.

Figure 4E:
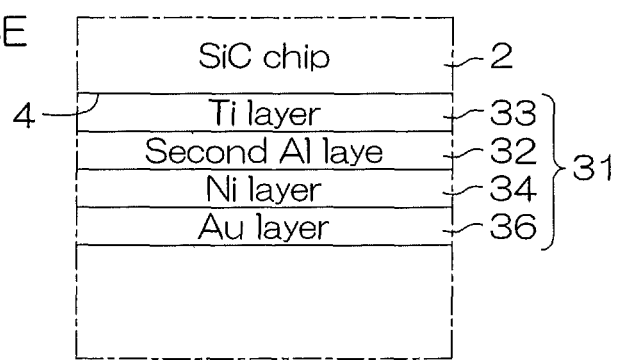
FIG. 4E is an illustrative sectional view of the second main surface electrode according to a sixth configuration example.

FIG. 4E is an illustrative sectional view of the second main surface electrode 31 according to a sixth configuration example. In the following, structures corresponding to the structures described with FIG. 1 to FIG. shall be provided with the same reference signs and description thereof shall be omitted.

Referring to FIG. 4E, in this embodiment, the second main surface electrode 31 includes the second Al layer 32, the Ti layer 33, the Ni layer 34, and the Au layer 36. The Ti layer 33, the Ni layer 34, and the Au layer 36 are laminated in that order from the second main surface 4 side. The second Al layer 32 is interposed between the Ti layer 33 and the Ni layer 34 and covers the second main surface 4 across the Ti layer 33.

In this case, the pad electrode 23 preferably has a two layer structure constituted of the Ni layer 25 and the Au layer 27 that are laminated in that order from the first main surface electrode 14 side. The Ni layer 34 and the Au layer 36 of the second main surface electrode 31 can be formed by a plating method at the same time as the Ni layer 25 and the Au layer 27 of the pad electrode 23.

Figure 4F:
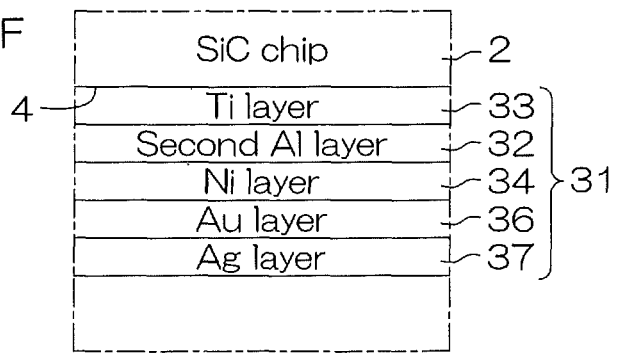
FIG. 4F is an illustrative sectional view of the second main surface electrode according to a seventh configuration example.

FIG. 4F is an illustrative sectional view of the second main surface electrode 31 according to a seventh configuration example. In the following, structures corresponding to the structures described with FIG. 1 to FIG. shall be provided with the same reference signs and description thereof shall be omitted.

Referring to FIG. 4F, in this embodiment, the second main surface electrode 31 includes the second Al layer 32, the Ti layer 33, the Ni layer 34, the Au layer 36, and the Ag layer 37. The Ti layer 33, the Ni layer 34, the Au layer 36, and the Ag layer 37 are laminated in that order from the second main surface 4 side. The second Al layer 32 is interposed between the Ti layer 33 and the Ni layer 34 and covers the second main surface 4 across the Ti layer 33.

In this case, the pad electrode 23 preferably has the two layer structure constituted of the Ni layer 25 and the Au layer 27 that are laminated in that order from the first main surface electrode 14 side. The Ni layer 34 and the Au layer 36 of the second main surface electrode 31 can be formed by the plating method at the same time as the Ni layer 25 and the Au layer 27 of the pad electrode 23.

Figure 4G:
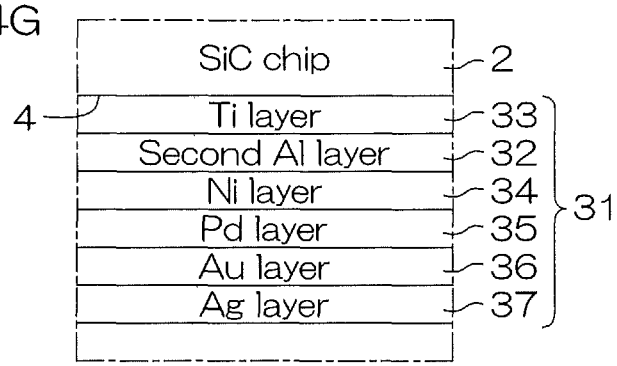
FIG. 4G is an illustrative sectional view of the second main surface electrode according to an eighth configuration example.

FIG. 4G is an illustrative sectional view of the second main surface electrode 31 according to an eighth configuration example. In the following, structures corresponding to the structures described with FIG. 1 to FIG. shall be provided with the same reference signs and description thereof shall be omitted.

Referring to FIG. 4G, in this embodiment, the second main surface electrode 31 includes the second Al layer 32, the Ti layer 33, the Ni layer 34, the Pd layer 35, the Au layer 36, and the Ag layer 37. The Ti layer 33, the Ni layer 34, the Au layer 36, and the Ag layer 37 are laminated in that order from the second main surface 4 side. The second Al layer 32 is interposed between the Ti layer 33 and the Ni layer 34 and covers the second main surface 4 across the Ti layer 33.

In this case, the pad electrode 23 preferably has a three layer structure constituted of the Ni layer 25, the Pd layer 26, and the Au layer 27 that are laminated in that order from the first main surface electrode 14 side. The Ni layer 34, the Pd layer 35, and the Au layer 36 of the second main surface electrode 31 can be formed by a plating method at the same time as the Ni layer 25, the Pd layer 26, and the Au layer 27 of the pad electrode 23.

Figure 4H:
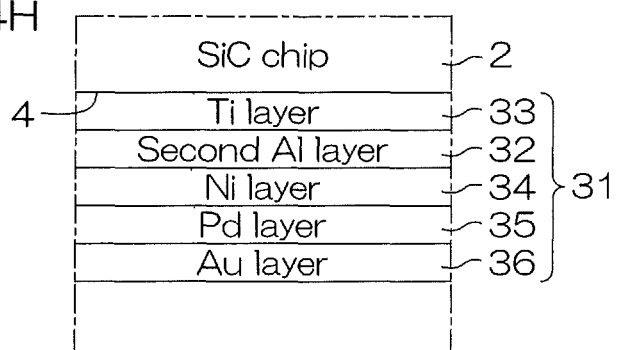
FIG. 4H is an illustrative sectional view of the second main surface electrode according to a ninth configuration example.

FIG. 4H is an illustrative sectional view of the second main surface electrode 31 according to a ninth configuration example. In the following, structures corresponding to the structures described with FIG. 1 to FIG. 3 shall be provided with the same reference signs and description thereof shall be omitted.

Referring to FIG. 4H, in this embodiment, the second main surface electrode 31 includes the second Al layer 32, the Ti layer 33, the Ni layer 34, the Pd layer 35, and the Au layer 36. The Ti layer 33, the Ni layer 34, the Pd layer 35, and the Au layer 36 are laminated in that order from the second main surface 4 side. The second Al layer 32 is interposed between the Ti layer 33 and the Ni layer 34 and covers the second main surface 4 across the Ti layer 33.

In this case, the pad electrode 23 preferably has the three layer structure constituted of the Ni layer 25, the Pd layer 26, and the Au layer 27 that are laminated in that order from the first main surface electrode 14 side. The Ni layer 34, the Pd layer 35, and the Au layer 36 of the second main surface electrode 31 can be formed by the plating method at the same time as the Ni layer 25, the Pd layer 26, and the Au layer 27 of the pad electrode 23.

Figure 4I:
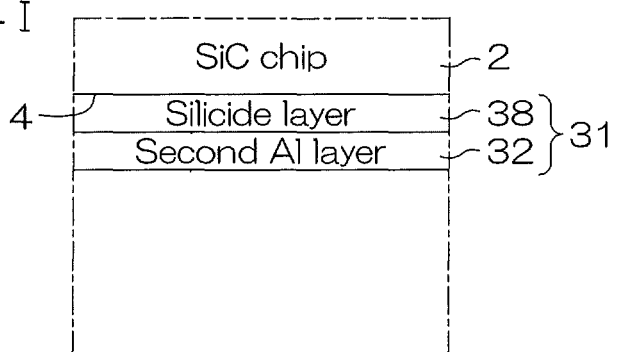
FIG. 4I is an illustrative sectional view of the second main surface electrode according to a tenth configuration example.

FIG. 4I is an illustrative sectional view of the second main surface electrode 31 according to a tenth configuration example. In the following, structures corresponding to the structures described with FIG. 1 to FIG. shall be provided with the same reference signs and description thereof shall be omitted.

Referring to FIG. 4I, in this embodiment, the second main surface electrode 31 includes the second Al layer 32 and a silicide layer 38. The silicide layer 38 is formed on the second main surface 4. The silicide layer 38 is a layer with which SiC exposed from the second main surface 4 has been silicided by a metal material. The silicide layer 38 may include at least one among an $FeSi_2$ layer, an NiSi layer, an $NiSi_2$ layer, a $CoSi_2$ layer, a $CrSi_2$ layer, a $WSi_2$ layer, an $MoSi_2$ layer, an $MnSi_2$ layer, an $NbSi_2$ layer, a $TiSi_2$ layer, and a $VSi_2$ layer.

The second Al layer 32 covers the second main surface 4 across the silicide layer 38. Besides the second Al layer 32 and the silicide layer 38, the second main surface electrode 31 may include at least one among the Ti layer 33, the Ni layer 34, the Pd layer 35, the Au layer 36, and the Ag layer 37. A lamination order of the second Al layer 32, the Ti layer 33, the Ni layer 34, the Pd layer 35, the Au layer 36, and the Ag layer 37 is arbitrary. As a structure that covers the silicide layer 38, the lamination structure of any one of the first to tenth configuration examples may be adopted.

Figure 5:
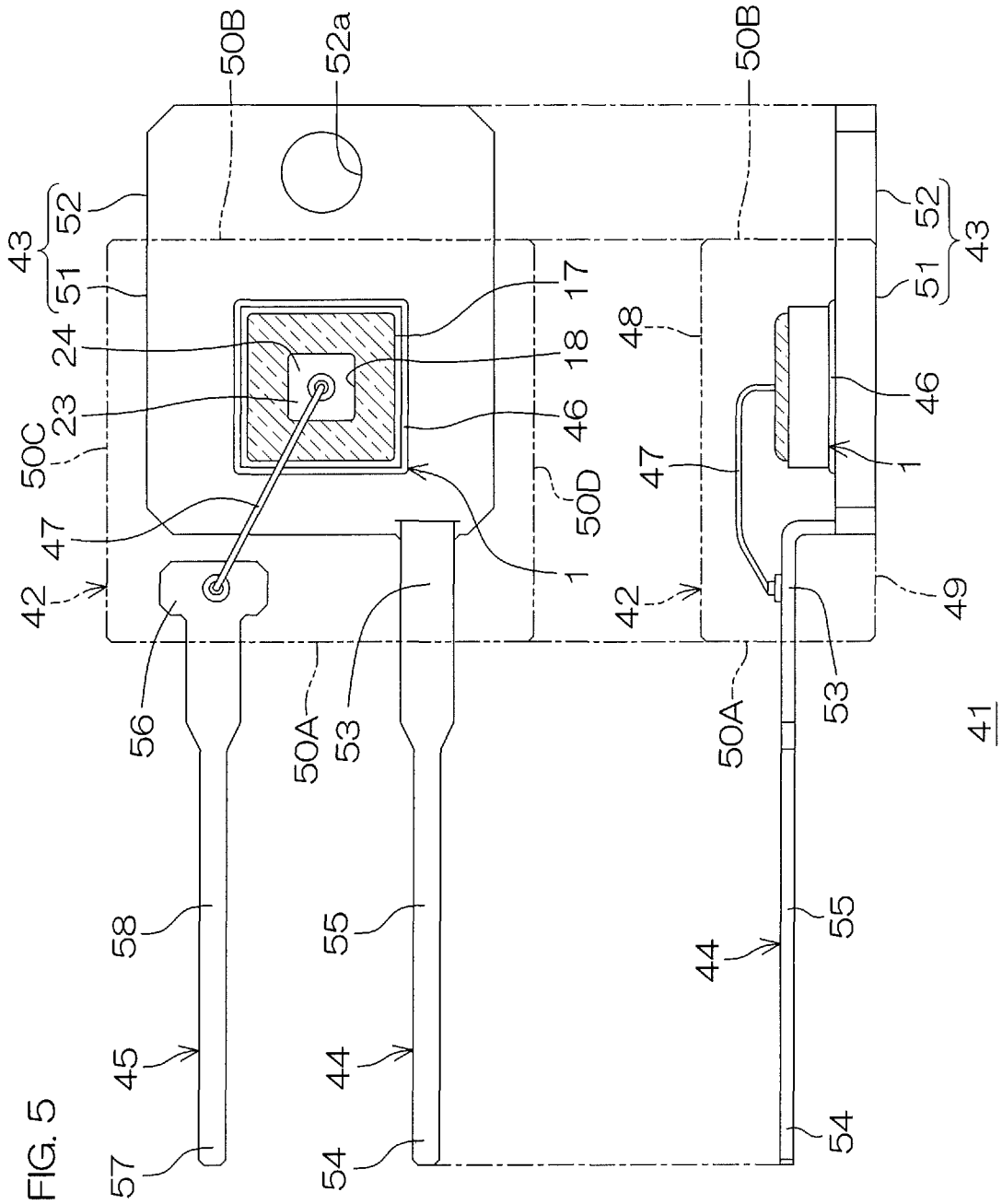
FIG. 5 is a diagram of a semiconductor package incorporating the SiC semiconductor device shown in FIG. 1.

FIG. 5 is a diagram of a semiconductor package 41 incorporating the SiC semiconductor device 1 shown in FIG. 1. In FIG. 5, an internal structure of the semiconductor package 41 is shown transparently through a package main body 42.

Referring to FIG. 5, in this embodiment, the semiconductor package 41 is a two terminal type TO-220. The semiconductor package 41 includes the package main body 42, a metal plate 43, a first terminal 44, a second terminal 45, the SiC semiconductor device 1, a conductive bonding material 46, and a lead wire 47.

The package main body 42 is constituted of a molding resin. The package main body 42 may include an epoxy resin as an example of the molding resin. The package main body 42 is formed to a rectangular parallelepiped shape. The package main body 42 includes a first surface 48 at one side, a second surface 49 at another side, and four side surfaces 50A, 50B, 50C, and 50D connecting the first surface 48 and the second surface 49.

More specifically, the four side surfaces 50A to 50D include the first side surface 50A, the second side surface 50B, the third side surface 50C, and the fourth side surface 50D. The first side surface 50A and the second side surface 50B oppose each other. The third side surface 50C and the fourth side surface 50D oppose each other.

The metal plate 43 may include at least one among Fe, Au, Ag, Cu, and Al. The metal plate 43 may have an outer surface on which at least one among an Ni plating film, an Au plating film, an Ag plating film, and a Cu plating film is formed. A planar shape of the metal plate 43 is arbitrary. In this embodiment, the metal plate 43 is formed to a quadrilateral shape (rectangular shape) in plan view.

The metal plate 43 integrally includes a pad portion 51 positioned inside the package main body 42 and a heat sink portion 52 positioned outside the package main body 42. The heat sink portion 52 crosses the second side surface 50B from the pad portion 51 and is led outside the package main body 42. The heat sink portion 52 includes a penetrating hole 52a. The penetrating hole 52a is formed to a circular shape.

In this embodiment, the metal plate 43 is disposed inside the package main body 42 such as to be exposed from the second surface 49. The metal plate 43 may instead be disposed inside the package main body 42 such as not to be exposed from the second surface 49.

The first terminal 44 may include at least one among Fe, Au, Ag, Cu, and Al. The first terminal 44 may have an outer surface on which at least one among an Ni plating film, an Au plating film, an Ag plating film, and a Cu plating film is formed. The first terminal 44 crosses the first side surface 50A from inside the package main body 42 and is led outside the package main body 42. The first terminal 44 is disposed in a region at the fourth side surface 50D side in plan view. The first terminal 44 is disposed in a region at the first surface 48 side with respect to a plate surface of the metal plate 43.

The first terminal 44 includes a first inner end portion 53, a first outer end portion 54, and a first band portion 55. The first inner end portion 53 is connected to the metal plate 43 inside the package main body 42. The first outer end portion 54 is disposed outside the package main body 42. The first band portion 55 extends in a direction orthogonal to the first side surface 50A between the first inner end portion 53 and the first outer end portion 54.

The second terminal 45 may include at least one among Fe, Au, Ag, Cu, and Al. The second terminal 45 may include at least one among an Ni plating film, an Au plating film, an Ag plating film, and a Cu plating film. The second terminal 45 crosses the first side surface 50A from inside the package main body 42 and is led outside the package main body 42.

The second terminal 45 is disposed in a region at the third side surface 50C side at an interval from the first terminal 44 in plan view. The second terminal 45 is disposed in the region at the first surface 48 side with respect to the plate surface of the metal plate 43.

The second terminal 45 includes a second inner end portion 56, a second outer end portion 57, and a second band portion 58. The second inner end portion 56 is disposed inside the package main body 42 at an interval from the metal plate 43. The second outer end portion 57 is disposed outside the package main body 42. The second band portion 58 extends in the direction orthogonal to the first side surface 50A between the second inner end portion 56 and the second outer end portion 57.

The SiC semiconductor device 1 is disposed on the pad portion 51 of the metal plate 43 inside the package main body 42. The conductive bonding material 46 is interposed between the SiC semiconductor device 1 and the pad portion 51 and bonds the second main surface electrode 31 of the SiC semiconductor device 1 to the pad portion 51. The SiC semiconductor device 1 is thereby electrically connected to the first terminal 44 via the metal plate 43.

The conductive bonding material 46 may be a metal paste or solder. The metal paste may include at least one among Au, Ag, and Cu. The conductive bonding material 46 is preferably constituted of solder. The solder may be lead-free solder. The solder may include at least one among SnAgCu, SnZnBi, SnCu, SnCuNi, and SnSbNi.

The lead wire 47 is constituted of a metal wire (bonding wire) or a metal clip. The metal wire may be an Al wire, an Au wire, a Cu wire, or a solder wire. The solder wire may be a lead-free solder wire. The solder wire may include at least one among SnAgCu, SnZnBi, SnCu, SnCuNi, and SnSbNi. The metal clip may be an Al clip, an Au clip, or a Cu clip. In this embodiment, the lead wire 47 is constituted of a solder wire.

Inside the package main body 42, the lead wire 47 is connected to the second inner end portion 56 of the second terminal 45 and the pad electrode 23 of the SiC semiconductor device 1. The SiC semiconductor device 1 is thereby electrically connected to the second terminal 45.

Figure 6:
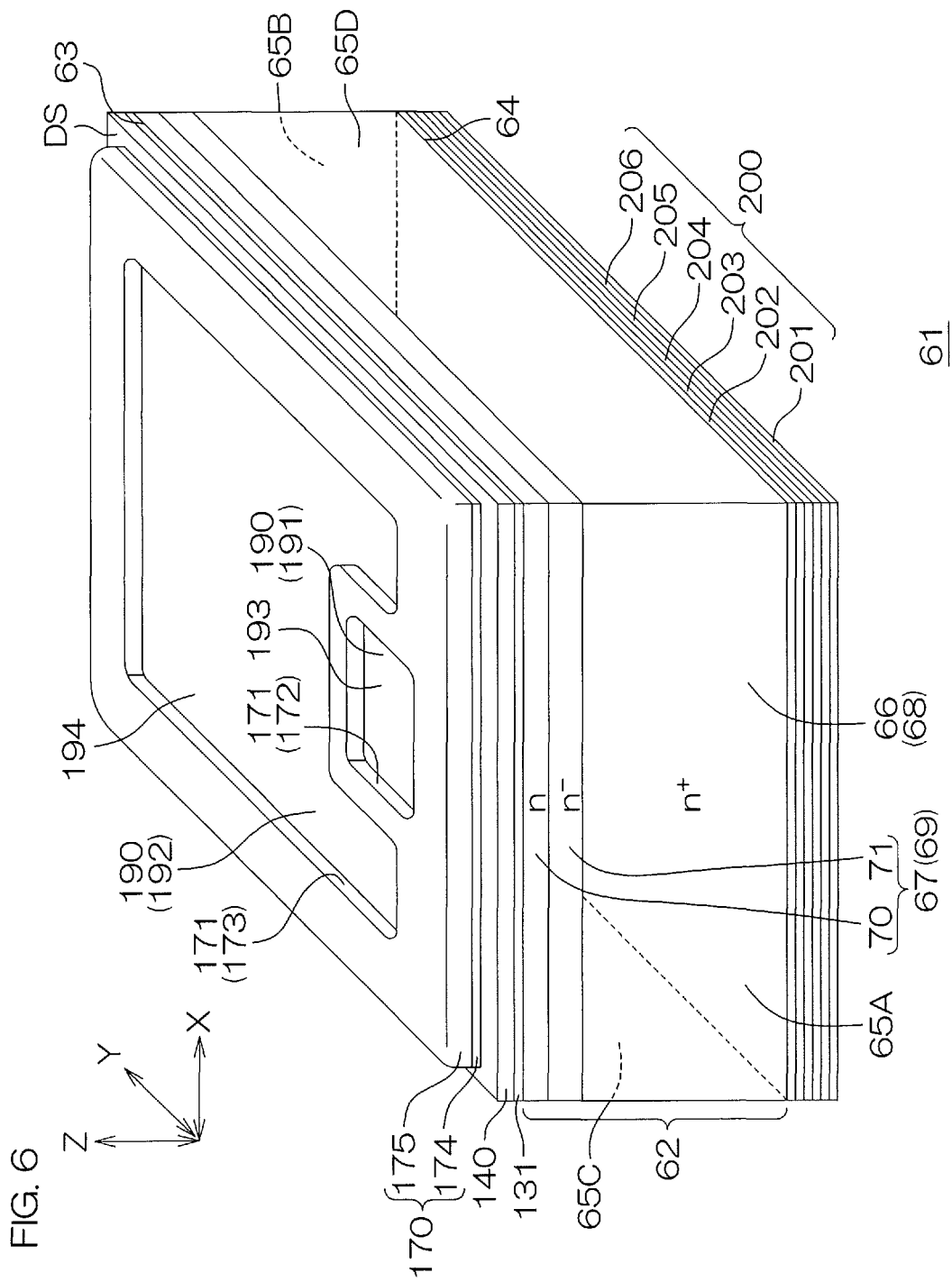
FIG. 6 is a perspective view of an SiC semiconductor device according to a second preferred embodiment of the present invention and shows an embodiment where a second main surface electrode according to a first configuration example is incorporated.

Although an example in which one lead wire 47 is connected to the second inner end portion 56 and the pad electrode 23 is shown in FIG. 6, the number of lead wires 47 is arbitrary. Two or more lead wires 47 may be connected to the second inner end portion 56 and the pad electrode 23.

The semiconductor package 41 can take on a configuration other than TO-220. The semiconductor package 41 may be an SOP (small outline package), a QFN (quad for non lead package), a DFP (dual flat package), a DIP (dual inline package), a QFP (quad flat package), an SIP (single inline package), or an SOJ (small outline J-leaded package) or may have any of various configurations similar to these.

As described above, with the SiC semiconductor device 1, the first Al layer 16 is formed as the first buffer layer that relaxes the external force at the first main surface 3 side and the second Al layer 32 is formed as the second buffer layer that relaxes the external force at the second main surface 4 side. An external force in a direction directed from the first main surface 3 toward the second main surface 4 and an external force in a direction directed from the second main surface 4 toward the first main surface 3 can thereby be relaxed.

As an example, external forces applied to the SiC chip 2 when the SiC semiconductor device 1 is mounted on the pad portion 51 of the metal plate 43 can be relaxed by the first Al layer 16 and the second Al layer 32. Also, external forces applied to the SiC chip 2 when the lead wire 47 is bonded to the pad electrode 23 of the SiC semiconductor device 1 can be relaxed by the first Al layer 16 and the second Al layer 32. Consequently, cracking of the SiC chip 2 can be suppressed.

Also, the SiC semiconductor device 1 includes the pad electrode 23 that is externally bonded to the lead wire 47. The pad electrode 23 includes at least one among the Ni layer 25, the Pd layer 26, and the Au layer 27. The lead wire 47 can thereby be connected appropriately to the pad electrode 23.

On the other hand, Ni, Pd, and Au respectively have Young's moduli (rigidity moduli) that exceed the Young's modulus (rigidity modulus) of Al. Therefore, with a structure that includes the pad electrode 23, an external force that is applied during bonding of the lead wire 47 cannot be relaxed appropriately.

Thus, with the SiC semiconductor device 1, the first Al layer 16 that includes Al is interposed between the SiC chip 2 and the pad electrode 23. By the first Al layer 16, an external force applied to the SiC chip 2 can be relaxed from the first main surface 3 side using the cushioning property of Al that has the comparative small Young's modulus (rigidity modulus). The lead wire 47 can thus be bonded to the pad electrode 23 appropriately and, at the same time, cracking of the SiC chip 2 can be suppressed.

Also, the SiC semiconductor device 1 includes, in addition to the second Al layer 32, the second main surface electrode 31 that has the one or plurality of electrode layers constituted of a metal material differing from the second Al layer 32. The one or plurality of electrode layers include at least one among the Ti layer 33, the Ni layer 34, the Pd layer 35, the Au layer 36, and the Ag layer 37. An adhesion force of the conductive bonding material 46 to the second main surface electrode 31 can thereby be increased appropriately. Consequently, the SiC semiconductor device 1 can be mounted appropriately on the pad portion 51 of the metal plate 43.

On the other hand, Ti, Ni, Pd, Au, and Ag respectively have Young's moduli (rigidity moduli) that exceed the Young's modulus (rigidity modulus) of Al. Therefore, with a structure where the second main surface electrode 31 includes at least one among the Ti layer 33, the Ni layer 34, the Pd layer 35, the Au layer 36, and the Ag layer 37, an external force that is applied during the mounting of the SiC semiconductor device 1 or the bonding of the lead wire 47 cannot be relaxed appropriately.

Thus, with the SiC semiconductor device 1, the second main surface electrode 31 that includes the second Al layer 32 in addition to the at least one among the Ti layer 33, the Ni layer 34, the Pd layer 35, the Au layer 36, and the Ag layer 37 is formed. By the second Al layer 32, an external force applied to the SiC chip 2 can be relaxed from the second main surface 4 side using the cushioning property of Al that has the comparative small Young's modulus (rigidity modulus). The SiC semiconductor device 1 can thus be mounted on the pad portion 51 appropriately and, at the same time, cracking of the SiC chip 2 can be suppressed.

Figure 7:
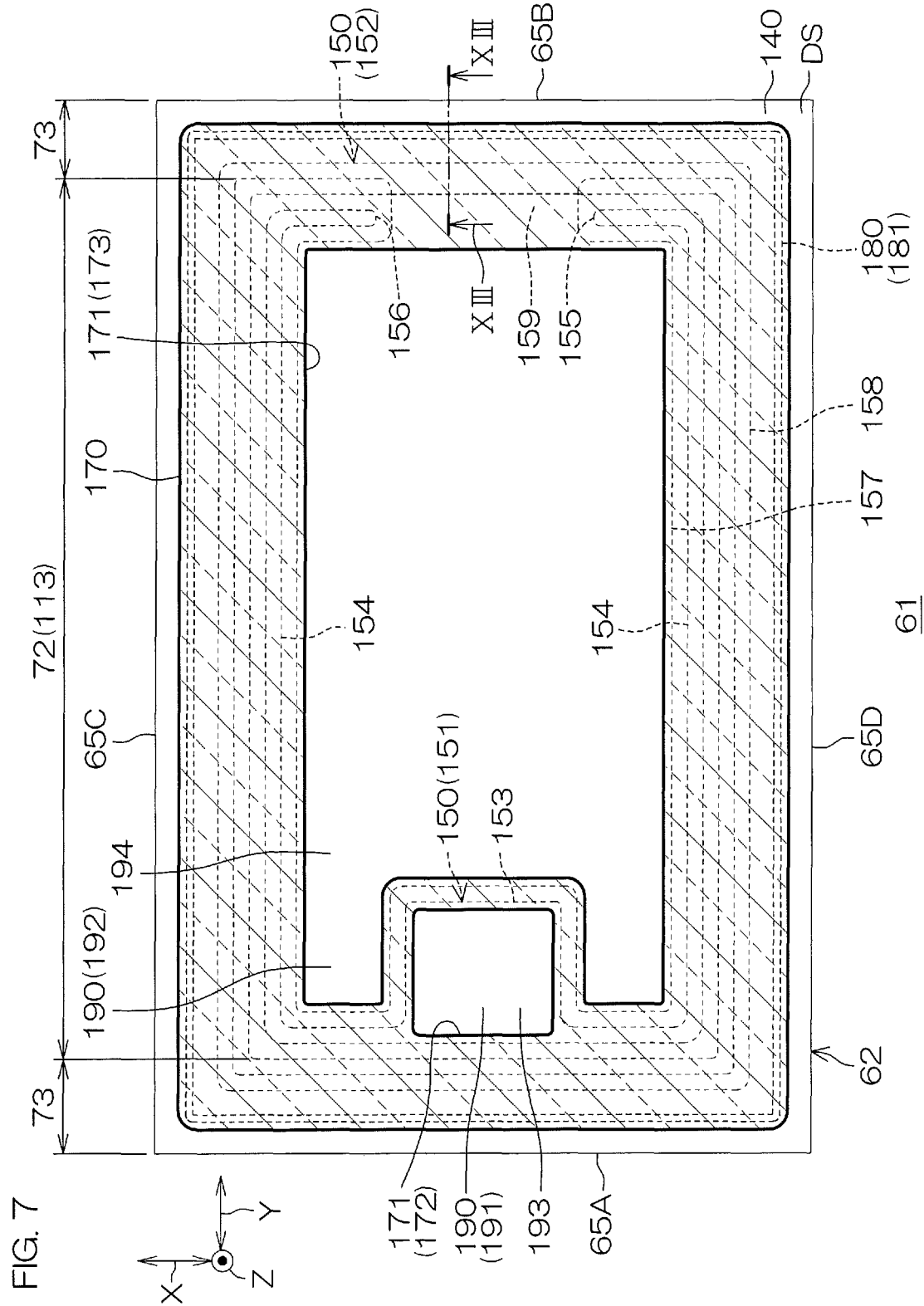
FIG. 7 is a plan view of the SiC semiconductor device shown in FIG. 6.
Figure 8:
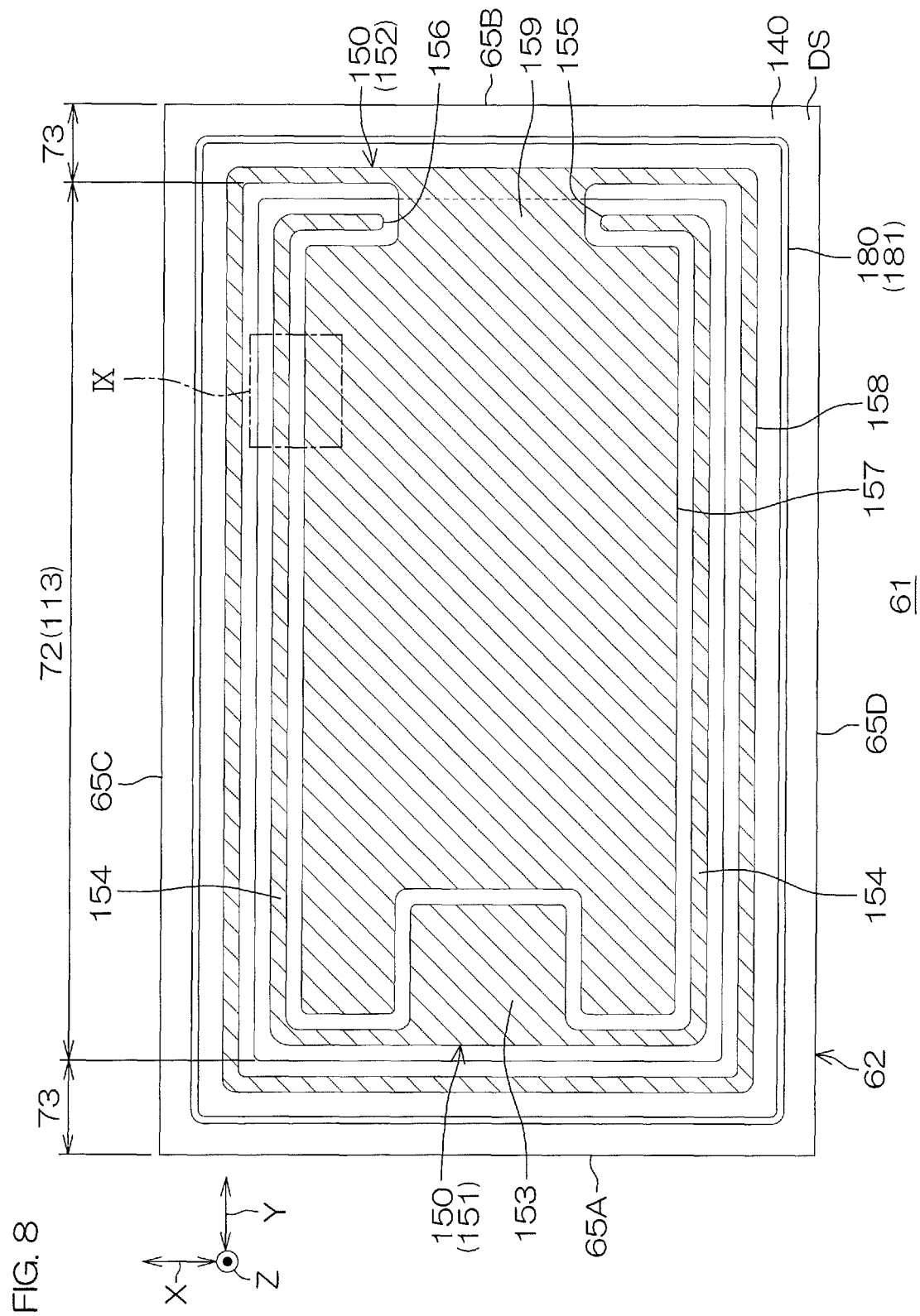
FIG. 8 is a plan view with which a structure on a first main surface electrode is removed.

FIG. 6 is a perspective view of an SiC semiconductor device 61 according to a second preferred embodiment of the present invention and shows an embodiment where a second main surface electrode 200 according to a first configuration example is incorporated. FIG. 7 is a plan view of the SiC semiconductor device 61 shown in FIG. 6. FIG. 8 is a plan view with which a structure on a first main surface electrode 150 is removed.

Figure 9:
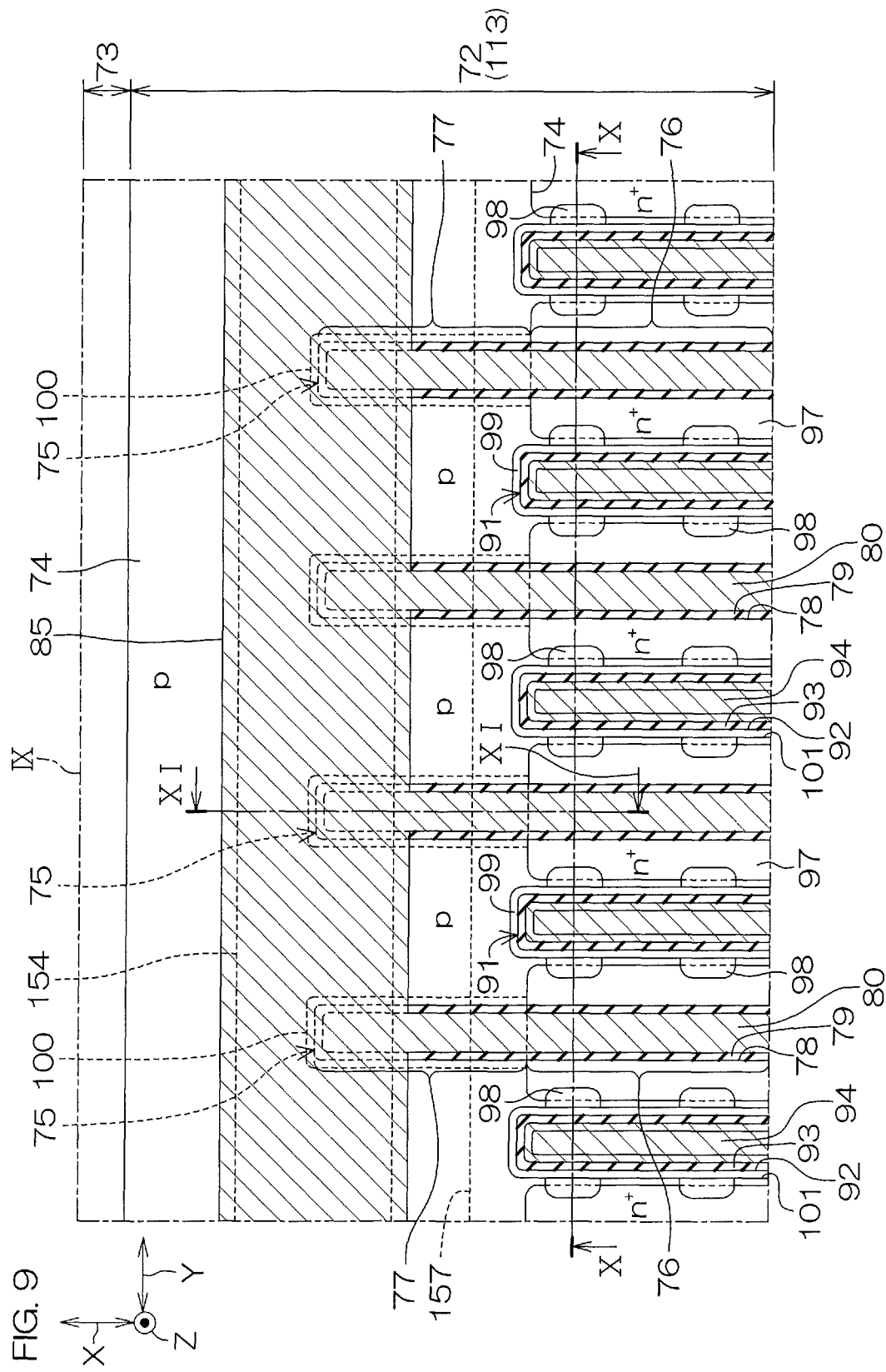
FIG. 9 is an enlarged plan view of an internal structure of a region IX shown in FIG. 8.
Figure 10:
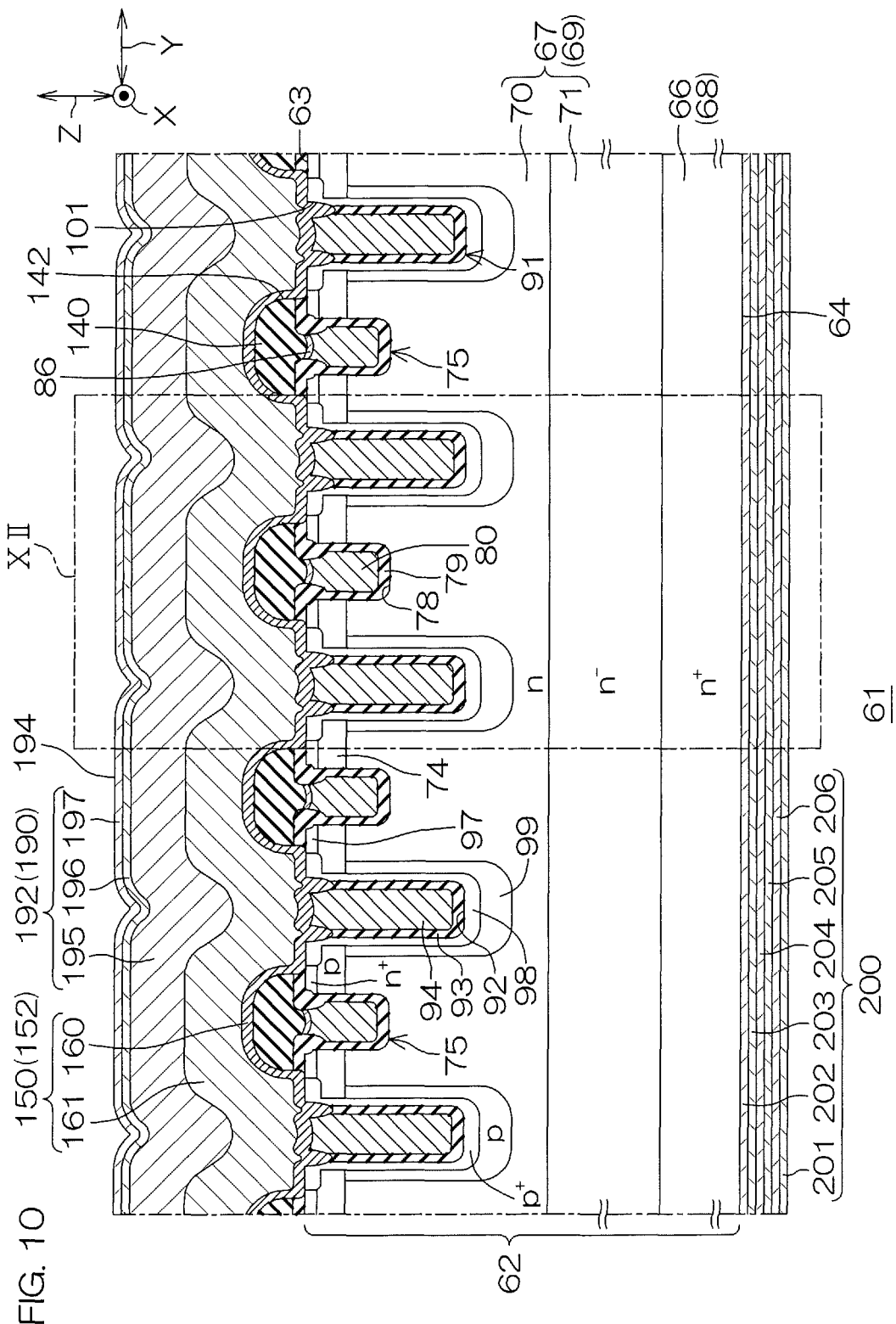
FIG. 10 is a sectional view taken along line X-X shown in FIG. 9.
Figure 11:
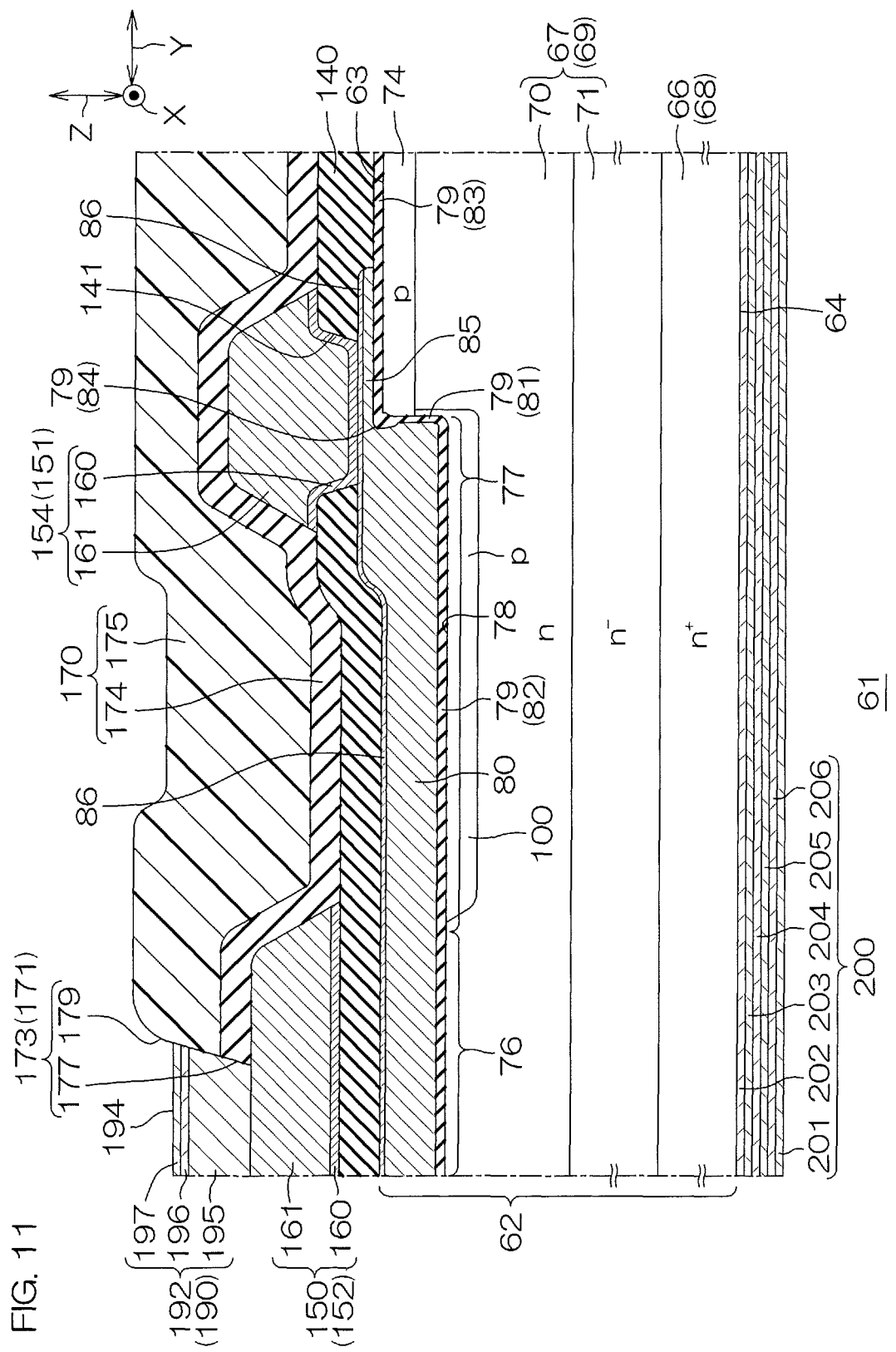
FIG. 11 is a sectional view taken along line XI-XI shown in FIG. 9.
Figure 12:
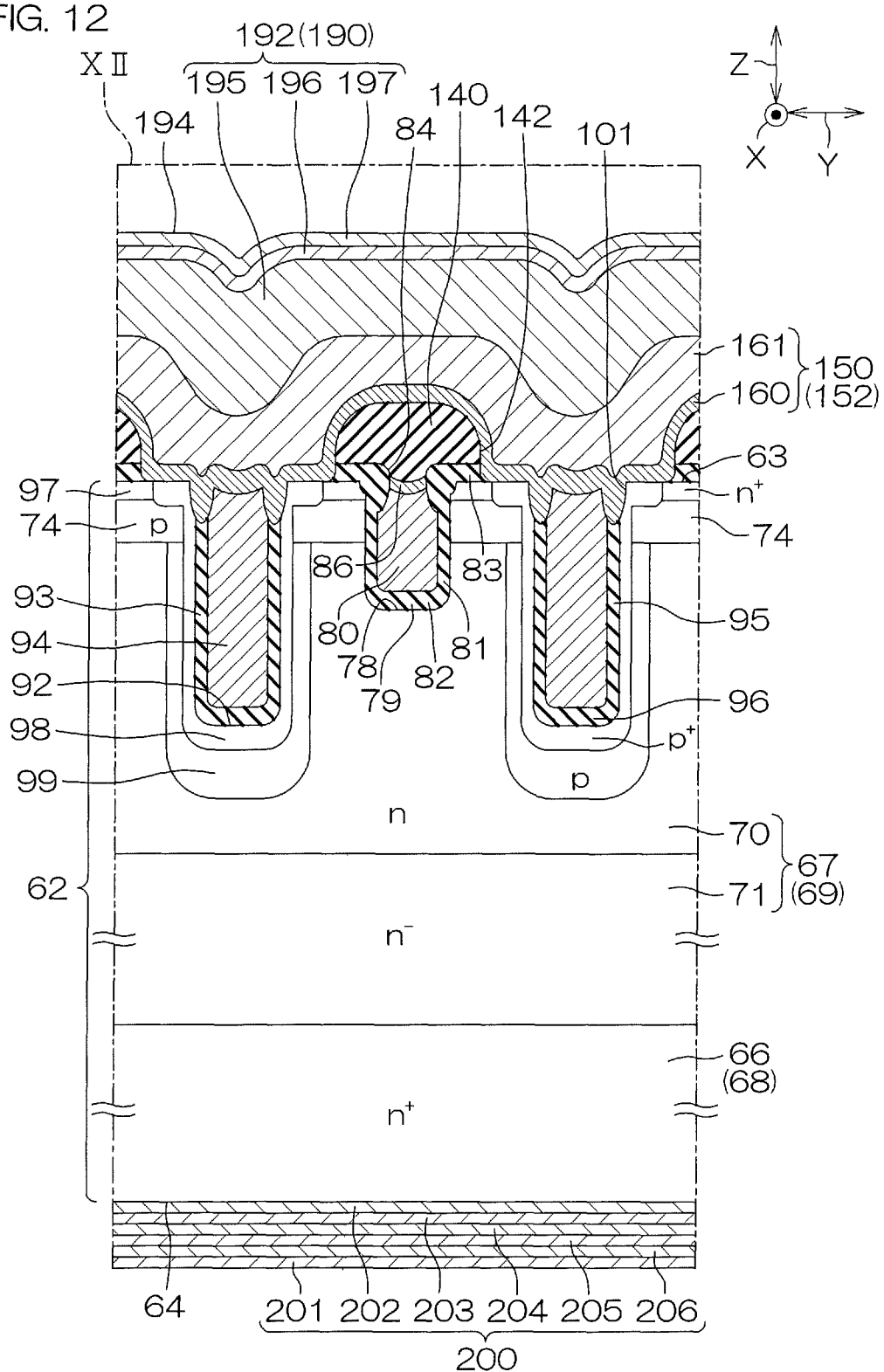
FIG. 12 is an enlarged view of a region XII shown in FIG. 10.

FIG. 9 is an enlarged plan view of an internal structure of a region IX shown in FIG. 8. FIG. 10 is a sectional view taken along line X-X shown in FIG. 9. FIG. 11 is a sectional view taken along line XI-XI shown in FIG. 9. FIG. 12 is an enlarged view of a region XII shown in FIG. 10.

Figure 13:
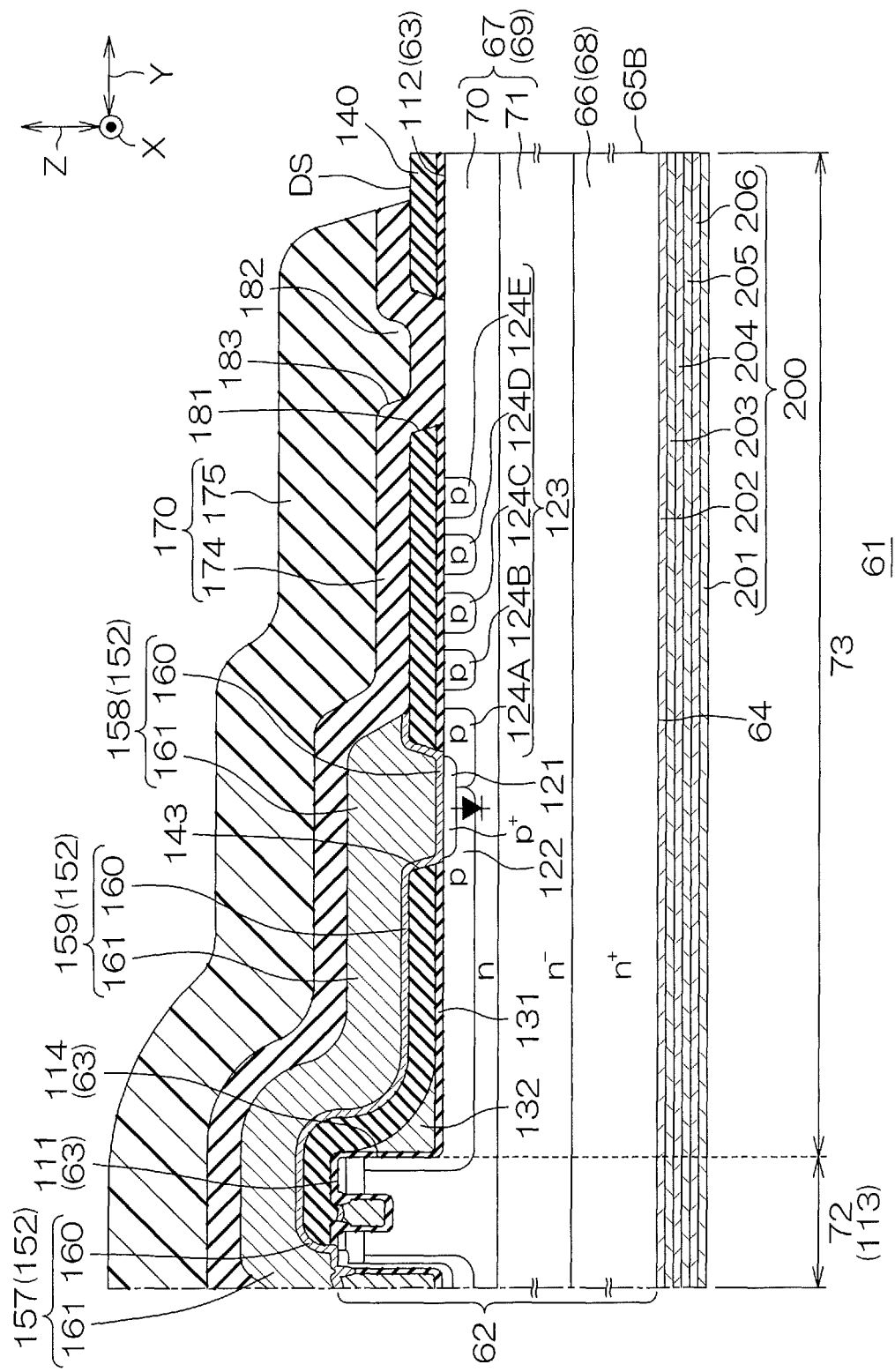
FIG. 13 is a sectional view taken along line XIII-XIII shown in FIG. 7.
Figure 14:
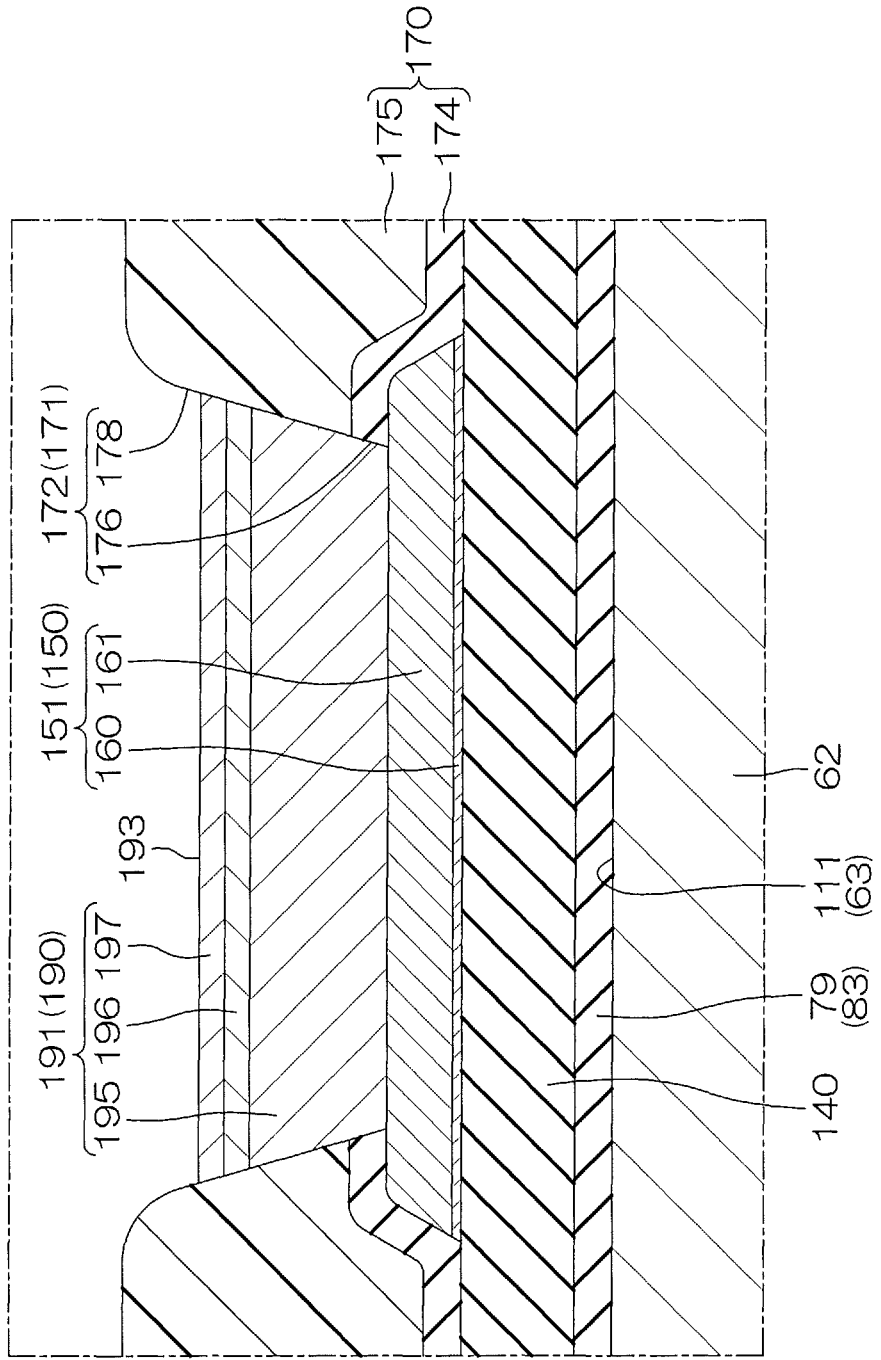
FIG. 14 is a sectional view of a gate pad electrode.
Figure 15:
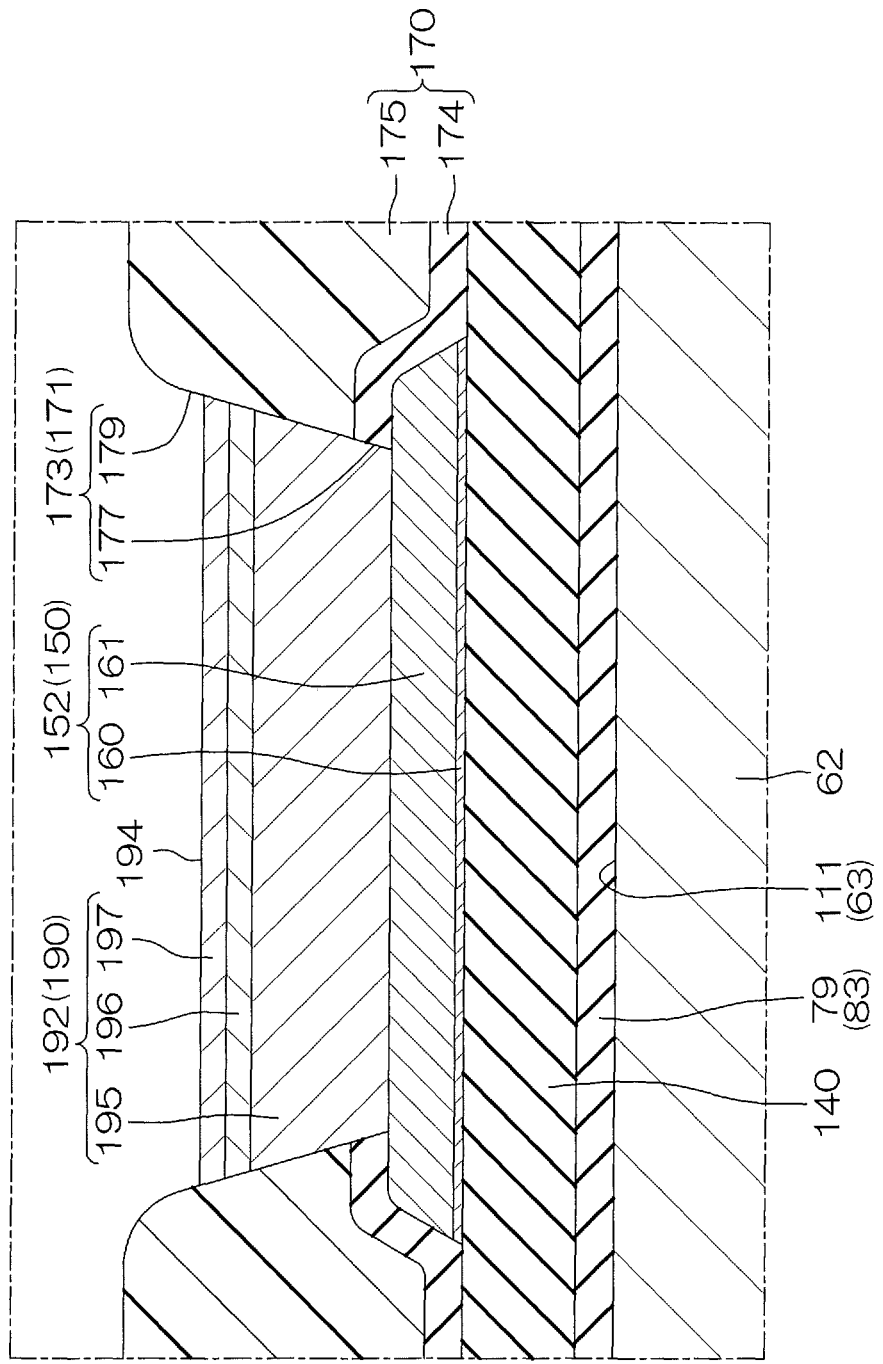
FIG. 15 is a sectional view of a source pad electrode.
Figure 16:
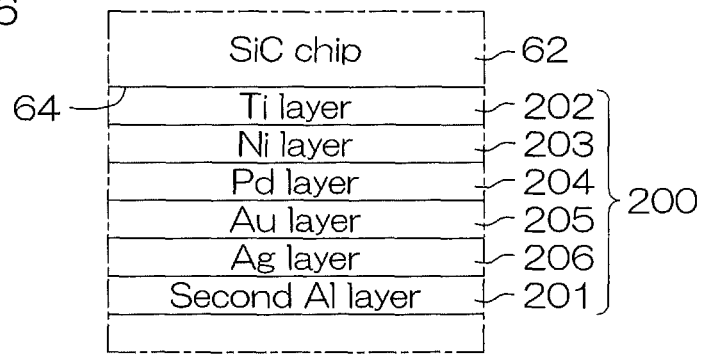
FIG. 16 is an illustrative sectional view of the second main surface electrode.

FIG. 13 is a sectional view taken along line XIII-XIII shown in FIG. 7. FIG. 14 is a sectional view of a gate pad electrode 191. FIG. 15 is a sectional view of a source pad electrode 192. FIG. 16 is an illustrative sectional view of the second main surface electrode 200. FIG. 14 and FIG. 15 are sectional views showing general structures of the gate pad electrode 191 and the source pad electrode 192 and do not show sections of specific locations.

Referring to FIG. 6 to FIG. 13, the SiC semiconductor device 61 includes an SiC chip 62. The SiC chip 62 includes an SiC monocrystal constituted of a hexagonal crystal. The SiC monocrystal constituted of the hexagonal crystal has a plurality of polytypes including a 2H (hexagonal)-SiC monocrystal, a 4H-SiC monocrystal, a 6H-SiC monocrystal, etc., in accordance with cycle of atomic arrangement. Although, with this embodiment, the SiC chip 62 is constituted of a 4H-SiC monocrystal, this does not exclude other polytypes.

The SiC chip 62 has a first main surface 63 at one side, a second main surface 64 at another side, and side surfaces 65A, 65B, 65C, and 65D connecting the first main surface 63 and the second main surface 64. The first main surface 63 and the second main surface 64 are formed to quadrilateral shapes (rectangular shapes in this embodiment) in a plan view as viewed in a normal direction Z thereto (hereinafter referred to simply as "plan view").

A thickness of the SiC chip 62 may be not less than 40 μm and not more than 300 μm. The thickness of the SiC chip 62 may be not less than 40 μm and not more than 100 μm, not less than 100 μm and not more than 150 μm, not less than 150 μm and not more than 200 μm, not less than 200 μm and not more than 250 μm, or not less than 250 μm and not more than 300 μm. The thickness of the SiC chip 62 is preferably not less than 60 μm and not more than 150 μm.

In this embodiment, the first main surface 63 and the second main surface 64 are arranged along c-planes of the SiC monocrystal. The first main surface 63 is arranged along a silicon plane ((0001) plane) of the SiC monocrystal. The first main surface 63 is a non-mounting surface. The second main surface 64 is arranged along a carbon plane ((000-1) plane) of the SiC monocrystal. The second main surface 64 is a mounting surface. The second main surface 64 may be a rough surface having either or both of grinding marks and annealing marks. An annealing mark is a laser irradiation mark. The second main surface 64 may be an ohmic surface having annealing marks.

The first main surface 63 and the second main surface 64 have an off angle inclined at an angle of not less than 0° and not more than 10° in an a-axis direction ([11-20] direction) with respect to the c-planes of the SiC monocrystal. The normal direction Z is inclined by just the off angle with respect to the c-axis ([0001] direction) of the SiC monocrystal.

The off angle may be not less than 0° and not more than 6°. The off angle may be not less than 0° and not more than 2°, not less than 2° and not more than 4°, or not less than 4° and not more than 6°. Preferably, the off angle exceeds 0° and is not more than 4.5°. The off angle may be not less than 3° and not more than 4.5°. In this case, the off angle is preferably not less than 3° and not more than 3.5° or not less than 3.5° and not more than 4°. The off angle may be not less than 1.5° and not more than 3°. In this case, the off angle is preferably not less than 1.5° and not more than 2° or not less than 2° and not more than 2.5°.

The side surfaces 65A to 65D include the first side surface 65A, the second side surface 65B, the third side surface 65C, and the fourth side surface 65D. The first side surface 65A and the second side surface 65B extend along a first direction X and oppose each other in a second direction Y intersecting the first direction X. The first side surface 65A and the second side surface 65B form short sides of the SiC chip 62 in plan view. The third side surface 65C and the fourth side surface 65D extend along the second direction Y and oppose each other in the first direction X. The third side surface 65C and the fourth side surface 65D form long sides of the SiC chip 62 in plan view. More specifically, the second direction Y is orthogonal to the first direction X.

In this embodiment, the first direction X is an m-axis direction ([1-100] direction) of the SiC monocrystal. The second direction Y is the a-axis direction ([11-20] direction) of the SiC monocrystal. That is, the first side surface 65A and the second side surface 65B are formed by a-planes of the SiC monocrystal and oppose each other in the a-axis direction of the SiC monocrystal. Also, the third side surface 65C and the fourth side surface 65D are formed by m-planes of the SiC monocrystal and oppose each other in the m-axis direction of the SiC monocrystal.

The first side surface 65A and the second side surface 65B may instead form inclined surfaces that, when the normal direction Z is taken as a basis, are inclined toward a c-axis direction ([0001] direction) of the SiC monocrystal with respect to the normal direction Z. The first side surface 65A and the second side surface 65B may be inclined at an angle in accordance with the off angle with respect to the normal direction Z when the normal direction Z is set to 0°. The angle in accordance with the off angle may be equal to the off angle or may be an angle that exceeds 0° and is less than the off angle.

The third side surface 65C and the fourth side surface 65D extend as planes along the normal direction Z. More specifically, the third side surface 65C and the fourth side surface 65D are formed substantially perpendicular to the first main surface 63 and the second main surface 64.

The side surfaces 65A to 65D may be constituted of cleavage surfaces or ground surfaces. Lengths of the side surfaces 65A to 65D may be not less than 0.1 mm and not more than 10 mm. Preferably, the lengths of the side surfaces 65A to 65D are not less than 0.5 mm and not more than 2.5 mm.

In this embodiment, the SiC chip 62 has a laminated structure that includes an n$^+$-type SiC semiconductor substrate 66 and an n-type SiC epitaxial layer 67. The SiC semiconductor substrate 66 is formed as a drain region 68. The SiC epitaxial layer 67 is formed as a drift region 69.

The second main surface 64 of the SiC chip 62 is formed by the SiC semiconductor substrate 66. The first main surface 63 of the SiC chip 62 is formed by the SiC epitaxial layer 67. The side surfaces 65A to 65D of the SiC chip 62 are formed by the SiC semiconductor substrate 66 and the SiC epitaxial layer 67.

A thickness of the SiC semiconductor substrate 66 may be not less than 40 µm and not more than 250 µm. The thickness of the SiC semiconductor substrate 66 may be not less than 40 µm and not more than 100 µm, not less than 100 µm and not more than 150 µm, not less than 150 µm and not more than 200 µm, or not less than 200 µm and not more than 250 µm. The thickness of the SiC semiconductor substrate 66 is preferably not less than 40 µm and not more than 150 µm. By thinning the SiC semiconductor substrate 66, a resistance value of the SiC semiconductor substrate 66 can be reduced.

A thickness of the SiC epitaxial layer 67 may be not less than 1 µm and not more than 50 µm. The thickness of the SiC epitaxial layer 67 may be not less than 1 µm and not more than 5 µm, not less than 5 µm and not more than 10 µm, not less than 10 µm and not more than 15 µm, not less than 15 µm and not more than 20 µm, not less than 20 µm and not more than 30 µm, not less than 30 µm and not more than 40 µm, or not less than 40 µm and not more than 50 µm. The thickness of the SiC epitaxial layer 67 is preferably not less than 5 µm and not more than 15 µm.

An n-type impurity concentration of the SiC epitaxial layer 67 is less than an n-type impurity concentration of the SiC semiconductor substrate 66. The n-type impurity concentration of the SiC semiconductor substrate 66 may be not less than $1.0\times10^{18}$ cm$^{-3}$ and not more than $1.0\times10^{21}$ cm$^{-3}$. The n-type impurity concentration of the SiC epitaxial layer 67 may be not less than $1.0\times10^{15}$ cm$^{-3}$ and not more than $1.0\times10^{18}$ cm$^{-3}$.

In this embodiment, the SiC epitaxial layer 67 has a plurality of regions having different n-type impurity concentrations along the normal direction Z. More specifically, the SiC epitaxial layer 67 includes a high concentration region 70 with a comparatively high n-type impurity concentration and a low concentration region 71 with a low n-type impurity concentration with respect to the high concentration region 70.

The high concentration region 70 is formed in a region at the first main surface 63 side. The low concentration region 71 is formed in a region at the second main surface 64 side with respect to the high concentration region 70. A thickness of the high concentration region 70 is less than a thickness of the low concentration region 71. The thickness of the high concentration region 70 is less than one-half the total thickness of the SiC epitaxial layer 67.

A peak value of the n-type impurity concentration of the high concentration region 70 may be not less than $1.0\times10^{16}$ cm$^{-3}$ and not more than $1.0\times10^{18}$ cm$^{-3}$. A peak value of the n-type impurity concentration of the low concentration region 71 may be not less than $1.0\times10^{15}$ cm$^{-3}$ and not more than $1.0\times10^{16}$ cm$^{-3}$.

The SiC chip 62 includes an active region 72 and an outer region 73. The active region 72 is a region in which a MISFET (metal insulator semiconductor field effect transistor) is formed as an example of a functional device (transistor).

In plan view, the active region 72 is formed in a central portion of the SiC chip 62 at intervals inward from the side surfaces 65A to 65D. In plan view, the active region 72 is formed to a quadrilateral shape (rectangular shape in this embodiment) having four sides parallel to the side surfaces 65A to 65D.

The outer region 73 is a region at an outer side of the active region 72. The outer region 73 is formed in a region between the side surfaces 65A to 65D and peripheral edges of the active region 72. The outer region 73 is formed to an annular shape (more specifically, an endless shape) surrounding the active region 72 in plan view.

The SiC semiconductor device 61 includes a p-type body region 74 formed in a surface layer portion of the first main surface 63 in the active region 72. The body region 74 defines the active region 72. A peak value of a p-type impurity concentration of the body region 74 may be not less than $1.0\times10^{17}$ cm$^{-3}$ and not more than $1.0\times10^{19}$ cm$^{-3}$. A peak value of the p-type impurity concentration of the body region 74 is preferably not less than $1.0\times10^{18}$ cm$^{-3}$.

Referring to FIG. 9 to FIG. 12, the SiC semiconductor device 61 includes a plurality of trench gate structures 75 formed in the first main surface 63 in the active region 72. The plurality of trench gate structures 75 are respectively formed as bands extending along the first direction X and are formed at intervals in the second direction Y. The plurality of trench gate structures 75 are formed in stripes as a whole in plan view.

In this embodiment, the plurality of trench gate structures 75 extend as bands from a peripheral edge portion at one side (the third side surface 65C side) to a peripheral edge portion at another side (the fourth side surface 65D side) of the active region 72. The plurality of trench gate structures 75 cross an intermediate portion of the active region 72 between the peripheral edge portion at one side and the peripheral edge portion at the other side.

A length of each trench gate structure 75 may be not less than 1 mm and not more than 10 mm. The length of each trench gate structure 75 may be not less than 1 mm and not more than 2 mm, not less than 2 mm and not more than 4 mm, not less than 4 mm and not more than 6 mm, not less than 6 mm and not more than 8 mm, or not less than 8 mm and not more than 10 mm. The length of each trench gate structure 75 is preferably not less than 2 mm and not more than 6 mm. A total extension per unit area of a single trench gate structure 75 may be not less than 0.5 µm/µm$^2$ and not more than 0.75 µm/µm$^2$.

Each trench gate structure 75 includes an active portion 76 and a contact portion 77. The active portion 76 is a portion oriented along a channel of the MISFET. The contact portion 77 is a portion outside the channel of the MISFET. The contact portion 77 is an end portion of the trench gate structure 75 and a main purpose thereof is external connection.

Each trench gate structure 75 includes a gate trench 78, a gate insulating layer 79, and a gate electrode 80. In FIG. 9, the gate insulating layers 79 and the gate electrodes 80 are shown with hatching.

Each gate trench 78 is formed in the SiC epitaxial layer 67 such as to penetrate through the body region 74. The gate trench 78 includes side walls and a bottom wall. The side walls that form long sides of the gate trench 78 are formed by a-planes of the SiC monocrystal. The side walls that form short sides of the gate trench 78 are formed by m-planes of the SiC monocrystal.

The side walls of the gate trench 78 may extend along the normal direction Z. Angles that the side walls of the gate trench 78 form with respect to the first main surface 63 inside the SiC chip 62 may be not less than 90° and be not more than 95° (for example, not less than 91° and not more than 93°). The side walls of the gate trench 78 may be formed substantially perpendicular to the first main surface 63. The gate trench 78 may be formed to a tapered shape with which an opening area at the bottom wall side is less than an opening area at an opening side in sectional view.

The bottom wall of the gate trench 78 is positioned in the high concentration region 70. The bottom wall of the gate trench 78 is arranged along a c-plane of the SiC monocrystal. The bottom wall of the gate trench 78 has an off angle inclined in the [11-20] direction with respect to a (0001) plane of the SiC monocrystal. The bottom wall of the gate trench 78 may be formed parallel to the first main surface 63. The bottom wall of the gate trench 78 may be formed to a shape curved toward the second main surface 64.

A depth in the normal direction Z of the gate trench 78 may be not less than 0.5 µm and not more than 3.0 µm. The depth of the gate trench 78 may be not less than 0.5 µm and not more than 1.0 µm, not less than 1.0 µm and not more than 1.5 µm, not less than 1.5 µm and not more than 2.0 µm, not less than 2.0 µm and not more than 2.5 µm, or not less than 2.5 µm and not more than 3.0 µm.

A width along the second direction Y of the gate trench 78 may be not less than 0.1 µm and not more than 2 µm. The width of the gate trench 78 may be not less than 0.1 µm and not more than 0.5 µm, not less than 0.5 µm and not more than 1.0 µm, not less than 1.0 µm and not more than 1.5 µm, or not less than 1.5 µm and not more than 2 µm.

An opening edge portion of the gate trench 78 includes an inclined portion that is inclined downwardly from the first main surface 63 toward an inner side of the gate trench 78. The opening edge portion of the gate trench 78 is a portion connecting the first main surface 63 and the side walls of the gate trench 78.

The inclined portion of the gate trench 78 is formed to a shape curved toward an inner side of the SiC chip 62. The inclined portion of the gate trench 78 may instead be formed to a shape curved toward the inner side of the gate trench 78. The inclined portion of the gate trench 78 relaxes concentration of electric field with respect to the opening edge portion of the gate trench 78.

The gate insulating layer 79 includes at least one type of material among silicon oxide, silicon nitride, aluminum oxide, zirconium oxide, and tantalum oxide. The gate insulating layer 79 may have a laminated structure that includes a silicon nitride layer and a silicon oxide layer. The gate insulating layer 79 may have a single layer structure constituted of a silicon oxide layer or a silicon nitride layer. In this embodiment, the gate insulating layer 79 has a single layer structure constituted of a silicon oxide layer.

The gate insulating layer 79 is formed as a film along the inner walls of each gate trench 78 and demarcates a recess space inside the gate trench 78. The gate insulating layer 79 includes a first region 81, a second region 82, and a third region 83.

The first region 81 is formed along the side walls of the gate trench 78. The second region 82 is formed along the bottom wall of the gate trench 78. The third region 83 is formed along the first main surface 63.

A thickness of the first region 81 is less than a thickness of the second region 82 and a thickness of the third region 83. The thickness of the first region 81 may be not less than 0.01 µm and not more than 0.2 µm. The thickness of the second region 82 may be not less than 0.05 µm and not more than 0.5 µm. The thickness of the third region 83 may be not less than 0.05 µm and not more than 0.5 µm.

The gate insulating layer 79 includes a bulging portion 84 bulging toward an interior of the gate trench 78 at the opening edge portion. The bulging portion 84 is formed at a corner portion connecting the first region 81 and the third region 83 of the gate insulating layer 79. The bulging portion 84 is formed to a shape curved toward the inner side of the gate trench 78. The bulging portion 84 narrows an opening of the gate trench 78 at the opening edge portion. A gate insulating layer 79 not having the bulging portion 84 may be formed instead. A gate insulating layer 79 having a uniform thickness may be formed instead.

Each gate electrode 80 is embedded in the gate trench 78 across the gate insulating layer 79. More specifically, the gate electrode 80 is embedded in the recess space demarcated by the gate insulating layer 79 in the gate trench 78.

The gate electrode 80 has an upper end portion positioned at the opening side of the gate trench 78. The upper end portion of the gate electrode 80 is formed to a curved shape recessed toward the bottom wall of the gate trench 78. The upper end portion of the gate electrode 80 has a constricted portion that is constricted along the bulging portion 84 of the gate insulating layer 79.

The gate electrode 80 includes a p-type polysilicon doped with a p-type impurity. The p-type impurity of the gate electrode 80 may include at least one type of material among boron, aluminum, indium, and gallium.

A p-type impurity concentration of the gate electrode 80 exceeds the p-type impurity concentration of the body region 74. The p-type impurity concentration of the gate electrode 80 may be not less than $1.0 \times 10^{13}$ cm$^{-3}$ and not more than $1.0 \times 10^{22}$ cm$^{-3}$. A sheet resistance of the gate electrode 80 may be not less than 10Ω/☐ and not more than 500Ω/☐ (approximately 200Ω/☐ in this embodiment). A thickness of the gate electrode 80 may be not less than 0.5 µm and not more than 3 µm.

Referring to FIG. 9 and FIG. 11, the SiC semiconductor device 61 includes a gate wiring 85 formed on the first main surface 63 in the active region 72. In FIG. 9, the gate wiring 85 is shown with hatching. More specifically, the gate wiring 85 is formed on the third regions 83 of the gate insulating layers 79. The gate wiring 85 is formed along the first side surface 65A, the third side surface 65C, and the fourth side surface 65D in the active region 72 and demarcates, from three directions, a region in which the plurality of trench gate structures 75 are formed.

The gate wiring 85 is connected to the gate electrode 80 exposed from the contact portion 77 of each trench gate structure 75. In this embodiment, the gate wiring 85 is formed by lead-out portions of the gate electrodes 80 that are led out from the respective gate trenches 78 onto the first main surface 63. An upper end portion of the gate wiring 85 is connected to the upper end portions of the gate electrodes 80.

The SiC semiconductor device 61 includes a low resistance layer 86 that covers the gate electrodes 80. The low resistance layer 86 covers the upper end portions of the gate electrodes 80 inside the gate trenches 78. The low resistance layer 86 forms a portion of each trench gate structure 75.

The low resistance layer 86 includes a conductive material having a sheet resistance less than the sheet resistance of the gate electrodes 80. The sheet resistance of the low resistance layer 86 may be not less than 0.01Ω/□ and not more than 10 Ω/□.

More specifically, the low resistance layer 86 includes a polycide layer. The polycide layer is formed by portions forming surface layer portions of the gate electrodes 80 being silicided by a metal material. More specifically, the polycide layer is constituted of a p-type polycide layer that includes the p-type impurity doped in the gate electrodes 80 (p-type polysilicon). The polycide layer preferably has a specific resistance of not less than 10 μΩ·cm and not more than 110 μΩ·cm.

A sheet resistance inside the gate trenches 78 embedded with the gate electrodes 80 and the low resistance layer 86 is not more than the sheet resistance of the gate electrodes 80 alone. The sheet resistance inside the gate trenches 78 is preferably not more than a sheet resistance of an n-type polysilicon doped with an n-type impurity.

The sheet resistance inside the gate trenches 78 is approximated by the sheet resistance of the low resistance layer 86. That is, the sheet resistance inside the gate trenches 78 may be not less than 0.01Ω/□ and not more than 10Ω/□. The sheet resistance inside the gate trenches 78 is preferably less than 10 Ω/□.

The low resistance layer 86 may include at least one type of material among TiSi, TiSi$_2$, NiSi, CoSi, CoSi$_2$, MoSi$_2$, and WSi$_2$. Among these types of materials, NiSi, CoSi$_2$, and TiSi$_2$ are especially suitable as the polycide layer forming the low resistance layer 86 due to being comparatively low in specific resistance value and temperature dependence. The low resistance layer 86 is most preferably constituted of CoSi$_2$ that has a property being low in diffusion to other regions.

The low resistance layer 86 includes contact portions in contact with the gate insulating layers 79. More specifically, the contact portions of the low resistance layer 86 contact the third regions 83 (bulging portions 84) of the gate insulating layers 79. The contact portions of the low resistance layer 86 are formed in regions at the first main surface 63 side with respect to a bottom portion of the body region 74. More specifically, the contact portions of the low resistance layer 86 are formed in regions at the first main surface 63 side with respect to bottom portions of source regions 97 to be described later. The low resistance layer 86 does not oppose the body region 74 across the gate insulating layers 79.

Forming of a current path between the low resistance layer 86 and the body region 74 can thereby be suppressed. In particular, a design where the contact portions of the low resistance layer 86 are connected to the comparatively thick corner portions of the gate insulating layers 79 is effective for reducing a risk of forming a current path.

A thickness in the normal direction Z of the low resistance layer 86 is preferably less than the thickness of the gate electrodes 80. The thickness of the low resistance layer 86 may be not less than 0.01 μm and not more than 3 μm.

The low resistance layer 86 also covers the upper end portion of the gate wiring 85. A portion of the low resistance layer 86 that covers the upper end portion of the gate wiring 85 is formed integral to portions of the low resistance layer 86 covering the upper end portions of the gate electrodes 80. The low resistance layer 86 thereby covers entire areas of the gate electrodes 80 and an entire area of the gate wiring 85.

By embedding a p-type polysilicon, which has a work function differing from an n-type polysilicon, in the gate trenches 78, a gate threshold voltage Vth can be increased by approximately 1 V. However, a p-type polysilicon has a sheet resistance of several tens of times (approximately 20 times) higher than a sheet resistance of an n-type polysilicon. Therefore, if a p-type polysilicon is adopted as a material of the gate electrodes 80, energy loss increases in accompaniment with increase in parasitic resistance inside the gate trenches 78 (referred to hereinafter simply as "gate resistance").

Thus, with the SiC semiconductor device 61, the low resistance layer 86 (p-type polycide) is formed on the gate electrodes 80 (p-type polysilicon). By the low resistance layer 86, the sheet resistance inside the gate trenches 78 can be reduced while allowing increase in the gate threshold voltage Vth (for example, increasing it by approximately 1 V).

For example, with the structure having the low resistance layer 86, the sheet resistance can be decreased to not more than 1/100th in comparison to a case of not having the low resistance layer 86. Also, with the structure having the low resistance layer 86, the sheet resistance can be decreased to not more than 1/5th in comparison to the gate electrodes 80 that include the n-type polysilicon.

The gate resistance can thereby be reduced and therefore, a current can be diffused efficiently along the trench gate structures 75. That is, the low resistance layer 86 is formed as a current diffusion layer that diffuses the current inside the gate trenches 78. In particular, although time is required for transmission of current in a case where the gate trenches 78 have a length of the millimeter order (a length not less than 1 mm), switching delay can be suppressed appropriately by the low resistance layer 86.

Also, with the structure having the low resistance layer 86, the p-type impurity concentration of the body region 74 does not have to be increased to increase the gate threshold voltage Vth. The gate threshold voltage Vth can thus be increased appropriately while suppressing increase in channel resistance.

The SiC semiconductor device 61 include a plurality of trench source structures 91 respectively formed in regions between mutually adjacent ones of the plurality of trench gate structures 75. The plurality of trench source structures 91 are formed at intervals in the second direction Y (a-axis direction of the SiC monocrystal) in a mode of sandwiching a single trench gate structure 75.

The plurality of trench source structures 91 are each formed as a band extending along the first direction X (m-axis direction of the SiC monocrystal). The plurality of trench source structures 91 are formed as stripes as a whole in plan view. A pitch in the second direction Y between central portions of mutually adjacent trench source structures 91 may be not less than 1.5 µm and not more than 3 µm.

Each trench source structure 91 includes a source trench 92, a source insulating layer 93, and a source electrode 94. In FIG. 9, the source insulating layers 93 and the source electrodes 94 are shown with hatching.

Each source trench 92 is formed in the SiC epitaxial layer 67 such as to penetrate through the body region 74. The source trench 92 includes side walls and a bottom wall. The side walls that form long sides of the source trench 92 are formed by a-planes of the SiC monocrystal. The side walls that form short sides of the source trench 92 are formed by m-planes of the SiC monocrystal.

The side walls of the source trench 92 may extend along the normal direction Z. Angles that the side walls of the source trench 92 form with respect to the first main surface 63 inside the SiC chip 62 may be not less than 90° and not more than 95° (for example, not less than 91° and not more than 93°). The side walls of the source trench 92 may be formed substantially perpendicular to the first main surface 63. The source trench 92 may be formed to a tapered shape with an opening area at the bottom wall side being smaller than an opening area at an opening side in sectional view.

The bottom walls of the source trenches 92 are positioned in the high concentration region 70. The bottom walls of the source trenches 92 are positioned in regions at the second main surface 64 side with respect to the bottom walls of the gate trenches 78. The bottom walls of the source trenches 92 are positioned in regions between the bottom walls of the gate trenches 78 and the low concentration region 71 in regard to the normal direction Z.

The bottom walls of the source trenches 92 are arranged along a c-plane of the SiC monocrystal. The bottom walls of the source trench 92 have an off angle inclined in the [11-20] direction with respect to the (0001) plane of the SiC monocrystal. The bottom walls of the source trenches 92 may be formed parallel to the first main surface 63. The bottom walls of the source trenches 92 may each be formed to a shape curved toward the second main surface 64.

A depth of the source trenches 92 exceeds the depth of the gate trenches 78. Under a condition that the source trenches 92 are positioned inside the high concentration region 70, a ratio of the depth of the source trenches 92 with respect to the depth of the gate trenches 78 may be not less than 1.5. The ratio of the depth of the source trenches 92 with respect to the depth of the gate trenches 78 is preferably not less than 2. The depth of the source trenches 92 may be equal to the depth of the gate trenches 78. The depth in the normal direction Z of the source trenches 92 may be not less than 0.5 µm and not more than 10 µm (for example, approximately 2 µm).

A width along the second direction Y of the source trenches 92 may exceed the width along the second direction Y of the gate trenches 78 or may be less than the width along the second direction Y of the gate trenches 78. The width along the second direction Y of the source trenches 92 is preferably equal to the width along the second direction Y of the gate trenches 78. The width along the second direction Y of the source trenches 92 may be not less than 0.1 µm and not more than 2 µm (for example, approximately 0.5 µm).

Each source insulating layer 93 includes at least one type of material among silicon oxide, silicon nitride, aluminum oxide, zirconium oxide, and tantalum oxide. The source insulating layer 93 may have a laminated structure that includes a silicon nitride layer and a silicon oxide layer. The source insulating layer 93 may have a single layer structure constituted of a silicon oxide layer or a silicon nitride layer. In this embodiment, the source insulating layer 93 has a single layer structure constituted of a silicon oxide layer.

The source insulating layer 93 is formed as a film along the inner walls of the source trench 92 and demarcates a recess space inside the source trench 92. The source insulating layer 93 includes a first region 95 and a second region 96.

The first region 95 is formed along the side walls of the source trench 92. The second region 96 is formed along the bottom wall of the source trench 92. A thickness of the first region 95 is less than a thickness of the second region 96. The thickness of the first region 95 may be not less than 0.01 µm and not more than 0.2 µm. The thickness of the second region 96 may be not less than 0.05 µm and not more than 0.5 µm.

The thickness of the first regions 95 may be substantially equal to the thickness of the first regions 95 of the gate insulating layers 79. The thickness of the second regions 96 may be substantially equal to the thickness of the second regions 96 of the gate insulating layers 79. Source insulating layers 93 each having a uniform thickness may be formed instead.

Each source electrode 94 is embedded in the source trench 92 across the source insulating layer 93. More specifically, the source electrode 94 is embedded in the recess space demarcated by the source insulating layer 93 in the source trench 92.

The source electrode 94 has an upper end portion positioned at an opening side of the source trench 92. The upper end portion of the source electrode 94 is formed at the bottom wall side of the source trench 92 with respect to the first main surface 63. The upper end portion of the source electrode 94 may be positioned higher than the first main surface 63.

The upper end portion of the source electrode 94 is formed to a curved shape recessed toward the bottom wall of the source trench 92. The upper end portion of the source electrode 94 may be formed parallel to the first main surface 63. A thickness of the source electrode 94 in the normal direction Z may be not less than 0.5 µm and not more than 10 µm (for example, approximately 1 µm).

The source electrode 94 preferably includes a polysilicon having properties close to SiC in terms of material properties. Stress generated inside the SiC chip 62 can thereby be reduced. In this embodiment, the source electrode 94 includes a p-type polysilicon doped with a p-type impurity. In this case, the source electrodes 94 can be formed at the same time as the gate electrodes 80.

A p-type impurity concentration of the source electrodes 94 exceeds the p-type impurity concentration of the body region 74. The p-type impurity concentration of the source electrodes 94 may be equal to the p-type impurity concentration of the gate electrodes 80. The p-type impurity concentration of the source electrodes 94 may be not less than $1.0 \times 10^{18}$ cm$^{-3}$ and not more than $1.0 \times 10^{22}$ cm$^{-3}$.

The p-type impurity of the source electrodes 94 may include at least one type of material among boron, aluminum, indium, and gallium. A sheet resistance of the source electrodes 94 may be not less than 10Ω/□ and not more than 500Ω/□ (approximately 200Ω/□ in this embodiment). The sheet resistance of the source electrodes 94 may be substantially equal to the sheet resistance of the gate electrodes 80.

In place of or in addition to the p-type polysilicon, the source electrodes 94 may include at least one type of material among an n-type polysilicon, tungsten, aluminum, copper, an aluminum alloy, and a copper alloy.

The SiC semiconductor device 61 includes the n$^+$-type source regions 97 formed in regions of a surface layer portion of the body region 74 along the side walls of the gate trenches 78. A peak value of an n-type impurity concentration of the source regions 97 may be not less than $1.0 \times 10^{18}$ cm$^{-3}$ and not more than $1.0 \times 10^{21}$ cm$^{-3}$. The peak value of the n-type impurity concentration of the source regions 97 is preferably not less than $1.0 \times 10^{20}$ cm$^{-3}$.

A plurality of the source regions 97 are formed along the side wall at one side and the side wall at another side of each gate trench 78. The plurality of source regions 97 are respectively formed as bands extending along the first direction X. The plurality of source regions 97 are formed as stripes as a whole in plan view. The respective source regions 97 are exposed from the side walls of the gate trenches 78 and the side walls of the respective source trenches 92.

Portions of the source regions 97 that are oriented along the side walls of the gate trenches 78 define the channels of the MISFET with the high concentration region 70. ON/OFF of the channels is controlled by the gate electrodes 80.

The SiC semiconductor device 61 includes p$^+$-type contact regions 98 formed in regions of the surface layer portion of the first main surface 63 along the respective source trenches 92. A peak value of a p-type impurity concentration of each contact region 98 exceeds the p-type impurity concentration of the body region 74. The peak value of the p-type impurity concentration of each contact region 98 may be not less than $1.0 \times 10^{18}$ cm$^{-3}$ and not more than $1.0 \times 10^{21}$ cm$^{-3}$.

In this embodiment, a plurality of the contact regions 98 are formed per single source trench 92. The plurality of contact regions 98 are formed at intervals along the corresponding source trench 92. The plurality of contact regions 98 are formed at intervals from the gate trenches 78.

Each contact region 98 covers the side walls and the bottom wall of the corresponding source trench 92. A bottom portion of each contact region 98 may be formed parallel to the bottom wall of the corresponding source trench 92.

Portions of each contact region 98 that cover the side walls of the source trench 92 are formed in regions at the first main surface 63 side with respect to the bottom portion of the body region 74. The portions of each contact region 98 that cover the side walls of the source trench 92 are led out toward mutually adjacent gate trenches 78. The portions of each contact region 98 that cover the side walls of the source trench 92 may extend to intermediate regions between the gate trenches 78 and the source trench 92. Each contact region 98 is electrically connected to the body region 74 and the source region 97.

The SiC semiconductor device 61 includes deep well regions 99 formed in the surface layer portion of the first main surface 63 in the active region 72. The deep well regions 99 are formed in plurality in a relationship of one-to-one correspondence with respect to the plurality of source trenches 92. Each deep well region 99 is formed as a band extending along the corresponding source trench 92 in plan view.

Each deep well region 99 is formed in the high concentration region 70. Each deep well region 99 covers each source trench 92 across each contact region 98. Each deep well region 99 covers the side walls and the bottom wall of each trench 92 across the corresponding contact regions 98.

Each deep well region 99 is continuous to the body region 74 in the surface layer portion of the first main surface 3.

Each deep well region 99 has a bottom portion positioned at the second main surface 64 side with respect to the bottom wall of the gate trench 78. The bottom portion of each deep well region 99 may be formed parallel to the bottom wall of each source trench 92. The plurality of deep well regions 99 are preferably formed to be of constant depth.

A peak value of a p-type impurity concentration of each deep well region 99 may be less than the peak value of the p-type impurity concentration of the contact regions 98. The peak value of the p-type impurity concentration of each deep well region 99 may be equal to the peak value of the p-type impurity concentration of the body region 74. The peak value of the p-type impurity concentration of each deep well region may exceed the peak value of the p-type impurity concentration of the body region 74 or may be less than the peak value of the p-type impurity concentration of the body region 74.

The peak value of the p-type impurity concentration of each deep well region 99 may be not less than $1.0 \times 10^{17}$ cm$^{-3}$ and not more than $1.0 \times 10^{19}$ cm$^{-3}$. The peak value of the p-type impurity concentration of each deep well region 99 is preferably not less than $1.0 \times 10^{18}$ cm$^{-3}$.

Each deep well region 99 forms a pn junction portion with the high concentration region 70. From the pn junction portions, depletion layers spread toward the gate trenches 78. The depletion layers may overlap with the bottom walls of the gate trenches 78.

The SiC semiconductor device 61 includes p-type peripheral edge well regions 100 formed in surface layer portions of the first main surface 63 at peripheral edge portions of the active region 72. The peripheral edge well regions 100 cover the contact portions 77 and expose the active portions 76 of the trench gate structures 75.

The peripheral edge well regions 100 cover the side walls and the bottom walls of the gate trenches 78 at the corresponding contact portions 77. Bottom portions of the peripheral edge well regions 100 are positioned at the first main surface 63 side with respect to bottom walls of the deep well regions 99. The respective peripheral edge well regions 100 are electrically connected to the body region 74 and the deep well regions 99 in the surface layer portions of the first main surface 63.

A p-type impurity concentration of the peripheral edge well regions 100 may be substantially equal to the p-type impurity concentration of the p-type impurity concentration of the deep well regions 99. A peak value of the p-type impurity concentration of the peripheral edge well regions 100 may be not less than $1.0 \times 10^{17}$ cm$^{-3}$ and not more than $1.0 \times 10^{19}$ cm$^{-3}$. The peak value of the p-type impurity concentration of the peripheral edge well regions 100 is preferably not less than $1.0 \times 10^{18}$ cm$^{-3}$.

With an SiC semiconductor device that includes just a pn junction diode, due to the structure of not including trenches, a problem of concentration of electric field inside the SiC chip 62 does not occur frequently. The respective deep well regions 99 make the trench gate type MISFET approach the structure of a pn junction diode.

The electric field inside the SiC chip 62 can thereby be relaxed in the trench gate type MISFET. Narrowing a pitch between mutually adjacent ones of the plurality of deep well regions 99 is thus effective in terms of relaxing the concentration of electric field.

Also, with the deep well regions 99 having the bottom portions at the second main surface 64 side with respect to the bottom walls of the gate trenches 78, concentration of electric field with respect to the gate trenches 78 can be relaxed appropriately by the depletion layers. The plurality of deep well regions 99 are preferably formed to be of constant depth. A withstand voltage (for example, an electrostatic breakdown strength) of the SiC chip 62 can thereby be suppressed from being restricted by the respective deep well regions 99 and therefore, improvement of the withstand voltage can be achieved appropriately. The peripheral edge well regions 100 also exhibit the same effects as the deep well regions 99.

By using the source trenches 92, the deep well regions 99 can be formed appropriately in comparatively deep regions of the SiC chip 62. Also, the deep well regions 99 can be formed along the source trenches 92 and therefore occurrence of variation in the depth of the plurality of deep well regions 99 can be suppressed appropriately.

Also, portions of the high concentration region 70 are interposed in regions between the mutually adjacent ones of the plurality of deep well regions 99. A JFET (junction field effect transistor) resistance can thereby be reduced in the regions between the mutually adjacent ones of the plurality of deep well regions 99.

Also, in this embodiment, the bottom portions of the respective deep well regions 99 are positioned in the high concentration region 70. Current paths can thereby be formed in lateral directions parallel to the first main surface 63 in regions of the high concentration region 70 directly below the respective deep well regions 99. Consequently, current spreading resistance can be reduced. The low concentration region 71 increases the withstand voltage of the SiC chip 62 in such a structure.

The SiC semiconductor device 61 includes a plurality of source sub-trenches 101 formed in the first main surface 63 such as to border the upper end portions of the source electrodes 94 in the active region 72. The plurality of source sub-trenches 101 are formed in a relationship of one-to-one correspondence with respect to the plurality of source electrodes 94. Each source sub-trench 101 is in communication with the corresponding source trench 92 and forms a portion of the side walls of the corresponding source trench 92.

In this embodiment, the source sub-trench 101 is formed to an annular shape (more specifically, an endless shape) surrounding the upper end portion of the source electrode 94 in plan view. The source sub-trench 101 is formed by digging into a portion of the source insulating layer 93. More specifically, the source sub-trench 101 is formed by digging into the upper end portion of the source insulating layer 93 and the upper end portion of the source electrode 94 from the first main surface 63.

The source sub-trench 101 is formed, in sectional view, to a convergent shape with a bottom area being less than an opening area. A bottom wall of the source sub-trench 101 may be formed to a shape curved toward the second main surface 64. The source sub-trench 101 exposes the source region 97, the contact region 98, the source insulating layer 93, the source electrode 94, and the contact region 98.

The upper end portion of the source electrode 94 has a shape that is inwardly constricted with respect to a lower end portion of the source electrode 94. The lower end portion of the source electrode 94 is a portion of the source electrode that is positioned at the bottom wall side of the corresponding source trench 92. A width along the second direction Y of the upper end portion of the source electrode 94 may be less than a width along the second direction Y of the lower end portion of the source electrode 94.

An opening edge portion of each source trench 92 includes an inclined portion that inclines downwardly from the first main surface 63 toward an inner side of each source trench 92. The opening edge portion of each source trench 92 is a portion connecting the first main surface 63 and the side walls of each source trench 92. The inclined portion of each source trench 92 is formed by the source sub-trench 101.

In this embodiment, the inclined portion of each source trench 92 is formed to a curved shape recessed toward the inner side of the SiC chip 62. The inclined portion of each source trench 92 may instead be formed to a shape curved toward the source sub-trench 101. The inclined portion of each source trench 92 relaxes concentration of electric field with respect to the opening edge portion of each source trench 92.

Referring to FIG. 13, the active region 72 has an active main surface 111 forming a portion of the first main surface 63. The outer region 73 has an outer main surface 112 forming a portion of the first main surface 63. The outer main surface 112 is connected to the side surfaces 65A to 65D.

The active main surface 111 and the outer main surface 112 are respectively arranged along c-planes of the SiC monocrystal. The active main surface 111 and the outer main surface 112 respectively have off angles inclined in the [11-20] direction with respect to the (0001) plane of the SiC monocrystal.

The outer region 73 is formed by digging into the first main surface 63 toward the second main surface 64 side. The outer main surface 112 is thus formed in a region that is recessed toward the second main surface 64 side with respect to the active main surface 111. The outer main surface 112 is positioned at the second main surface 64 side with respect to the bottom walls of the gate trenches 78.

In this embodiment, the outer main surface 112 is formed at a depth position substantially equal to the bottom walls of the respective source trenches 92. The outer main surface 112 is positioned on substantially the same plane as the bottom walls of the respective source trenches 92. The outer main surface 112 may be positioned in a range of not less than 0 μm and not more than 1 μm toward the second main surface 64 side with respect to the bottom walls of the respective source trenches 92. The outer main surface 112 exposes the high concentration region 70.

In this embodiment, the active region 72 is demarcated as a mesa by the outer region 73. The active region 72 is formed as an active mesa 113 of mesa shape projecting further upward than the outer main surface 112.

The active mesa 113 includes active side walls 114 connecting the active main surface 111 and the outer main surface 112. The active side walls 114 demarcate a boundary region between the active region 72 and the outer region 73. The first main surface 63 is formed by the active main surface 111, the outer main surface 112, and the active side walls 114.

In this embodiment, the active side walls 114 extend along the normal direction Z to the active main surface 111 (outer main surface 112). The active side walls 114 are formed by m-planes and a-planes of the SiC monocrystal. The active side walls 114 may have inclined surfaces inclined downwardly from the active main surface 111 toward the outer main surface 112. The active side walls 114 expose the high concentration region 70. The active side walls 114 may expose the body region 74.

The SiC semiconductor device 61 includes a $p^+$-type diode region 121 formed in a surface layer portion of the outer main surface 112. The diode region 121 is formed in the high concentration region 70. The diode region 121 is formed in a region of the outer region 73 between the active side walls 114 and the side surfaces 65A to 65D.

The diode region 121 is formed at intervals from the active side walls 114 and the side surfaces 65A to 65D. The diode region 121 extends as a band along the active region 72 in plan view. In this embodiment, the diode region 121 is formed to an annular shape (more specifically, an endless shape) surrounding the active region 72 in plan view.

The diode region 121 is positioned at the second main surface 64 side with respect to the bottom walls of the gate trenches 78. A bottom portion of the diode region 121 is positioned at the second main surface 64 side with respect to the bottom walls of the respective source trenches 92. The bottom portion of the diode region 121 may be formed at a depth position substantially equal to the bottom portions of the contact regions 98.

The bottom portion of the diode region 121 may be positioned on substantially the same plane as the bottom portions of the contact regions 98. The bottom portion of the diode region 121 may be positioned at the second main surface 64 side with respect to the bottom portions of the contact regions 98. The bottom portion of the diode region 121 may be positioned in a range of not less than 0 μm and not more than 1 μm toward the second main surface 64 side with respect to the bottom portions of the contact regions 98.

The diode region 121 forms a pn junction portion with the high concentration region 70. A pn junction diode having the diode region 121 as an anode and the high concentration region 70 as a cathode is thereby formed. A peak value of a p-type impurity concentration of the diode region 121 may be not less than $1.0 \times 10^{17}$ cm$^{-3}$ and not more than $1.0 \times 10^{21}$ cm$^{-3}$.

The SiC semiconductor device 61 includes a p-type outer well region 122 formed in a surface layer portion of the outer main surface 112. A peak value of a p-type impurity concentration of the outer well region 122 may be not less than $1.0 \times 10^{17}$ cm$^{-3}$ and not more than $1.0 \times 10^{19}$ cm$^{-3}$. The peak value of the p-type impurity concentration of the outer well region 122 may be less than the peak value of the p-type impurity concentration of the diode region 121. The peak value of the p-type impurity concentration of the outer well region 122 may be substantially equal to the peak value of the p-type impurity concentration of the deep well regions 99.

The outer well region 122 is formed in a region between the active side walls 114 and the diode region 121 in plan view. The outer well region 122 extends as a band along the active region 72 in plan view. In this embodiment, the outer well region 122 is formed to an annular shape (more specifically, an endless shape) surrounding the active region 72 in plan view.

The outer well region 122 is formed in the high concentration region 70. The outer well region 122 is positioned at the second main surface 64 side with respect to the bottom walls of the respective gate trenches 78. A bottom portion of the outer well region 122 is positioned at the second main surface 64 side with respect to the bottom walls of the respective source trenches 92. The bottom portion of the outer well region 122 is positioned at the second main surface 64 side with respect to the bottom portion of the diode region 121. The bottom portion of the outer well region 122 may be formed at a depth position substantially equal to the bottom portions of the deep well regions 99.

Inner peripheral edges of the outer well region 122 cover corner portions connecting the active side walls 114 and the outer main surface 112. The inner peripheral edges of the outer well region 122 further extend along the active side walls 114 and are connected to the body region 74. The inner peripheral edges of the outer well region 122 may be formed at intervals toward the diode region 121 side from the active side walls 114.

Outer peripheral edges of the outer well region 122 cover the diode region 121 from the second main surface 64 side. The outer well region 122 is electrically connected to the diode region 121. The outer well region 122 may form a portion of the pn junction diode. The outer peripheral edges of the outer well region 122 may be formed at intervals to the active side wall 114 sides from the diode region 121.

The SiC semiconductor device 61 includes an FL structure 123 (field limit structure) formed in a surface layer portion of the outer main surface 112. The FL structure 123 is formed in a region between the diode region 121 and the side surfaces 65A to 65D in plan view. In this embodiment, the FL structure 123 is formed at intervals toward the diode region 121 side from the side surfaces 65A to 65D. The FL structure 123 is formed in the high concentration region 70.

The FL structure 123 includes one or a plurality of (for example, not less than two and not more than twenty) FL regions 124 (field limit regions). In this embodiment, the FL structure 123 includes an FL region group having five FL regions 124A, 124B, 124C, 124D, and 124E. The FL regions 124A to 124E are formed in that order at intervals along a direction away from the diode region 121.

The FL regions 124A to 124E respectively extend as bands along the peripheral edges of the active region 72 in plan view. More specifically, the FL regions 124A to 124E are respectively formed as annular shapes (more specifically, endless shapes) surrounding the active region 72 in plan view. Each of the FL regions 124A to 124E is also referred to as an FLR region (field limiting ring region).

Bottom portions of the FL regions 124A to 124E are positioned at the second main surface 64 side with respect to the bottom portion of the diode region 121. The FL region 124A at an innermost side among the FL regions 124A to 124E covers the diode region 121 from the second main surface 64 side. The FL region 124A is thereby electrically connected to the diode region 121. The FL region 124A may form a portion of the pn junction diode.

Entireties of the FL regions 124A to 124E are positioned at the second main surface 64 side with respect to the bottom walls of the gate trenches 78. The bottom portions of the FL regions 124A to 124E are positioned at the second main surface 64 side with respect to the bottom walls of the source trenches 92.

The FL structure 123 relaxes concentration of electric field in the outer region 73. The number, widths, depths, p-type impurity concentration, etc., of the FL regions 124 may take on any of various values in accordance with the electric field to be relaxed. The FL structure 123 may include one or a plurality of FL regions 124 formed in the region between the active side walls 114 and the diode region 121 in plan view.

The SiC semiconductor device 61 includes an outer insulating layer 131 covering the outer main surface 112. The outer insulating layer 131 is formed as a film along the active side walls 114 and the outer main surface 112. On the active main surface 111, the outer insulating layer 131 is continuous to the gate insulating layers 79 (third regions 83). In the outer region 73, the outer insulating layer 131 covers the diode region 121, the outer well region 122, and the FL structure 123.

The outer insulating layer 131 may include silicon oxide. The outer insulating layer 131 may include another insulating film of silicon nitride, etc. In this embodiment, the outer insulating layer 131 is formed of the same insulating material type as the gate insulating layers 79.

Peripheral edges of the outer insulating layer 131 are exposed from the side surfaces 65A to 65D. In this embodiment, the peripheral edges of the outer insulating layer 131 are continuous to the side surfaces 65A to 65D. The peripheral edges of the outer insulating layer 131 may instead be formed at intervals inward from the side surfaces 65A to 65D. In this case, the outer insulating layer 131 exposes the outer main surface 112.

The SiC semiconductor device 61 further includes a side wall structure 132 covering the active side walls 114. The side wall structure 132 protects and reinforces the active mesa 113 from the outer region 73 side. Also, the side wall structure 132 forms a level difference moderating structure that moderates a level difference formed between the active main surface 111 and the outer main surface 112.

If an upper layer structure (covering layer) that covers the boundary region between the active region 72 and the outer region 73 is formed, the upper layer structure covers the side wall structure 132. The side wall structure 132 improves flatness of the upper layer structure. The side wall structure 132 may have an inclined surface that inclines downwardly from the active main surface 111 toward the outer main surface 112. The level difference can be moderated appropriately by the inclined surface of the side wall structure 132.

The inclined surface of the side wall structure 132 may be formed to a curved shape recessed toward the SiC chip 62 side. The inclined surface of the side wall structure 132 may be formed to a shape curved toward a side opposite to the SiC chip 62. The inclined surface of the side wall structure 132 may extend as a plane from the active main surface 111 side toward the outer main surface 112 side.

The side wall structure 132 is formed along the active side walls 114. In this embodiment, the side wall structure 132 is formed to an annular shape (more specifically, an endless shape) surrounding the active region 72 in plan view. The side wall structure 132 preferably includes a polysilicon. In this case, the side wall structure 132 can be formed at the same time as the gate electrodes 80 and the source electrodes 94.

The SiC semiconductor device 61 includes an interlayer insulating layer 140 formed on the first main surface 63. The interlayer insulating layer 140 covers the active region 72 and the outer region 73. The interlayer insulating layer 140 is formed as a film along the active main surface 111 and the outer main surface 112.

In the boundary region between the active region 72 and the outer region 73, the interlayer insulating layer 140 is formed along the side wall structure 132. The interlayer insulating layer 140 forms a portion of the upper layer structure that covers the side wall structure 132.

Peripheral edges of the interlayer insulating layer 140 are exposed from the side surfaces 65A to 65D. The peripheral edges of the interlayer insulating layer 140 are continuous to the side surfaces 65A to 65D. The peripheral edges of the interlayer insulating layer 140 may instead be formed at intervals inward from the side surfaces 65A to 65D. In this case, the interlayer insulating layer 140 exposes the outer main surface 112 (outer insulating layer 131).

The interlayer insulating layer 140 may include silicon oxide or silicon nitride. The interlayer insulating layer 140 may include USG (undoped silicate glass), PSG (phosphor silicate glass) and/or BPSG (boron phosphor silicate glass) as an example of silicon oxide.

The interlayer insulating layer 140 includes a gate contact hole 141, source contact holes 142, and a diode contact hole 143. The gate contact hole 141 exposes the gate wiring 85 in the active region 72. The gate contact hole 141 may be formed as a band oriented along the gate wiring 85. An opening edge portion of the gate contact hole 141 is formed to a shape curved toward an interior of the gate contact hole 141.

The source contact holes 142 expose the source regions 97, the contact regions 98, and the trench source structures 91 in the active region 72. The source contact holes 142 may be formed as bands oriented along the trench source structures 91. An opening edge portion of each source contact hole 142 is formed to a shape curved toward an interior of the source contact hole 142.

The diode contact hole 143 exposes the diode region 121 in the outer region 73. The diode contact hole 143 may be formed as a band (more specifically, an endless shape) extending along the diode region 121. The diode contact hole 143 may expose the outer well region 122 and/or the FL structure 123. An opening edge portion of the diode contact hole 143 is formed to a shape curved toward an interior of the diode contact hole 143.

The SiC semiconductor device 61 includes first main surface electrodes 150 formed on the first main surface 63. More specifically, the first main surface electrodes 150 are formed on the interlayer insulating layer 140. The first main surface electrode 150 include a gate main surface electrode 151 and a source main surface electrode 152 that are electrically insulated from each other.

A gate voltage is applied to the gate main surface electrode 151. The gate voltage may be not less than 10 V and not more than 50 V (for example, approximately 30 V). A source voltage is applied to the source main surface electrode 152. The source voltage may be a reference voltage (for example, a GND voltage).

The gate main surface electrode 151 is formed in the active region 72. The gate main surface electrode 151 includes a gate pad 153 and a gate finger 154. The gate pad 153 is formed in a region at the first side surface 65A side in plan view. More specifically, the gate pad 153 is formed along a region along a central portion of the first side surface 65A in plan view. The gate pad 153 may be formed in a region along a corner portion connecting any two of the side surfaces 65A to 65D in plan view. The gate pad 153 may be formed to a quadrilateral shape in plan view.

The gate finger 154 is led out from the gate pad 153 and extends as a band along peripheral edges of the active region 72. In this embodiment, the gate finger 154 is formed along the first side surface 65A, the third side surface 65C, and the fourth side surface 65D such as to demarcate an inner side of the active region 72 from three directions.

The gate finger 154 has a pair of open ends 155 and 156. The pair of open ends 155 and 156 are formed in a region opposing the gate pad 153 across the inner side of the active region 72. In this embodiment, the pair of open ends 155 and 156 are formed in a region along the second side surface 65B in plan view.

The gate finger 154 enters into the gate contact hole 141 from above the interlayer insulating layer 140. The gate finger 154 is electrically connected to the gate wiring 85 inside the gate contact hole 141. An electrical signal from the gate pad 153 is thereby transmitted to the gate electrodes 80 and the gate wiring 85 via the gate finger 154.

The source main surface electrode 152 is formed in the active region 72 and the outer region 73. The source main surface electrode 152 includes a source pad 157, a source wiring 158, and a source connection portion 159. The source pad 157 is formed in the active region 72 at intervals from the gate main surface electrode 151. The source pad 157 is formed in a C shape in plan view such as to cover a region of C shape demarcated by the gate main surface electrode 151.

The source pad 157 enters into the source contact holes 142 and the source sub-trenches 101 from above the interlayer insulating layer 140. The source pad 157 is electrically connected to the source regions 97, the contact regions 98, and the source electrodes 94 inside the source contact holes 142 and the source sub-trenches 101.

The source electrodes 94 may be formed using partial regions of the source pad 157. The source electrodes 94 may be formed by portions of the source pad 157 entering into the respective source trenches 92.

The source wiring 158 is formed in the outer region 73. The source wiring 158 extends as a band along the active region 72. The source wiring 158 is formed to an annular shape (more specifically, an endless shape) surrounding the active region 72 in plan view.

The source wiring 158 enters into the diode contact hole 143 from above the interlayer insulating layer 140. The source wiring 158 is electrically connected to the diode region 121 inside the diode contact hole 143.

The source connection portion 159 connects the source pad 157 and the source wiring 158. The source connection portion 159 crosses the open ends 155 and 156 of the gate finger 154 from the source pad 157 and is connected to the source wiring 158. The source connection portion 159 crosses the side wall structure 132 from the active region 72 and is led out to the outer region 73. The source connection portion 159 forms a portion of the upper layer structure that covers the side wall structure 132.

Due to its structure, the MISFET formed in the active region 72 includes an npn-type parasitic transistor. When an avalanche current generated in the outer region 73 flows into the active region 72, the parasitic transistor is switched to an on state. In this case, operation of the MISFET becomes unstable due to latchup. Thus, with the SiC semiconductor device 61, the structure of the source main surface electrode 152 is used to form an avalanche current absorbing structure.

The avalanche current generated in the outer region 73 is absorbed by the source wiring 158 via the diode region 121. The avalanche current absorbed by the source wiring 158 reaches the source pad 157 via the source connection portion 159. If a lead wire is connected to the source pad 157, the avalanche current is taken out by the lead wire.

Driving of the parasitic transistor due to the avalanche current can thereby be suppressed. Latchup can thus be suppressed and therefore, stability of the MISFET can be improved.

Referring to FIG. 14 and FIG. 15, the first main surface electrodes 150 (gate main surface electrode 151 and source main surface electrode 152) each have a laminated structure that includes a barrier layer 160 and a first Al layer 161 laminated in that order from the first main surface 63 side. The first Al layer 161 is formed as a first buffer layer that uses a cushioning property of Al, which has a comparative small Young's modulus (rigidity modulus), to relax an external force applied to the SiC chip 62 from the SiC chip 62 side.

The barrier layer 160 may have a single layer structure that includes a Ti layer or a TiN layer. The barrier layer 160 may have a laminated structure that includes a Ti layer and a TiN layer laminated in that order from the SiC chip 62 side. A thickness of the barrier layer 160 may be not less than 0.01 µm and not more than 6 µm. The thickness of the barrier layer 160 may be not less than 0.01 µm and not more than 0.1 µm, not less than 0.1 µm and not more than 2 µm, not less than 2 µm and not more than 4 µm, or not less than 4 µm and not more than 6 µm.

The first Al layer 161 has a resistance value less than a resistance value of the barrier layer 160. The first Al layer 161 includes at least one among a pure Al layer, an AlSi alloy layer, an AlCu alloy layer, and an AlSiCu alloy layer. The first Al layer 161 may have a laminated structure in which two or more among a pure Al layer, an AlSi alloy layer, an AlCu alloy layer, and an AlSiCu alloy layer are laminated in any order.

The first Al layer 161 may have a single layer structure constituted of a pure Al layer, an AlSi alloy layer, an AlCu alloy layer, or an AlSiCu alloy layer. The first Al layer 161 preferably has a single layer structure constituted of an AlSi alloy layer, an AlCu alloy layer, or an AlSiCu alloy layer.

A thickness of the first Al layer 161 exceeds the thickness of the barrier layer 160. The thickness of the first Al layer 161 may be not less than 0.05 µm and not more than 10 µm. The thickness of the first Al layer 161 may be not less than 0.05 µm and not more than 0.1 µm, not less than 0.1 µm and not more than 1 µm, not less than 1 µm and not more than 2 µm, not less than 2 µm and not more than 4 µm, not less than 4 µm and not more than 6 µm, not less than 6 µm and not more than 8 µm, or not less than 8 µm and not more than 10 µm. The thickness of the first Al layer 161 is preferably not less than 1 µm and not more than 8 µm.

The SiC semiconductor device 61 includes an insulating layer 170 formed on the interlayer insulating layer 140. In FIG. 9, the insulating layer 170 is shown with hatching. Peripheral edges of the insulating layer 170 are formed at intervals inward from the side surfaces 65A to 65D. The insulating layer 170 thereby exposes peripheral edges of the SiC chip 62 (more specifically, the interlayer insulating layer 140) in plan view.

The peripheral edges of the insulating layer 170 demarcate the dicing street DS with the side surfaces 65A to 65D. By the dicing street DS, it is made unnecessary to physically cut the insulating layer 170 when cutting out the SiC semiconductor device 61 from an SiC wafer. The SiC semiconductor device 61 can thereby be cut out smoothly from the SiC wafer and at the same time, peeling and degradation of the insulating layer 170 can be suppressed. Consequently, protection objects, such as the SiC chip 102, the first main surface electrode 150, etc., can be protected appropriately by the insulating layer 170.

A width of the dicing street DS may be not less than 1 µm and not more than 25 µm. The width of the dicing street DS is a width in a direction orthogonal to the direction in which the dicing street DS extends. The width of the dicing street DS may be not less than 1 µm and not more than 5 µm, not less than 5 µm and not more than 10 µm, not less than 10 µm and not more than 15 µm, not less than 15 µm and not more than 20 µm, or not less than 20 µm and not more than 25 µm.

The insulating layer 170 covers the gate main surface electrode 151 and the source main surface electrode 152. The insulating layer 170 includes pad openings 171. More specifically, the pad openings 171 include a gate pad opening 172 and a source pad opening 173. The gate pad opening 172 exposes the gate pad 153. The source pad opening 173 exposes the source pad 157. A planar shape of the gate pad opening 172 is arbitrary. A planar shape of the source pad opening 173 is arbitrary.

In this embodiment, the insulating layer 170 has a laminated structure that includes a passivation layer 174 and a resin layer 175 that are laminated in that order from the SiC chip 62 side.

The passivation layer 174 may include at least one among a silicon oxide layer and a silicon nitride layer. The passivation layer 174 may have a laminated structure that includes a silicon oxide layer and a silicon nitride layer. The passivation layer 174 may instead have a single layer structure constituted of a silicon oxide layer or a silicon nitride layer. The passivation layer 174 preferably includes an insulating material differing from the interlayer insulating layer 140. In this embodiment, the passivation layer 174 has a single layer structure constituted of a silicon nitride layer.

The passivation layer 174 is formed as a film along the interlayer insulating layer 140. The passivation layer 174 covers the active region 72 and the outer region 73 across the interlayer insulating layer 140. The passivation layer 174 crosses the side wall structure 132 from the active region 72 and is led out to the outer region 73. The passivation layer 174 forms a portion of the upper layer structure that covers the side wall structure 132.

The passivation layer 174 has a first gate opening 176 and a first source opening 177. The first gate opening 176 exposes the gate pad 153. The first source opening 177 exposes the source pad 157. A planar shape of the first gate opening 176 is arbitrary. A planar shape of the first source opening 177 is arbitrary.

A thickness of the passivation layer 174 may be not less than 0.1 µm and not more than 20 µm. The thickness of the passivation layer 174 may be not less than 0.1 µm and not more than 1 µm, not less than 1 µm and not more than 5 µm, not less than 5 µm and not more than 10 µm, not less than 10 µm and not more than 15 µm, or not less than 15 µm and not more than 20 µm.

The resin layer 175 is formed as a film along a main surface of the passivation layer 174. The resin layer 175 crosses the side wall structure 132 from the active region 72 and is led out to the outer region 73. The resin layer 175 forms a portion of the upper layer structure that covers the side wall structure 132.

The resin layer 175 may include a photosensitive resin. The photosensitive resin may be of a negative type or a positive type. The resin layer 175 may include at least one among a polyimide, a polyamide, and a polybenzoxazole. In this embodiment, the resin layer 175 includes polybenzoxazole.

In this embodiment, peripheral edges of the resin layer 175 expose the peripheral edges of the passivation layer 174. The peripheral edges of the insulating layer 170 are formed by the peripheral edges of the resin layer 175 and the peripheral edges of the passivation layer 174. The resin layer 175 may cover the peripheral edges of the passivation layer 174.

The resin layer 175 has a second gate opening 178 and a second source opening 179. The second gate opening 178 is in communication with the first gate opening 176 of the passivation layer 174 and forms the gate pad opening 172 with the first gate opening 176. The second source opening 179 is in communication with the first source opening 177 of the passivation layer 174 and forms the source pad opening 173 with the first source opening 177.

Inner walls of the second gate opening 178 may be formed flush with inner walls of the first gate opening 176. The inner walls of the second gate opening 178 may be positioned outside the first gate opening 176 in plan view. The inner walls of the second gate opening 178 may be positioned inside the first gate opening 176 in plan view. That is, the resin layer 175 may cover the inner walls of the first gate opening 176.

Inner walls of the second source opening 179 may be formed flush with inner walls of the first source opening 177. The inner walls of the second source opening 179 may be positioned outside the first source opening 177 in plan view. The inner walls of the second source opening 179 may be positioned inside the first source opening 177 in plan view. That is, the resin layer 175 may cover the inner walls of the first source opening 177.

A thickness of the resin layer 175 may be not less than 1 µm and not more than 50 µm. The thickness of the resin layer 175 may be not less than 1 µm and not more than 10 µm, not less than 10 µm and not more than 20 µm, not less than 20 µm and not more than 30 µm, not less than 30 µm and not more than 40 µm, or not less than 40 µm and not more than 50 µm.

The SiC semiconductor device 61 includes an uneven structure 180 formed in the outer main surface 112. More specifically, the uneven structure 180 includes unevenness formed using the interlayer insulating layer 140 covering the outer main surface 112. Even more specifically, the uneven structure 180 includes an anchor hole 181 formed in the interlayer insulating layer 140.

The anchor hole 181 is formed by digging into a portion of the interlayer insulating layer 140 that covers the outer region 73. The anchor hole 181 may be formed in the region between the diode region 121 and the side surfaces 65A to 65D in plan view. In this embodiment, the anchor hole 181 is formed in a region between the FL structure 123 and the side surfaces 65A to 65D in plan view.

The anchor hole 181 may be demarcated by the interlayer insulating layer 140. In this embodiment, the anchor hole 181 exposes the outer main surface 112. The anchor hole 181 may be dug toward the second main surface 64 in the outer main surface 112. An opening edge portion of the anchor hole 181 is formed to a shape curved toward an interior of the anchor hole 181.

The anchor hole 181 extends as a band along the active region 72 in plan view. In this embodiment, the anchor hole 181 is formed to an annular shape (more specifically, an endless shape) surrounding the active region 72 in plan view. The number of anchor holes 181 is arbitrary. A single anchor hole 181 may be formed in the interlayer insulating layer 140 or a plurality of anchor holes 181 may be formed in the interlayer insulating layer 140.

The resin layer 175 has an anchor portion 182 that is engaged with the anchor hole 181. In this embodiment, the resin layer 175 is engaged with the anchor hole 181 via the passivation layer 174. More specifically, the passivation layer 174 enters into the anchor hole 181 from above the interlayer insulating layer 140. The passivation layer 174 contacts the outer main surface 112 inside the anchor hole 181. A recess 183 recessed toward the anchor hole 181 is formed in portion of the main surface of the passivation layer 174 that covers the anchor hole 181.

A portion of the resin layer 175 forms the anchor portion 182 inside the recess 183 of the passivation layer 174. Connection strength of the resin layer 175 with respect to the first main surface 63 can thereby be improved and therefore, peeling of the resin layer 175 can be suppressed appropriately.

Referring to FIG. 14 and FIG. 15, the SiC semiconductor device 61 includes pad electrodes 190 formed on the first main surface electrode 150. More specifically, the pad electrodes 190 include the gate pad electrode 191 and the source pad electrode 192.

The gate pad electrode 191 is formed on the gate main surface electrode 151 and is electrically connected to the gate main surface electrode 151. More specifically, the gate pad electrode 191 is formed on the gate pad 153 inside the gate pad opening 172. The gate pad electrode 191 has a gate terminal surface 193 to be externally connected to a lead wire.

The gate terminal surface 193 is positioned at the gate pad 153 side with respect to a main surface of the insulating layer 170 (resin layer 175). The gate terminal surface 193 may project further upward than the main surface of the insulating layer 170 (resin layer 175). The gate terminal surface 193 may have an overlap portion covering the main surface of the insulating layer 170 (resin layer 175).

The source pad electrode 192 is formed on the source main surface electrode 152 and is electrically connected to the source main surface electrode 152. More specifically, the source pad electrode 192 is formed on the source pad 157 inside the source pad opening 173. The source pad electrode 192 has a source terminal surface 194 to be externally connected to a lead wire.

The source terminal surface 194 is positioned at the source pad 157 side with respect to the main surface of the insulating layer 170 (resin layer 175). The source terminal surface 194 may project further upward than the main surface of the insulating layer 170 (resin layer 175). The source terminal surface 194 may have an overlap portion covering the main surface of the insulating layer 170 (resin layer 175).

The pad electrodes 190 (gate pad electrode 191 and source pad electrode 192) each include a metal material differing from the first main surface electrode 150. In this embodiment, the pad electrodes 190 each have a laminated structure that includes an Ni layer 195, a Pd layer 196, and an Au layer 197 laminated in that order from the first main surface electrode 150 side. Ni, Pd, and Au respectively have Young's moduli (rigidity moduli) that exceed the Young's modulus (rigidity modulus) of Al. The Ni layer 195, the Pd layer 196, and the Au layer 197 may be plating layers formed by a plating method.

The pad electrodes 190 each suffice to include at least one among the Ni layer 195, the Pd layer 196, and the Au layer 197. The pad electrodes 190 may each have a laminated structure in which at least two among the Ni layer 195, the Pd layer 196, and the Au layer 197 are laminated in any order. The pad electrodes 190 may each have a single layer structure constituted of the Ni layer 195, the Pd layer 196, or the Au layer 197.

The gate pad electrode 191 preferably has the gate terminal surface 193 that is formed by the Au layer 197. The source pad electrode 192 preferably has the source terminal surface 194 that is formed by the Au layer 197. Preferably, the pad electrodes 190 each have a laminated structure that includes at least the Ni layer 195 and the Au layer 197 that are laminated in that order from the first main surface electrode 150 side.

A thickness of the Ni layer 195 may be not less than 0.1 µm and not more than 10 µm. The thickness of the Ni layer 195 may be not less than 0.1 µm and not more than 0.5 µm, not less than 0.5 µm and not more than 1 µm, not less than 1 µm and not more than 2 µm, not less than 2 µm and not more than 4 µm, not less than 4 µm and not more than 6 µm, not less than 6 µm and not more than 8 µm, or not less than 8 µm and not more than 10 µm.

A thickness of the Pd layer 196 may be not less than 0.1 µm and not more than 10 µm. The thickness of the Pd layer 196 may be not less than 0.1 µm and not more than 0.5 µm, not less than 0.5 µm and not more than 1 µm, not less than 1 µm and not more than 2 µm, not less than 2 µm and not more than 4 µm, not less than 4 µm and not more than 6 µm, not less than 6 µm and not more than 8 µm, or not less than 8 µm and not more than 10 µm.

A thickness of the Au layer 197 may be not less than 0.01 µm and not more than 3 µm. The thickness of the Au layer 197 may be not less than 0.01 µm and not more than 0.05 µm, not less than 0.05 µm and not more than 0.1 µm, not less than 0.1 µm and not more than 0.5 µm, not less than 0.5 µm and not more than 1 µm, not less than 1 µm and not more than 2 µm, or not less than 2 µm and not more than 3 µm. The thickness of the Au layer 197 is preferably less than the thickness of the Ni layer 195. The thickness of the Au layer 197 is preferably less than the thickness of the Pd layer 196.

The SiC semiconductor device 61 includes the second main surface electrode 200 formed on the second main surface 64. The second main surface electrode 200 is formed as a drain electrode of the MISFET. In this embodiment, the second main surface electrode 200 covers an entire area of the second main surface 64.

The second main surface electrode 200 may be formed at intervals inward from the side surfaces 65A to 65D and expose a peripheral edge portion of the second main surface 64. In this case, it is made unnecessary to physically cut the second main surface electrode 200 when cutting out the SiC semiconductor device 61 from the SiC wafer. The SiC semiconductor device 61 can thereby be cut out smoothly from the SiC wafer and at the same time, peeling and degradation of the second main surface electrode 200 can be suppressed. Consequently, the second main surface electrode 200 can be connected appropriately to the second main surface 64.

Such a second main surface electrode 200 can be obtained, as an example, by removing unnecessary portions of the second main surface electrode 200 by an etching method via a resist mask in a manufacturing process. Also, the second main surface electrode 200 can be obtained, as another example, by forming the second main surface electrode 200, which partially covers the second main surface 64, by a lift-off method using a resist mask in the manufacturing process.

The second main surface electrode 200 includes a second Al layer 201 that covers the second main surface 64. The second Al layer 201 opposes the first Al layer 161 of the gate main surface electrode 151 and the first Al layer 161 of the source main surface electrode 152 across the SiC chip 62. The second Al layer 201 is formed as a second buffer layer that uses the cushioning property of Al, which has the comparative small Young's modulus (rigidity modulus), to relax an external force applied to the SiC chip 62 from the second main surface 64 side.

The second Al layer 201 includes at least one among a pure Al layer, an AlSi alloy layer, an AlCu alloy layer, and an AlSiCu alloy layer. The second Al layer 201 may have a laminated structure in which two or more among a pure Al layer, an AlSi alloy layer, an AlCu alloy layer, and an AlSiCu alloy layer are laminated in any order. The second Al layer 201 may be formed by a sputter method and/or a plating method.

The second Al layer 201 may have a single layer structure constituted of a pure Al layer, an AlSi alloy layer, an AlCu alloy layer, or an AlSiCu alloy layer. An Al based metal material of the second Al layer 201 may differ from an Al based metal material of the first Al layers 161. The second Al layer 201 preferably has a single layer structure constituted of a pure Al layer.

The second Al layer 201 may have a thickness less than the first Al layers 161. The thickness of the second Al layer 201 may be not less than 0.01 μm and not more than 5 μm. The thickness of the second Al layer 201 may be not less than 0.01 μm and not more than 0.1 μm, not less than 0.1 μm and not more than 1 μm, not less than 1 μm and not more than 2 μm, not less than 2 μm and not more than 3 μm, not less than 3 μm and not more than 4 μm, or not less than 4 μm and not more than 5 μm.

In addition to the second Al layer 201, the second main surface electrode 200 further includes one or a plurality of electrode layers constituted of a metal material differing from the second Al layer 201. In this embodiment, the second main surface electrode 200 includes, as an example of a plurality of electrode layers, a Ti layer 202, an Ni layer 203, a Pd layer 204, an Au layer 205, and an Ag layer 206 that are laminated in that order from the second main surface 64 side.

The Ti layer 202 is an ohmic electrode that forms an ohmic contact with the second main surface 64. The second Al layer 201 covers the second main surface 64 across the Ti layer 202, the Ni layer 203, the Pd layer 204, the Au layer 205, and the Ag layer 206.

Ti, Ni, Pd, Au, and Ag respectively have Young's moduli (rigidity moduli) that exceed the Young's modulus (rigidity modulus) of Al. The Ti layer 202, the Ni layer 203, the Pd layer 204, the Au layer 205, and the Ag layer 206 may be formed by a sputter method, a vapor deposition method, and/or a plating method.

The second main surface electrode 200 suffices to include at least one among the Ti layer 202, the Ni layer 203, the Pd layer 204, the Au layer 205, and the Ag layer 206 as the one or plurality of electrode layers. The second Al layer 201 preferably covers the second main surface 64 at least across the Ti layer 202.

If the second main surface electrode 200 includes at least one among the Ni layer 203, the Pd layer 204, and the Au layer 205, at least one among the Ni layer 203, the Pd layer 204, and the Au layer 205 may be a plating layer formed at the same time as the Ni layer 195, the Pd layer 196, and the Au layer 197 of the pad electrode 190.

A thickness of the Ti layer 202 may be not less than 0.01 μm and not more than 3 μm. The thickness of the Ti layer 202 may be not less than 0.01 μm and not more than 0.05 μm, not less than 0.05 μm and not more than 0.1 μm, not less than 0.1 μm and not more than 0.5 μm, not less than 0.5 μm and not more than 1 μm, not less than 1 μm and not more than 2 μm, or not less than 2 μm and not more than 3 μm.

A thickness of the Ni layer 203 may be not less than 0.1 μm and not more than 10 μm. The thickness of the Ni layer 203 may be not less than 0.1 μm and not more than 0.5 μm, not less than 0.5 μm and not more than 1 μm, not less than 1 μm and not more than 2 μm, not less than 2 μm and not more than 4 μm, not less than 4 μm and not more than 6 μm, not less than 6 μm and not more than 8 μm, or not less than 8 μm and not more than 10 μm. The thickness of the Ni layer 203 preferably exceeds the thickness of the Ti layer 202.

A thickness of the Pd layer 204 may be not less than 0.1 μm and not more than 10 μm. The thickness of the Pd layer 204 may be not less than 0.1 μm and not more than 0.5 μm, not less than 0.5 μm and not more than 1 μm, not less than 1 μm and not more than 2 μm, not less than 2 μm and not more than 4 μm, not less than 4 μm and not more than 6 μm, not less than 6 μm and not more than 8 μm, or not less than 8 μm and not more than 10 μm. The thickness of the Pd layer 204 preferably exceeds the thickness of the Ti layer 202.

A thickness of the Au layer 205 may be not less than 0.01 μm and not more than 3 μm. The thickness of the Au layer 205 may be not less than 0.01 μm and not more than 0.05 μm, not less than 0.05 μm and not more than 0.1 μm, not less than 0.1 μm and not more than 0.5 μm, not less than 0.5 μm and not more than 1 μm, not less than 1 μm and not more than 2 μm, or not less than 2 μm and not more than 3 μm. The thickness of the Au layer 205 is preferably less than the thickness of the Ni layer 203. The thickness of the Au layer 205 is preferably less than the thickness of the Pd layer 204.

A thickness of the Ag layer 206 may be not less than 0.01 μm and not more than 3 μm. The thickness of the Ag layer 206 may be not less than 0.01 μm and not more than 0.05 μm, not less than 0.05 μm and not more than 0.1 μm, not less than 0.1 μm and not more than 0.5 μm, not less than 0.5 μm and not more than 1 μm, not less than 1 μm and not more than 2 μm, or not less than 2 μm and not more than 3 μm. The thickness of the Ag layer 206 is preferably less than the thickness of the Ni layer 203. The thickness of the Ag layer 206 is preferably less than the thickness of the Pd layer 204.

The second main surface electrode 200 may have a structure shown in FIG. 17A to FIG. 17I.

Figure 17A:
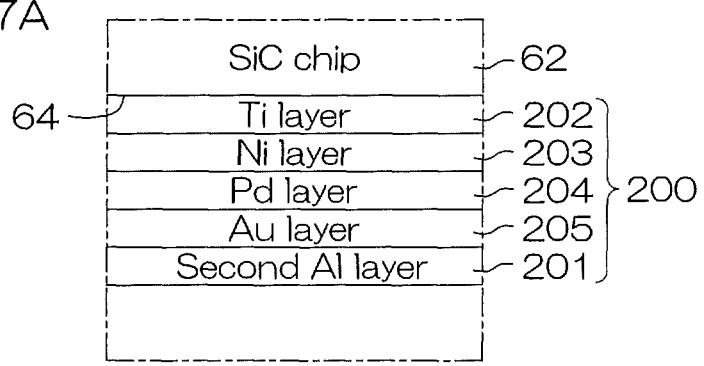
FIG. 17A is an illustrative sectional view of the second main surface electrode according to a second configuration example.

FIG. 17A is an illustrative sectional view of the second main surface electrode 200 according to a second configuration example. In the following, structures corresponding to the structures described with FIG. 6 to FIG. shall be provided with the same reference signs and description thereof shall be omitted.

Referring to FIG. 17A, in this embodiment, the second main surface electrode 200 has a laminated structure that includes the second Al layer 201, the Ti layer 202, the Ni layer 203, the Pd layer 204, and the Au layer 205. The Ti layer 202, the Ni layer 203, the Pd layer 204, and the Au layer 205 are laminated in that order from the second main surface 64 side. The second Al layer 201 covers the second main surface 64 across the Ti layer 202, the Ni layer 203, the Pd layer 204, and the Au layer 205.

Figure 17B:
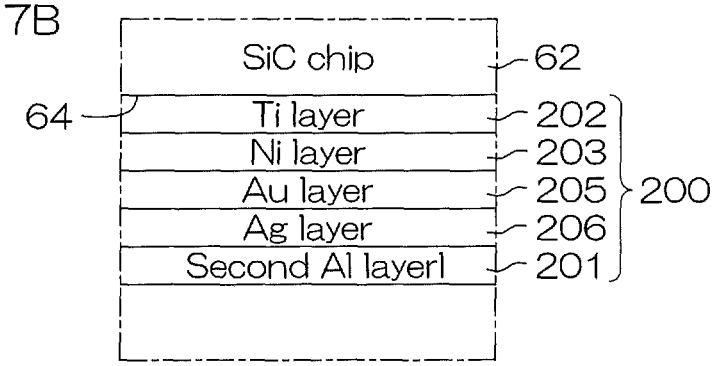
FIG. 17B is an illustrative sectional view of the second main surface electrode according to a third configuration example.

FIG. 17B is an illustrative sectional view of the second main surface electrode 200 according to a third configuration example. In the following, structures corresponding to the structures described with FIG. 6 to FIG. shall be provided with the same reference signs and description thereof shall be omitted.

Referring to FIG. 17B, in this embodiment, the second main surface electrode 200 has a laminated structure that includes the second Al layer 201, the Ti layer 202, the Ni layer 203, the Au layer 205, and the Ag layer 206. The Ti layer 202, the Ni layer 203, the Au layer 205, and the Ag layer 206 are laminated in that order from the second main surface 64 side. The second Al layer 201 covers the second main surface 64 across the Ti layer 202, the Ni layer 203, the Au layer 205, and the Ag layer 206.

Figure 17C:
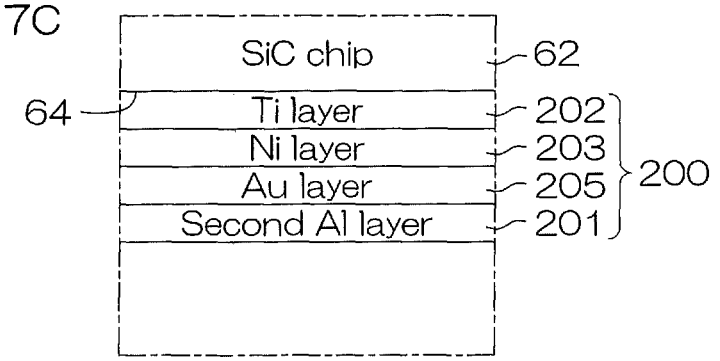
FIG. 17C is an illustrative sectional view of the second main surface electrode according to a fourth configuration example.

FIG. 17C is an illustrative sectional view of the second main surface electrode 200 according to a fourth configuration example. In the following, structures corresponding to the structures described with FIG. 6 to FIG. shall be provided with the same reference signs and description thereof shall be omitted.

Referring to FIG. 17C, in this embodiment, the second main surface electrode 200 has a laminated structure that includes the second Al layer 201, the Ti layer 202, the Ni layer 203, and the Au layer 205. The Ti layer 202, the Ni layer 203, and the Au layer 205 are laminated in that order from the second main surface 64 side. The second Al layer

201 covers the second main surface 64 across the Ti layer 202, the Ni layer 203, and the Au layer 205.

Figure 17D:
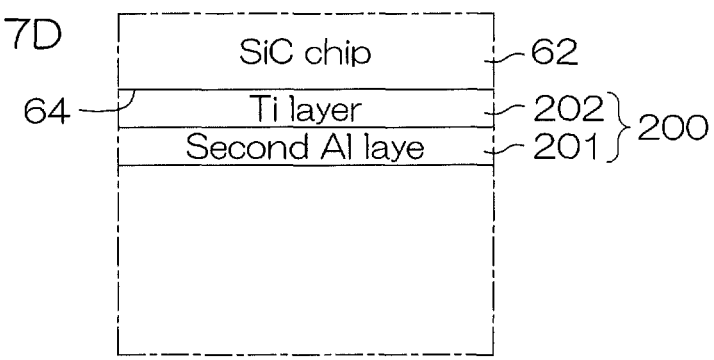
FIG. 17D is an illustrative sectional view of the second main surface electrode according to a fifth configuration example.

FIG. 17D is an illustrative sectional view of the second main surface electrode 200 according to a fifth configuration example. In the following, structures corresponding to the structures described with FIG. 6 to FIG. shall be provided with the same reference signs and description thereof shall be omitted.

Referring to FIG. 17D, in this embodiment, the second main surface electrode 200 has a laminated structure that includes the second Al layer 201 and the Ti layer 202. The Ti layer 202 is connected to the second main surface 64. The second Al layer 201 covers the second main surface 64 across the Ti layer 202.

Figure 17E:
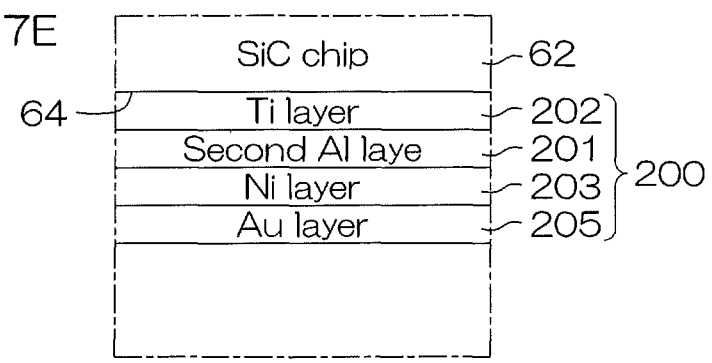
FIG. 17E is an illustrative sectional view of the second main surface electrode according to a sixth configuration example.

FIG. 17E is an illustrative sectional view of the second main surface electrode 200 according to a sixth configuration example. In the following, structures corresponding to the structures described with FIG. 6 to FIG. 16 shall be provided with the same reference signs and description thereof shall be omitted.

Referring to FIG. 17E, in this embodiment, the second main surface electrode 200 includes the second Al layer 201, the Ti layer 202, the Ni layer 203, and the Au layer 205. The Ti layer 202, the Ni layer 203, and the Au layer 205 are laminated in that order from the second main surface 64 side. The second Al layer 201 is interposed between the Ti layer 202 and the Ni layer 203 and covers the second main surface 64 across the Ti layer 202.

In this case, each of the pad electrodes 190 preferably has a two layer structure constituted of the Ni layer 195 and the Au layer 197 that are laminated in that order from the first main surface electrode 150 side. The Ni layer 203 and the Au layer 205 of the second main surface electrode 200 can be formed by a plating method at the same time as the Ni layer 195 and the Au layer 197 of each of the pad electrodes 190.

Figure 17F:
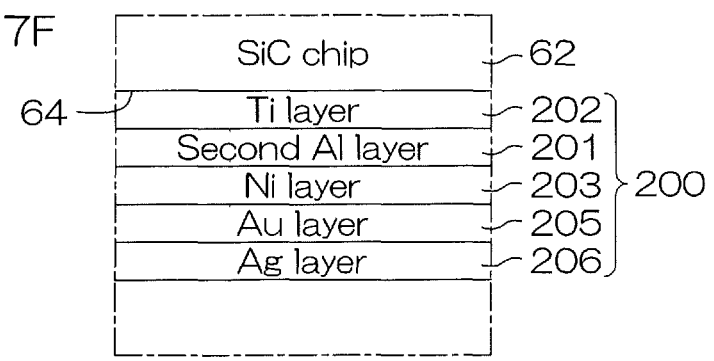
FIG. 17F is an illustrative sectional view of the second main surface electrode according to a seventh configuration example.

FIG. 17F is an illustrative sectional view of the second main surface electrode 200 according to a seventh configuration example. In the following, structures corresponding to the structures described with FIG. 6 to FIG. shall be provided with the same reference signs and description thereof shall be omitted.

Referring to FIG. 17F, in this embodiment, the second main surface electrode 200 includes the second Al layer 201, the Ti layer 202, the Ni layer 203, the Au layer 205, and the Ag layer 206. The Ti layer 202, the Ni layer 203, the Au layer 205, and the Ag layer 206 are laminated in that order from the second main surface 64 side. The second Al layer 201 is interposed between the Ti layer 202 and the Ni layer 203 and covers the second main surface 64 across the Ti layer 202.

In this case, each of the pad electrodes 190 preferably has the two layer structure constituted of the Ni layer 195 and the Au layer 197 that are laminated in that order from the first main surface electrode 150 side. The Ni layer 203 and the Au layer 205 of the second main surface electrode 200 can be formed by the plating method at the same time as the Ni layer 195 and the Au layer 197 of each of the pad electrodes 190.

Figure 17G:
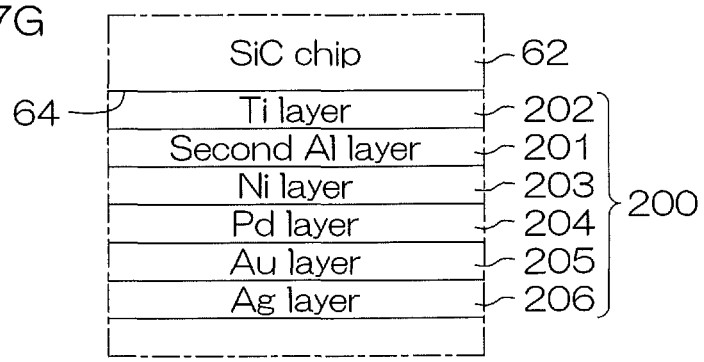
FIG. 17G is an illustrative sectional view of the second main surface electrode according to an eighth configuration example.

FIG. 17G is an illustrative sectional view of the second main surface electrode 200 according to an eighth configuration example. In the following, structures corresponding to the structures described with FIG. 6 to FIG. shall be provided with the same reference signs and description thereof shall be omitted.

Referring to FIG. 17G, in this embodiment, the second main surface electrode 200 includes the second Al layer 201, the Ti layer 202, the Ni layer 203, the Pd layer 204, the Au layer 205, and the Ag layer 206. The Ti layer 202, the Ni layer 203, the Au layer 205, and the Ag layer 206 are laminated in that order from the second main surface 64 side. The second Al layer 201 is interposed between the Ti layer 202 and the Ni layer 203 and covers the second main surface 64 across the Ti layer 202.

In this case, each of the pad electrodes 190 preferably has a three layer structure constituted of the Ni layer 195, the Pd layer 196, and the Au layer 197 that are laminated in that order from the first main surface electrode 150 side. The Ni layer 203, the Pd layer 204, and the Au layer 205 of the second main surface electrode 200 can be formed by a plating method at the same time as the Ni layer 195, the Pd layer 196, and the Au layer 197 of each of the pad electrodes 190.

Figure 17H:
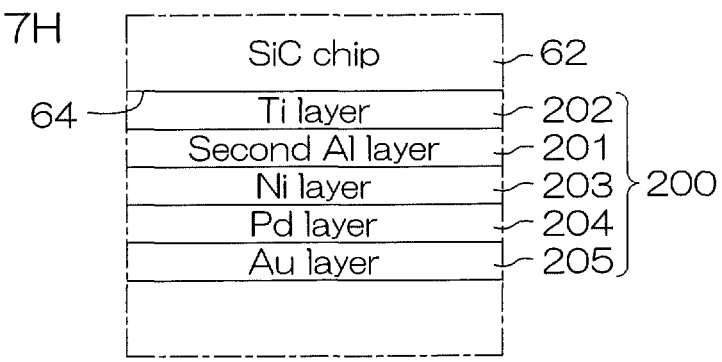
FIG. 17H is an illustrative sectional view of the second main surface electrode according to a ninth configuration example.
Figure 17:
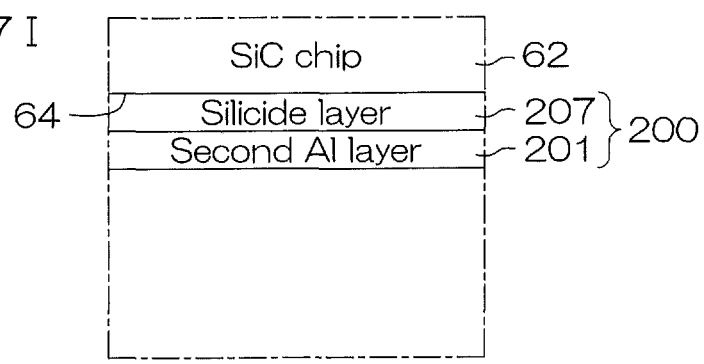
FIG. 17I is an illustrative sectional view of the second main surface electrode according to a tenth configuration example.

FIG. 17H is an illustrative sectional view of the second main surface electrode 200 according to a ninth configuration example. In the following, structures corresponding to the structures described with FIG. 6 to FIG. shall be provided with the same reference signs and description thereof shall be omitted.

Referring to FIG. 17H, in this embodiment, the second main surface electrode 200 includes the second Al layer 201, the Ti layer 202, the Ni layer 203, the Pd layer 204, and the Au layer 205. The Ti layer 202, the Ni layer 203, the Pd layer 204, and the Au layer 205 are laminated in that order from the second main surface 64 side. The second Al layer 201 is interposed between the Ti layer 202 and the Ni layer 203 and covers the second main surface 64 across the Ti layer 202.

In this case, each of the pad electrodes 190 preferably has the three layer structure constituted of the Ni layer 195, the Pd layer 196, and the Au layer 197 that are laminated in that order from the first main surface electrode 150 side. The Ni layer 203, the Pd layer 204, and the Au layer 205 of the second main surface electrode 200 can be formed by the plating method at the same time as the Ni layer 195, the Pd layer 196, and the Au layer 197 of each of the pad electrodes 190.

FIG. 17I is an illustrative sectional view of the second main surface electrode 200 according to a tenth configuration example. In the following, structures corresponding to the structures described with FIG. 6 to FIG. 16 shall be provided with the same reference signs and description thereof shall be omitted.

Referring to FIG. 17I, in this embodiment, the second main surface electrode 200 includes the second Al layer 201 and a silicide layer 207. The silicide layer 207 is formed on the second main surface 64. The silicide layer 207 is formed by siliciding, by a metal material, SiC exposed from the second main surface 64. The silicide layer 207 may include at least one among an $FeSi_2$ layer, an NiSi layer, an $NiSi_2$ layer, a $CoSi_2$ layer, a $CrSi_2$ layer, a $WSi_2$ layer, an $MoSi_2$ layer, an $MnSi_2$ layer, an $NbSi_2$ layer, a $TiSi_2$ layer, and a $VSi_2$ layer.

The second Al layer 201 covers the second main surface 64 across the silicide layer 207. Besides the second Al layer 201 and the silicide layer 207, the second main surface electrode 200 may include at least one among the Ti layer 202, the Ni layer 203, the Pd layer 204, the Au layer 205, and the Ag layer 206. A lamination order of the second Al layer 201, the Ti layer 202, the Ni layer 203, the Pd layer 204, the Au layer 205, and the Ag layer 206 is arbitrary. As a structure that covers the silicide layer 207, the lamination structure of any one of the first to tenth configuration examples may be adopted.

Figure 18:
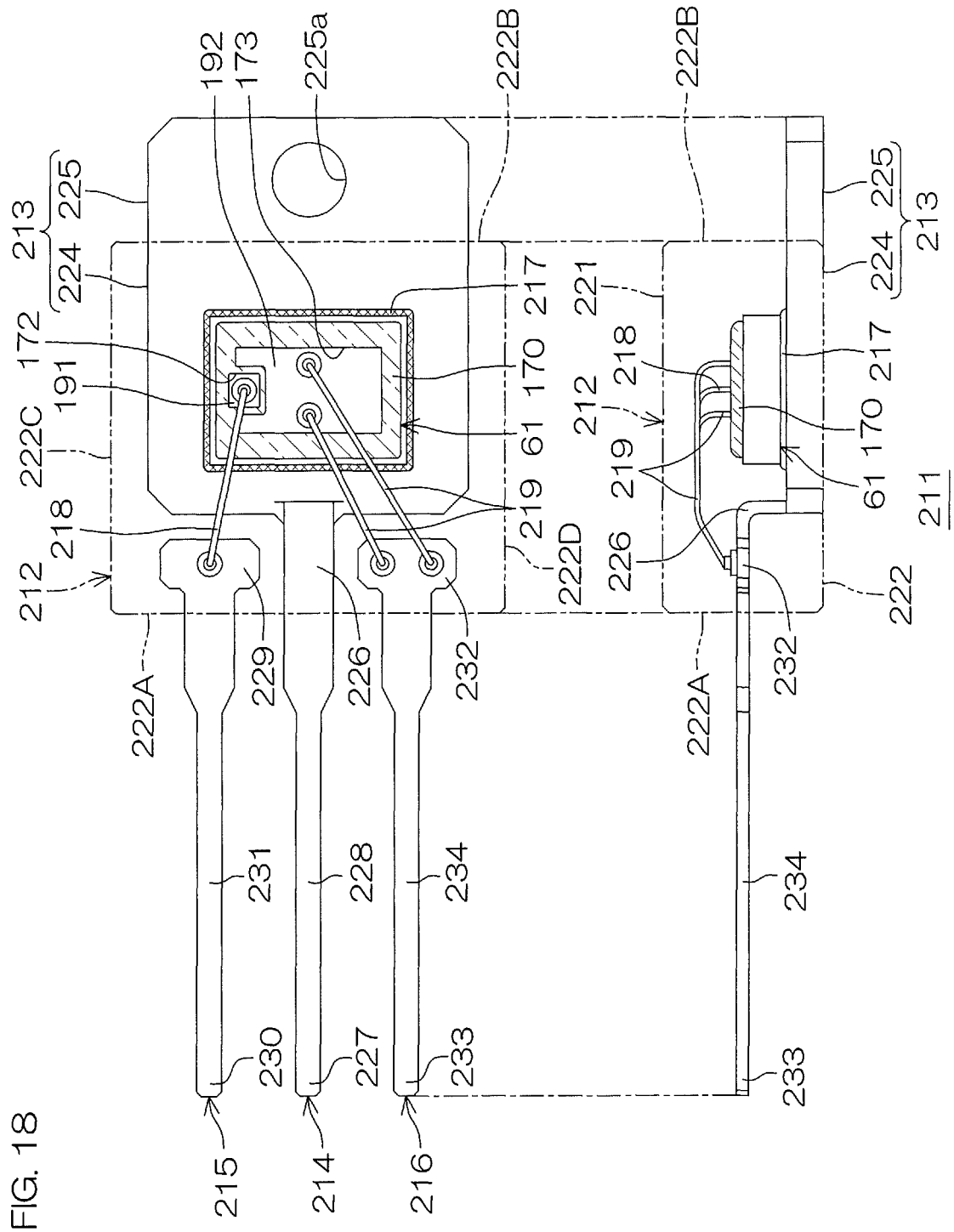
FIG. 18 is a diagram of a semiconductor package incorporating the SiC semiconductor device shown in FIG. 6.

FIG. 18 is a diagram of a semiconductor package 211 incorporating the SiC semiconductor device 61 shown in FIG. 1. In FIG. 18, an internal structure of the semiconductor package 211 is shown transparently through a package main body 212.

Referring to FIG. 18, in this embodiment, the semiconductor package 211 is a three terminal type TO-220. The semiconductor package 211 includes the package main body 212, a metal plate 213, a first terminal 214, a second terminal 215, a third terminal 216, the SiC semiconductor device 61, a conductive bonding material 217, a first lead wire 218, and second lead wires 219.

The package main body 212 is constituted of a molding resin. The package main body 212 may include an epoxy resin as an example of the molding resin. The package main body 212 is formed to a rectangular parallelepiped shape. The package main body 212 includes a first surface 221 at one side, a second surface 222 at another side, and four side surfaces 223A, 223B, 223C, and 223D connecting the first surface 221 and the second surface 222.

More specifically, the four side surfaces 223A to 223D include the first side surface 223A, the second side surface 223B, the third side surface 223C, and the fourth side surface 223D. The first side surface 223A and the second side surface 223B oppose each other. The third side surface 223C and the fourth side surface 223D oppose each other.

The metal plate 213 may include at least one among Fe, Au, Ag, Cu, and Al. The metal plate 213 may have an outer surface on which at least one among an Ni plating film, an Au plating film, an Ag plating film, and a Cu plating film is formed. A planar shape of the metal plate 213 is arbitrary. In this embodiment, the metal plate 213 is formed to a quadrilateral shape (rectangular shape) in plan view.

More specifically, the metal plate 213 integrally includes a pad portion 224 positioned inside the package main body 212 and a heat sink portion 225 positioned outside the package main body 212. The heat sink portion 225 crosses the second side surface 223B from the pad portion 224 and is led outside the package main body 212. The heat sink portion 225 includes a penetrating hole 225a. The penetrating hole 225a is formed to a circular shape. A planar area of the heat sink portion 225 may exceed the planar area of the pad portion 224.

In this embodiment, the metal plate 213 is disposed inside the package main body 212 such as to be exposed from the second surface 222. The metal plate 213 may instead be disposed inside the package main body 212 such as not to be exposed from the second surface 222.

The first terminal 214 may include at least one among Fe, Au, Ag, Cu, and Al. The first terminal 214 may have an outer surface on which at least one among an Ni plating film, an Au plating film, an Ag plating film, and a Cu plating film is formed. The first terminal 214 crosses the first side surface 223A from inside the package main body 212 and is led outside the package main body 212.

The first terminal 214 is disposed in a central portion of the first side surface 223A in plan view. The first terminal 214 is disposed in a region at the first surface 221 side with respect to a plate surface of the metal plate 213.

The first terminal 214 includes a first inner end portion 226, a first outer end portion 227, and a first band portion 228. The first inner end portion 226 is connected to the metal plate 213 inside the package main body 212. The first outer end portion 227 is disposed outside the package main body 212. The first band portion 228 extends in a direction orthogonal to the first side surface 223A between the first inner end portion 226 and the first outer end portion 227.

The second terminal 215 may include at least one among Fe, Au, Ag, Cu, and Al. The second terminal 215 may have an outer surface on which at least one among an Ni plating film, an Au plating film, an Ag plating film, and a Cu plating film is formed. The second terminal 215 crosses the first side surface 223A from inside the package main body 212 and is led outside the package main body 212.

The second terminal 215 is disposed in a region at the third side surface 223C side at an interval from the first terminal 214 in plan view. The second terminal 215 is disposed in the region at the first surface 221 side with respect to the plate surface of the metal plate 213.

The second terminal 215 includes a second inner end portion 229, a second outer end portion 230, and a second band portion 231. The second inner end portion 229 is disposed inside the package main body 212 at an interval from the metal plate 213. The second outer end portion 230 is disposed outside the package main body 212. The second band portion 231 extends in the direction orthogonal to the first side surface 223A between the second inner end portion 229 and the second outer end portion 230.

The third terminal 216 may include at least one among Fe, Au, Ag, Cu, and Al. The third terminal 216 may have an outer surface on which at least one among an Ni plating film, an Au plating film, an Ag plating film, and a Cu plating film is formed. The third terminal 216 crosses the first side surface 223A from inside the package main body 212 and is led outside the package main body 212.

The third terminal 216 is disposed in a region at the fourth side surface 223D side at an interval from the first terminal 214 in plan view. The third terminal 216 is disposed in the region at the first surface 221 side with respect to the plate surface of the metal plate 213.

The third terminal 216 includes a third inner end portion 232, a third outer end portion 233, and a third band portion 234. The third inner end portion 232 is disposed inside the package main body 212 at an interval from the metal plate 213. The third outer end portion 233 is disposed outside the package main body 212. The third band portion 234 extends in the direction orthogonal to the first side surface 223A between the third inner end portion 232 and the third outer end portion 233.

The SiC semiconductor device 61 is disposed on the pad portion 224 of the metal plate 213 inside the package main body 212. The conductive bonding material 217 is interposed between the SiC semiconductor device 61 and the pad portion 224 and bonds the second main surface electrode 200 of the SiC semiconductor device 61 to the pad portion 224. The SiC semiconductor device 61 is thereby electrically connected to the first terminal 214 via the metal plate 213.

The conductive bonding material 217 may be a metal paste or solder. The metal paste may include at least one among Au, Ag, and Cu. The conductive bonding material 217 is preferably constituted of solder. The solder may be lead-free solder. The solder may include at least one among SnAgCu, SnZnBi, SnCu, SnCuNi, and SnSbNi.

The first lead wire 218 is constituted of a metal wire (bonding wire) or a metal clip. The metal wire may be an Al wire, an Au wire, a Cu wire, or a solder wire. The solder wire may be a lead-free solder wire. The solder wire may include at least one among SnAgCu, SnZnBi, SnCu, SnCuNi, and SnSbNi. The metal clip may be an Al clip, an Au clip, or a Cu clip. In this embodiment, the first lead wire 218 is constituted of a solder wire.

Inside the package main body 212, the first lead wire 218 is connected to the second inner end portion 229 of the second terminal 215 and the gate pad electrode 191 of the SiC semiconductor device 61. The SiC semiconductor device 61 is thereby electrically connected to the second terminal 215.

Although an example in which one first lead wire 218 is connected to the second inner end portion 229 and the gate pad electrode 191 is shown in FIG. 18, the number of first lead wires 218 is arbitrary. Two or more first lead wires 218 may be connected to the second inner end portion 229 and the gate pad electrode 191.

The second lead wires 219 are each constituted of a metal wire (bonding wire) or a metal clip. The metal wire may be an Al wire, an Au wire, a Cu wire, or a solder wire. The solder wire may be a lead-free solder wire. The solder wire may include at least one among SnAgCu, SnZnBi, SnCu, SnCuNi, and SnSbNi. The metal clip may be an Al clip, an Au clip, or a Cu clip. In this embodiment, the second lead wires 219 are constituted of solder wires.

Inside the package main body 212, the second lead wires 219 are connected to the third inner end portion 232 of the third terminal 216 and the source pad electrode 192 of the SiC semiconductor device 61. The SiC semiconductor device 61 is thereby electrically connected to the third terminal 216.

Although an example in which two second lead wires 219 are connected to the third inner end portion 232 and the source pad electrode 192 is shown in FIG. 18, the number of second lead wires 219 is arbitrary. One or three or more second lead wires 219 may be connected to the second inner end portion 232 and the source pad electrode 192.

The semiconductor package 211 can take on a configuration other than TO-220. The semiconductor package 211 may be an SOP (small outline package), a QFN (quad for non lead package), a DFP (dual flat package), a DIP (dual inline package), a QFP (quad flat package), an SIP (single inline package), or an SOJ (small outline J-leaded package) or may have any of various configurations similar to these.

As described above, with the SiC semiconductor device 61, the first Al layers 161 are formed as the first buffer layers that relax the external force at the first main surface 63 side and the second Al layer 201 is formed as the second buffer layer that relaxes the external force at the second main surface 64 side. An external force in a direction directed from the first main surface 63 toward the second main surface 64 and an external force in a direction directed from the second main surface 64 toward the first main surface 63 can thereby be relaxed.

As an example, external forces applied to the SiC chip 62 when the SiC semiconductor device 61 is mounted on the pad portion 224 of the metal plate 213 can be relaxed by the first Al layers 161 and the second Al layer 201. Also, external forces applied to the SiC chip 62 when the first lead wire 218 and the second lead wires 219 are bonded to the pad electrodes 190 of the SiC semiconductor device 61 can be relaxed by the first Al layers 161 and the second Al layer 201. Consequently, cracking of the SiC chip 62 can be suppressed.

Also, the SiC semiconductor device 61 includes the pad electrodes 190 (gate pad electrode 191 and source pad electrode 192) that are externally bonded to the first lead wire 218 and the second lead wires 219. Each of the pad electrodes 190 includes at least one among the Ni layer 195, the Pd layer 196, and the Au layer 197. The first lead wire 218 and the second lead wires 219 can thereby be connected appropriately to the pad electrodes 190.

On the other hand, Ni, Pd, and Au respectively have Young's moduli (rigidity moduli) that exceed the Young's modulus (rigidity modulus) of Al. Therefore, with a structure that includes the pad electrodes 190, an external force that is applied during bonding of the first lead wire 218 and the second lead wires 219 cannot be relaxed appropriately.

Thus, with the SiC semiconductor device 61, the first Al layers 161 that include Al are interposed between the SiC chip 62 and the pad electrodes 190. By the first Al layers 161, an external force applied to the SiC chip 62 can be relaxed from the first main surface 63 side using the cushioning property of Al that has the comparative small Young's modulus (rigidity modulus). The first lead wire 218 and the second lead wires 219 can thus be bonded to the pad electrodes 190 appropriately and, at the same time, cracking of the SiC chip 62 can be suppressed.

Also, the SiC semiconductor device 61 includes, in addition to the second Al layer 201, the second main surface electrode 200 that has the one or plurality of electrode layers constituted of a metal material differing from the second Al layer 201. The one or plurality of electrode layers include at least one among the Ti layer 202, the Ni layer 203, the Pd layer 204, the Au layer 205, and the Ag layer 206. An adhesion force of the conductive bonding material 217 to the second main surface electrode 200 can thereby be increased appropriately. Consequently, the SiC semiconductor device 61 can be mounted appropriately on the pad portion 224 of the metal plate 213.

On the other hand, Ti, Ni, Pd, Au, and Ag respectively have Young's moduli (rigidity moduli) that exceed the Young's modulus (rigidity modulus) of Al. Therefore, with a structure where the second main surface electrode 200 includes at least one among the Ti layer 202, the Ni layer 203, the Pd layer 204, the Au layer 205, and the Ag layer 206, an external force that is applied during the mounting of the SiC semiconductor device 61 or the bonding of the first lead wire 218 and the second lead wires 219 cannot be relaxed appropriately.

Thus, with the SiC semiconductor device 61, the second main surface electrode 200 that includes the second Al layer 201 in addition to the at least one among the Ti layer 202, the Ni layer 203, the Pd layer 204, the Au layer 205, and the Ag layer 206 is formed. By the second Al layer 201, an external force applied to the SiC chip 62 can be relaxed from the second main surface 64 side using the cushioning property of Al that has the comparative small Young's modulus (rigidity modulus). The SiC semiconductor device 61 can thus be mounted on the pad portion 224 appropriately and, at the same time, cracking of the SiC chip 62 can be suppressed.

The preferred embodiments of the present invention may be implemented in yet other embodiments.

With the first preferred embodiment described above, an example where the insulating layer 17 has the laminated structure that includes the passivation layer 19 and the resin layer 20 was described. However, the insulating layer 17 may instead have a single layer structure constituted of the passivation layer 19 or the resin layer 20.

With the first preferred embodiment described above, an example where an SBD is formed as an example of a diode was described. However, a p-type diode region 10 may be formed in place of the n-type diode region 10. In this case, a pn junction diode can be provided in place of the SBD.

With the second preferred embodiment described above, an example where the insulating layer 170 has the laminated structure that includes the passivation layer 174 and the resin layer 175 was described. However, the insulating layer 170 may instead have a single layer structure constituted of the passivation layer 174 or the resin layer 175.

With the second preferred embodiment described above, an example where the gate electrodes 80 and the gate wiring 85 that include the p-type polysilicon doped with the p-type impurity are formed was described. However, if increase of the gate threshold voltage Vth is not emphasized, the gate electrodes 80 and the gate wiring 85 may include an n-type polysilicon doped with an n-type impurity in place of or in addition to the p-type polysilicon.

In this case, the low resistance layer 86 may be formed by siliciding, by a metal material, the portions of the gate electrodes 80 (n-type polysilicon) forming the surface layer portions. That is, the low resistance layer 86 may include an n-type polycide. With such a structure, reduction of gate resistance can be achieved.

With the second preferred embodiment described above, an example where a MISFET is formed as an example of an insulated gate type transistor was described. However, an p$^+$-type collector region may be adopted in place of the n$^+$-type drain region 68. With this structure, an IGBT (insulated gate bipolar transistor) can be provided in place of a MISFET. In this case, in the second preferred embodiment described above, the "source" of the MISFET is replaced by an "emitter" of the IGBT and the "drain" of the MISFET is replaced by a "collector" of the IGBT.

In each of the preferred embodiments described above, a structure with which the conductivity types of the respective semiconductor portions are inverted may be adopted. That is, a p-type portion may be made to be of an n-type and an n-type portion may be made to be of a p-type.

Examples of features extracted from the present description and drawings are indicated below.

In a post-process (assembly process), various external forces are applied to a semiconductor device. For example, in mounting of the semiconductor device, a mounter that includes a suction nozzle is used. After being transferred to a connection object in a state of being suction-held by the suction nozzle, the semiconductor device is press mounted onto a connection object portion. In this process, an external force directed from the suction nozzle toward the connection object and an external force directed from the connection object toward the suction nozzle are applied to the semiconductor device.

Also, after mounting of the semiconductor device, a lead wire is press bonded onto a pad electrode by a capillary. In this process, an external force directed from the capillary toward the connection object and an external force directed from the connection object toward the capillary are applied to the semiconductor device. When an external force exceeding a strength of a chip is applied to the semiconductor device, cracks are generated in the chip. In the following, a semiconductor device with which an external force can be relaxed is provided.

[A1] A semiconductor device including a chip having a first main surface at one side and a second main surface at another side, a first main surface electrode including a first Al layer and formed on the first main surface, a pad electrode formed on the first main surface electrode and to be connected to a lead wire, and a second main surface electrode including a second Al layer and formed on the second main surface.

According to this semiconductor device, the first Al layer is formed as a first buffer layer that relaxes an external force at the first main surface side and the second Al layer is formed as a second buffer layer that relaxes an external force at the second main surface side. An external force in a direction directed from the first main surface toward the second main surface and an external force in a direction directed from the second main surface toward the first main surface can thereby be relaxed.

[A2] The semiconductor device according to A1, further including an insulating layer covering the first main surface electrode on the first main surface and having a pad opening exposing a portion of the first main surface electrode and where the pad electrode is formed on the first main surface electrode inside the pad opening.

[A3] The semiconductor device according to A2, where the chip has a side surface connecting the first main surface and the second main surface and the insulating layer has a peripheral edge formed at an interval from the side surface on the first main surface.

[A4] The semiconductor device according to A2 or A3, where the insulating layer includes a resin layer.

[A5] The semiconductor device according to any one of A1 to A4, where the pad electrode includes a metal material differing from the first main surface electrode.

[A6] The semiconductor device according to any one of A1 to A5, where the pad electrode includes at least one among an Ni layer, a Pd layer, and an Au layer.

[A7] The semiconductor device according to any one of A1 to A6, where the pad electrode includes an Ni layer and an Au layer that are laminated in that order from the first main surface electrode side.

[A8] The semiconductor device according to any one of A1 to A7, where the pad electrode includes an Ni layer, a Pd layer, and an Au layer that are laminated in that order from the first main surface electrode side.

[A9] The semiconductor device according to any one of A1 to A8, where the second main surface electrode includes one or a plurality of electrode layers constituted of a metal material differing from the second Al layer and the second Al layer covers the one or plurality of electrode layers.

[A10] The semiconductor device according to A9, where the one or plurality of electrode layers include at least one among a Ti layer, an Ni layer, a Pd layer, an Au layer, and an Ag layer.

[A11] The semiconductor device according to A9 or A10, where the one or plurality of electrode layers include an ohmic electrode layer forming an ohmic contact with at least the second main surface and the second Al layer covers at least the ohmic electrode layer.

[A12] The semiconductor device according to any one of A1 to A11, where the second Al layer has a thickness less than the first Al layer.

[A13] The semiconductor device according to any one of A1 to A12, where the second Al layer includes at least one among a pure Al layer, an AlSi alloy layer, an AlCu alloy layer, and an AlSiCu alloy layer.

[A14] The semiconductor device according to any one of A1 to A13, where the second Al layer is constituted of a pure Al layer.

[A15] The semiconductor device according to any one of A1 to A14, where the first Al layer includes at least one among a pure Al layer, an AlSi alloy layer, an AlCu alloy layer, and an AlSiCu alloy layer.

[A16] The semiconductor device according to any one of A1 to A15, further including a diode formed on the first main surface and where the first main surface electrode forms an anode electrode electrically connected to an anode of the diode, and the second main surface electrode forms a cathode electrode electrically connected to a cathode electrode.

[A17] The semiconductor device according to any one of A1 to A16, further including a MISFET formed on the first main surface and where the first main surface electrode includes a gate main surface electrode electrically connected to a gate of the MISFET and a source main surface electrode electrically connected to a source of the MISFET, the pad electrode includes a gate pad electrode formed on the gate main surface electrode and a source pad electrode formed on the source main surface electrode, and the second main surface electrode forms a drain electrode electrically connected to a drain of the MISFET.

[A18] The semiconductor device according to any one of A1 to A17, where the chip has a laminated structure that includes a semiconductor substrate and an epitaxial layer that are laminated in that order from the second main surface side toward the first main surface side.

[A19] The semiconductor device according to any one of A1 to A18, where a thickness of the chip is not more than 300 μm.

[A20] The semiconductor device according to any one of A1 to A19, where the chip is constituted of an SiC chip formed of an SiC monocrystal.

The present application corresponds to Japanese Patent Application No. 2019-080227 filed on Apr. 19, 2019 in the Japan Patent Office, and the entire disclosure of this applications is incorporated herein by reference. While preferred embodiments of the present invention have been described in detail, these are merely specific examples used to clarify the technical contents of the present invention and the present invention should not be interpreted as being limited to these specific examples and the scope of the present invention is to be limited only by the appended claims.

REFERENCE SIGNS LIST

1 SiC semiconductor device
2 SiC chip
3 first main surface
4 second main surface
5A first side surface
5B second side surface
5C third side surface
5D fourth side surface
6 SiC semiconductor substrate
7 SiC epitaxial layer
14 first main surface electrode
16 first Al layer
17 insulating layer
18 pad opening
20 resin layer
23 pad electrode
25 Ni layer
26 Pd layer
27 Au layer
31 second main surface electrode
32 second Al layer
33 Ti layer
34 Ni layer
35 Pd layer
36 Au layer
37 Ag layer
61 SiC semiconductor device
62 SiC chip
63 first main surface
64 second main surface
65A first side surface
65B second side surface
65C third side surface
65D fourth side surface
66 SiC semiconductor substrate
67 SiC epitaxial layer
150 first main surface electrode
151 gate main surface electrode
152 source main surface electrode
161 first Al layer
170 insulating layer
171 pad opening
172 gate pad opening
173 source pad opening
175 resin layer
190 pad electrode
191 gate pad electrode
192 source pad electrode
195 Ni layer
196 Pd layer
197 Au layer
200 second main surface electrode
201 second Al layer
202 Ti layer
203 Ni layer
204 Pd layer
205 Au layer
206 Ag layer

The invention claimed is:

1. An SiC semiconductor device comprising:
an SiC chip having a first main surface at one side and a second main surface at another side;
a first main surface electrode that has a laminated structure including a barrier layer and a first Al layer laminated in that order from the first main surface side and formed on the first main surface;
a pad electrode formed on the first main surface electrode and to be connected to a lead wire; and
a second main surface electrode including a second Al layer that covers the second main surface, the second Al layer opposes the first Al layer of the first main surface electrode across the SiC chip,
wherein the first Al layer is formed as a first buffer layer that uses a cushion property of Al to relax an external force applied to the SiC chip from the first main surface side, and
a thickness of the first Al layer is not less than 1 μm and not more than 8 μm,
wherein the second Al layer is formed as a second buffer layer that uses the cushion property of Al to relax an external force applied to the SiC chip from the second main surface side,
the second Al layer has a thickness less than the first Al layer, and
the second Al layer covers the second main surface at least across a Ti layer.

2. The SiC semiconductor device according to claim 1, further comprising:
an insulating layer covering the first main surface electrode on the first main surface and having a pad opening exposing a portion of the first main surface electrode; and
wherein the pad electrode is formed on the first main surface electrode inside the pad opening.

3. The SiC semiconductor device according to claim 2, wherein the SiC chip has a side surface connecting the first main surface and the second main surface and the insulating layer has a peripheral edge formed at an interval from the side surface on the first main surface.

4. The SiC semiconductor device according to claim 2, wherein the insulating layer includes a resin layer.

5. The SiC semiconductor device according to claim 1, wherein the pad electrode includes a metal material differing from the first main surface electrode.

6. The SiC semiconductor device according to claim 1, wherein the pad electrode includes at least one among an Ni layer, a Pd layer, and an Au layer.

7. The SiC semiconductor device according to claim 1, wherein the pad electrode includes an Ni layer and an Au layer that are laminated in that order from the first main surface electrode side.

8. The SiC semiconductor device according to claim 1, wherein the pad electrode includes an Ni layer, a Pd layer, and an Au layer that are laminated in that order from the first main surface electrode side.

9. The SiC semiconductor device according to claim 1, wherein the second main surface electrode includes one or a plurality of electrode layers constituted of a metal material differing from the second Al layer, and the second Al layer covers the one or plurality of electrode layers.

10. The SiC semiconductor device according to claim 9, wherein the one or plurality of electrode layers include at least one among a Ti layer, an Ni layer, a Pd layer, an Au layer, and an Ag layer.

11. The SiC semiconductor device according to claim 9, wherein the one or plurality of electrode layers include an ohmic electrode layer forming an ohmic contact with at least the second main surface, and the second Al layer covers at least the ohmic electrode layer.

12. The SiC semiconductor device according to claim 1, wherein the second Al layer includes at least one among a pure Al layer, an AlSi alloy layer, an AlCu alloy layer, and an AlSiCu alloy layer.

13. The SiC semiconductor device according to claim 1, wherein the second Al layer is constituted of a pure Al layer.

14. The SiC semiconductor device according to claim 1, wherein the first Al layer includes at least one among a pure Al layer, an AlSi alloy layer, an AlCu alloy layer, and an AlSiCu alloy layer.

15. The SiC semiconductor device according to claim 1, further comprising:
a diode formed on the first main surface; and
wherein the first main surface electrode forms an anode electrode electrically connected to an anode of the diode, and
the second main surface electrode forms a cathode electrode electrically connected to a cathode electrode.

16. The SiC semiconductor device according to claim 1, further comprising:
a MISFET formed on the first main surface; and
wherein the first main surface electrode includes a gate main surface electrode electrically connected to a gate of the MISFET and a source main surface electrode electrically connected to a source of the MISFET, the pad electrode includes a gate pad electrode formed on the gate main surface electrode and a source pad electrode formed on the source main surface electrode, and
the second main surface electrode forms a drain electrode electrically connected to a drain of the MISFET.

17. The SiC semiconductor device according to claim 1, wherein the SiC chip has a laminated structure that includes an SiC semiconductor substrate and an SiC epitaxial layer that are laminated in that order from the second main surface side toward the first main surface side.

18. The SiC semiconductor device according to claim 1, wherein a thickness of the SiC chip is not more than 300 μm.

* * * * *